(12) United States Patent
Matsushita et al.

(10) Patent No.: US 9,208,991 B1
(45) Date of Patent: Dec. 8, 2015

(54) ION IMPLANTATION APPARATUS

(71) Applicant: Sumitomo Heavy Industries Ion Technology Co., Ltd., Tokyo (JP)

(72) Inventors: Hiroshi Matsushita, Ehime (JP);
Mitsuaki Kabasawa, Ehime (JP);
Yoshitaka Amano, Ehime (JP);
Takanori Yagita, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/721,752

(22) Filed: May 26, 2015

(30) Foreign Application Priority Data

May 26, 2014 (JP) .................................. 2014-108008

(51) Int. Cl.
| | |
|---|---|
| *H01J 3/18* | (2006.01) |
| *H01J 37/147* | (2006.01) |
| *H01J 37/317* | (2006.01) |
| *H01J 37/08* | (2006.01) |

(52) U.S. Cl.
CPC ............. *H01J 37/1477* (2013.01); *H01J 37/08* (2013.01); *H01J 37/3171* (2013.01); *H01J 2237/151* (2013.01); *H01J 2237/30483* (2013.01); *H01J 2237/31701* (2013.01)

(58) Field of Classification Search
CPC ... H01J 37/1477; H01J 37/3171; H01J 37/08; H01J 2237/151; H01J 2237/30483; H01J 2237/31701
USPC ................................ 250/396 R, 492.1–492.3
See application file for complete search history.

(56) References Cited

U.S. PATENT DOCUMENTS

| | | | |
|---|---|---|---|
| 7,138,641 B2 | 11/2006 | Matsushita et al. | |
| 7,687,782 B2 | 3/2010 | Tsukihara et al. | |
| 7,982,192 B2 | 7/2011 | Tsukihara et al. | |
| 2008/0258074 A1* | 10/2008 | Tsukihara et al. | ........ 250/396 R |
| 2014/0352615 A1* | 12/2014 | Kabasawa et al. | ............ 118/712 |
| 2015/0136996 A1* | 5/2015 | Inada et al. | ............... 250/396 R |

FOREIGN PATENT DOCUMENTS

| | | | |
|---|---|---|---|
| JP | S62-122045 | A | 6/1987 |
| JP | H01-149960 | A | 6/1989 |
| JP | 2008-269961 | A | 11/2008 |
| JP | 4716399 | B2 | 7/2011 |
| JP | 4828305 | B2 | 11/2011 |
| JP | 5214090 | B2 | 6/2013 |

* cited by examiner

*Primary Examiner* — Michael Maskell
(74) *Attorney, Agent, or Firm* — Michael Best & Friedrich LLP

(57) ABSTRACT

An ion implantation apparatus includes a scanning unit scanning the ion beams in a horizontal direction perpendicular to the reference trajectory and a downstream electrode device disposed downstream of the scanning electrode device. The scanning electrode device includes a pair of scanning electrodes disposed to face each other in the horizontal direction with the reference trajectory interposed therebetween. The downstream electrode device includes an electrode body configured such that, with respect to an opening width in a vertical direction perpendicular to both the reference trajectory and the horizontal direction and/or an opening thickness in a direction along the reference trajectory, the opening width and/or the opening thickness in a central portion in which the reference trajectory is disposed is different from the opening width and/or the opening thickness in the vicinity of a position facing the downstream end of the scanning electrode.

17 Claims, 33 Drawing Sheets

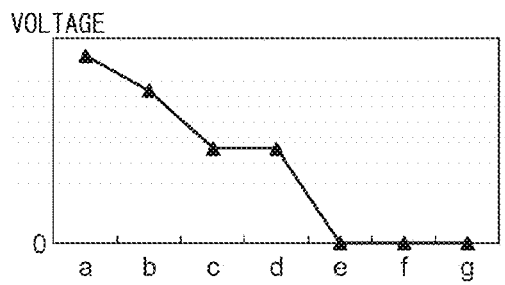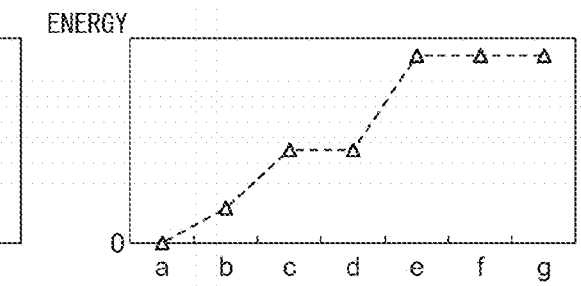

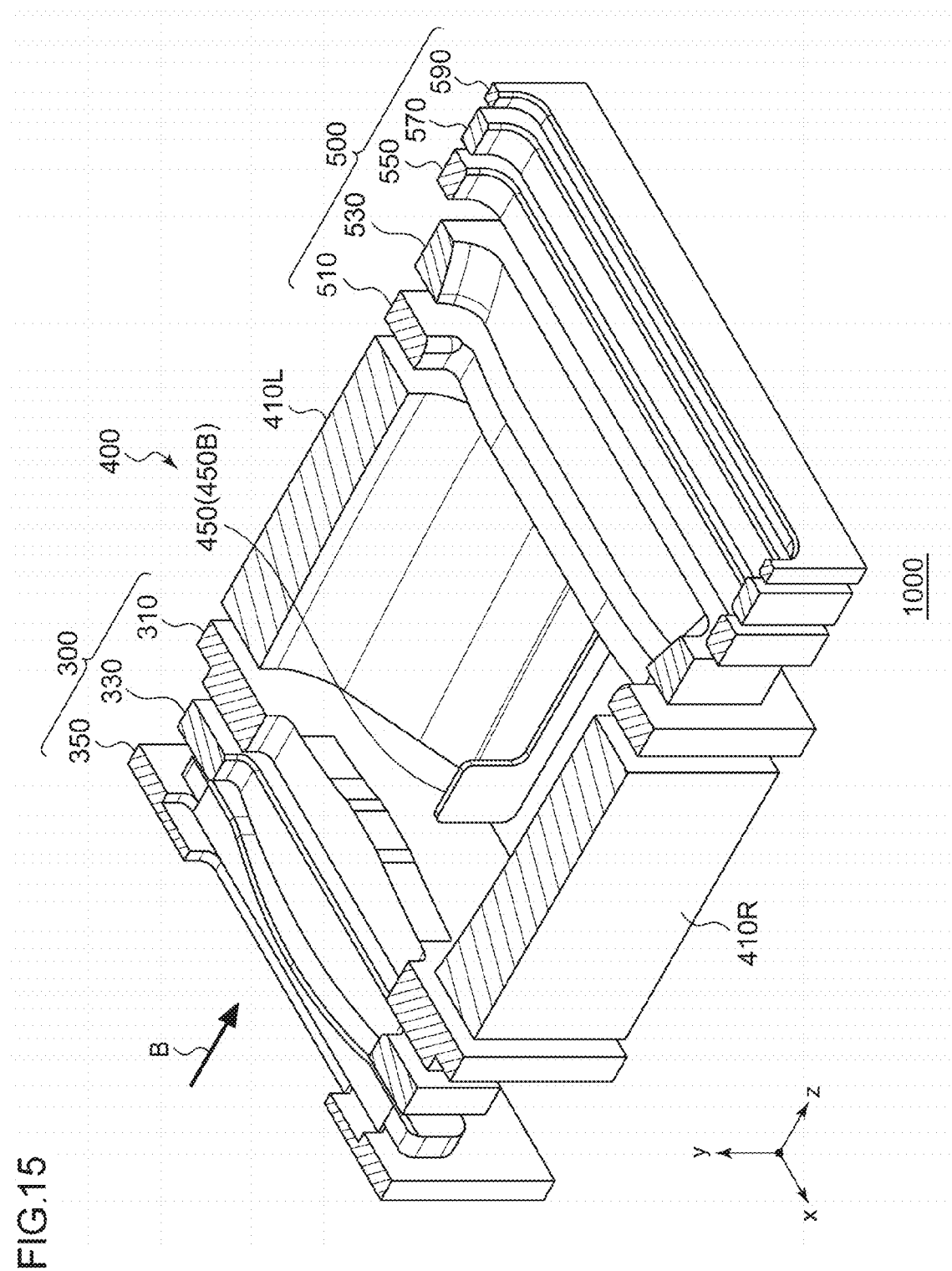

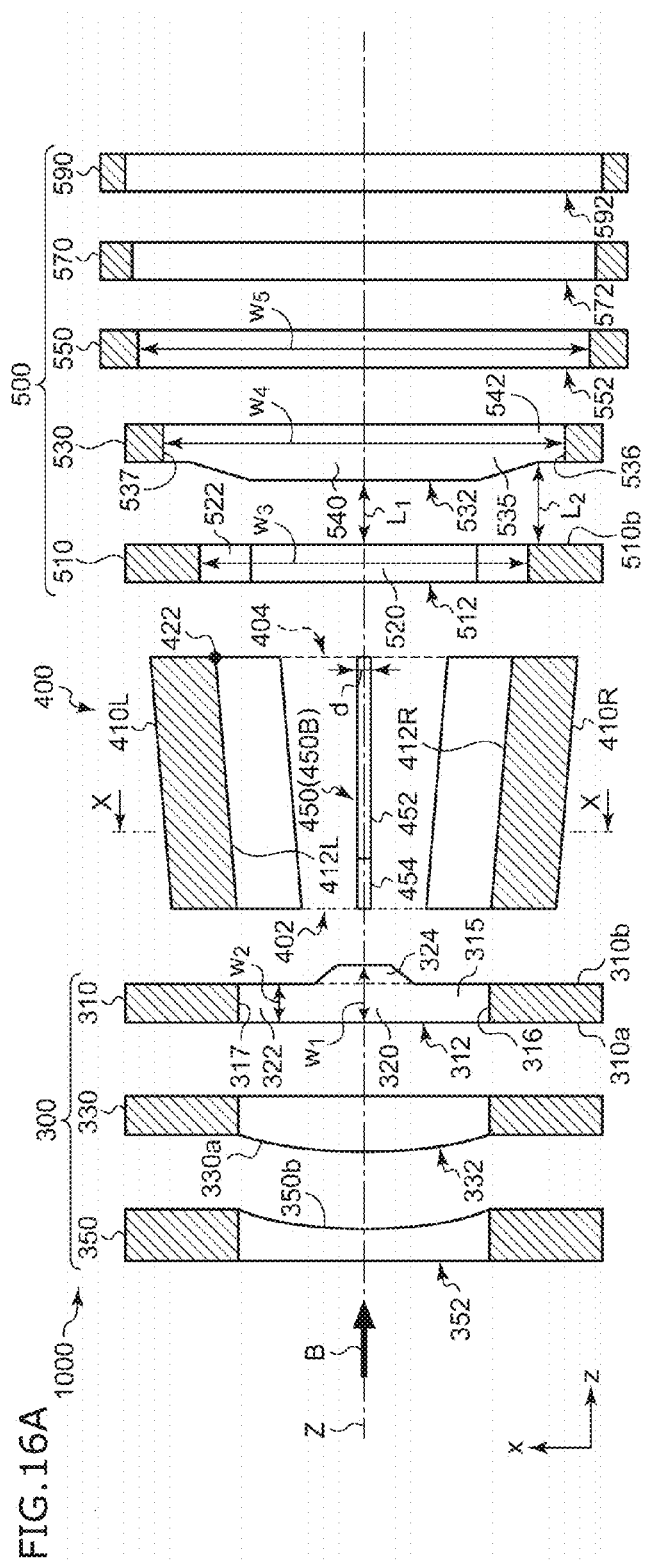
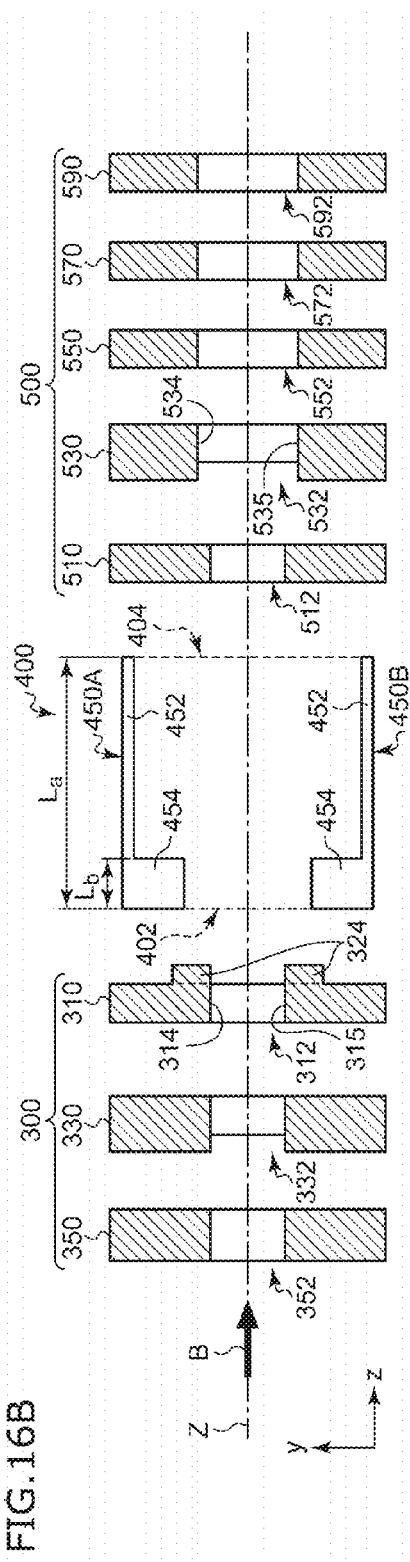
FIG. 16A
FIG. 16B

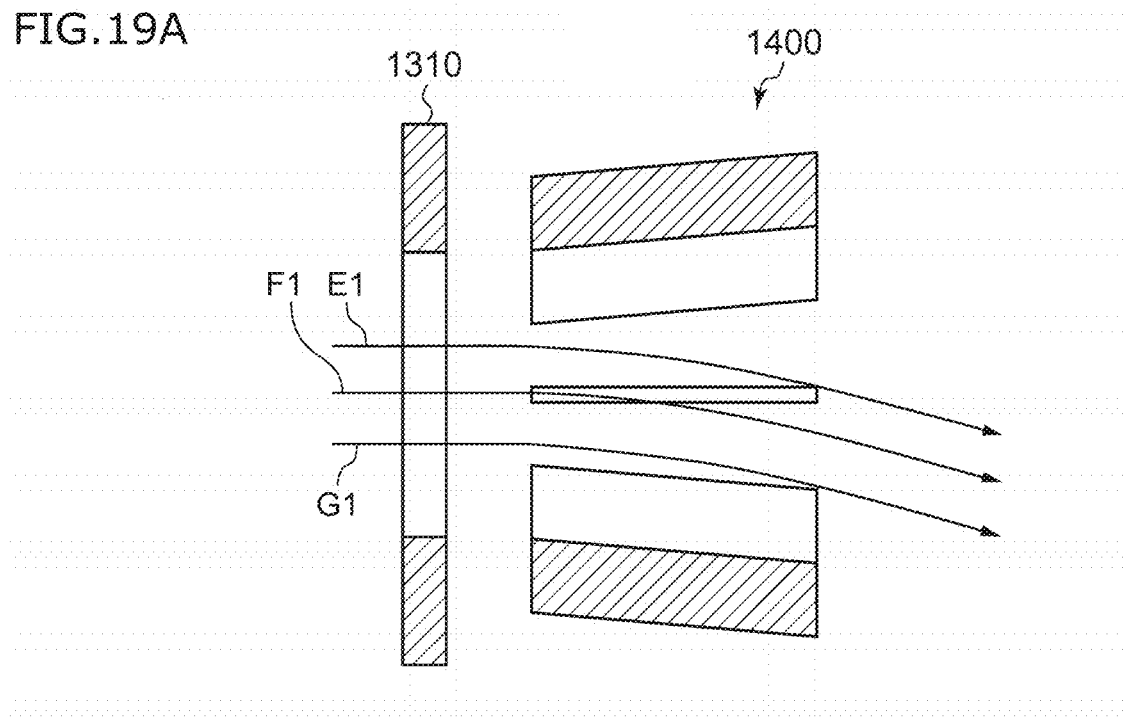
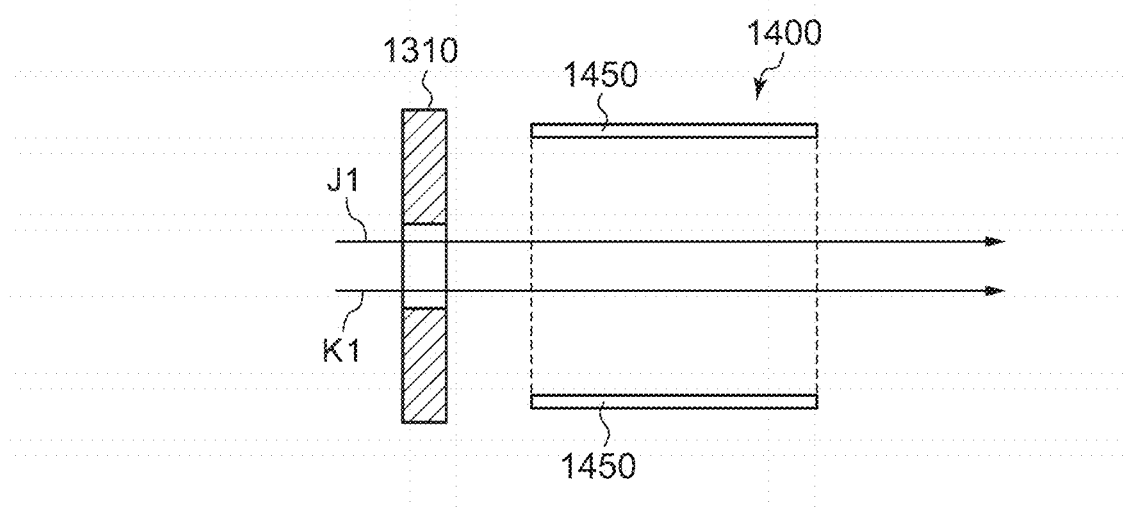

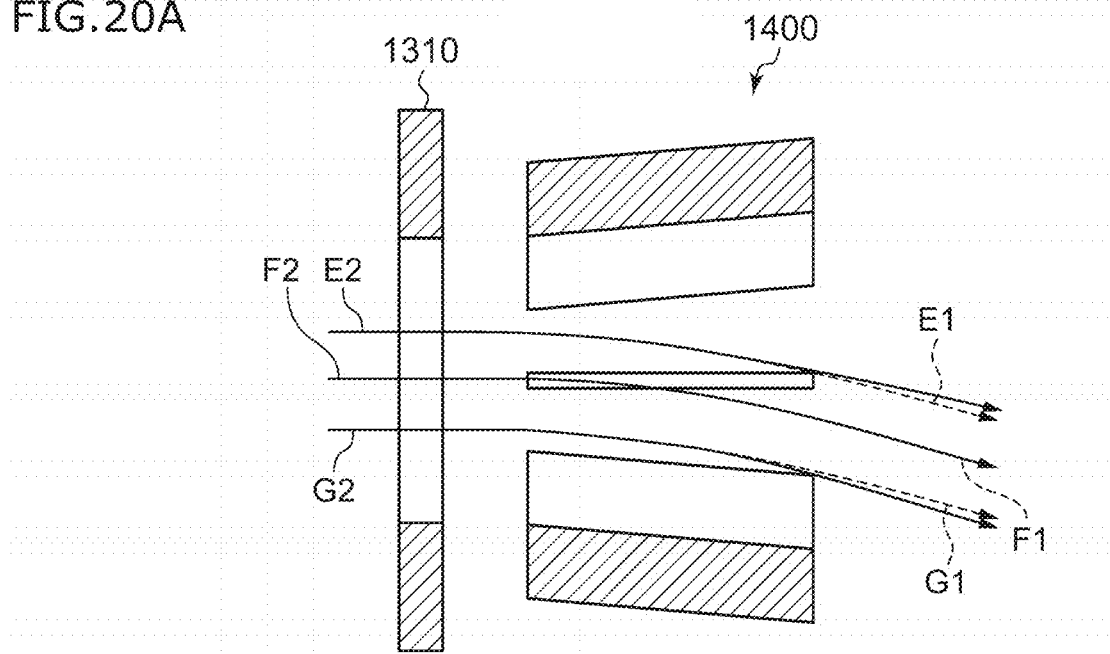
FIG.20A
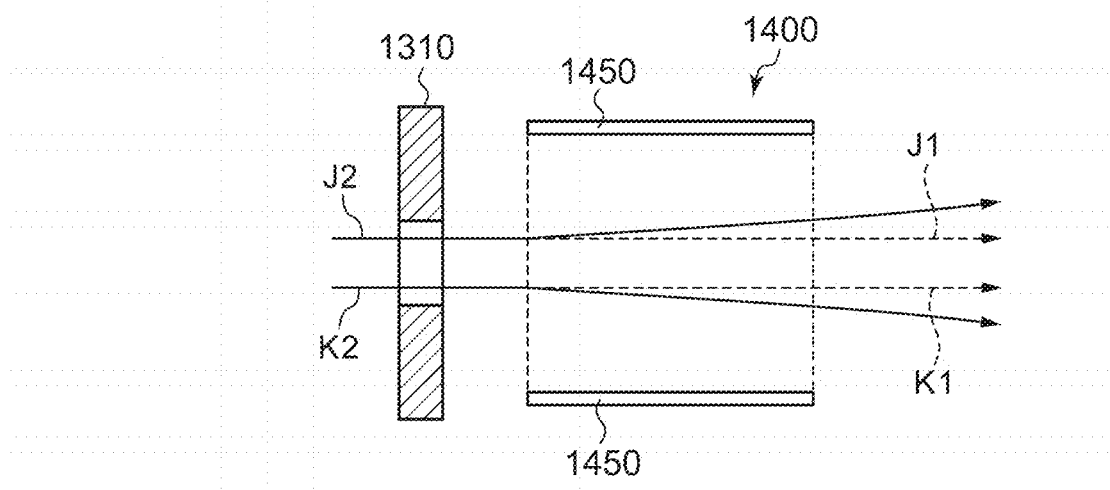
FIG20.B

FIG21.A
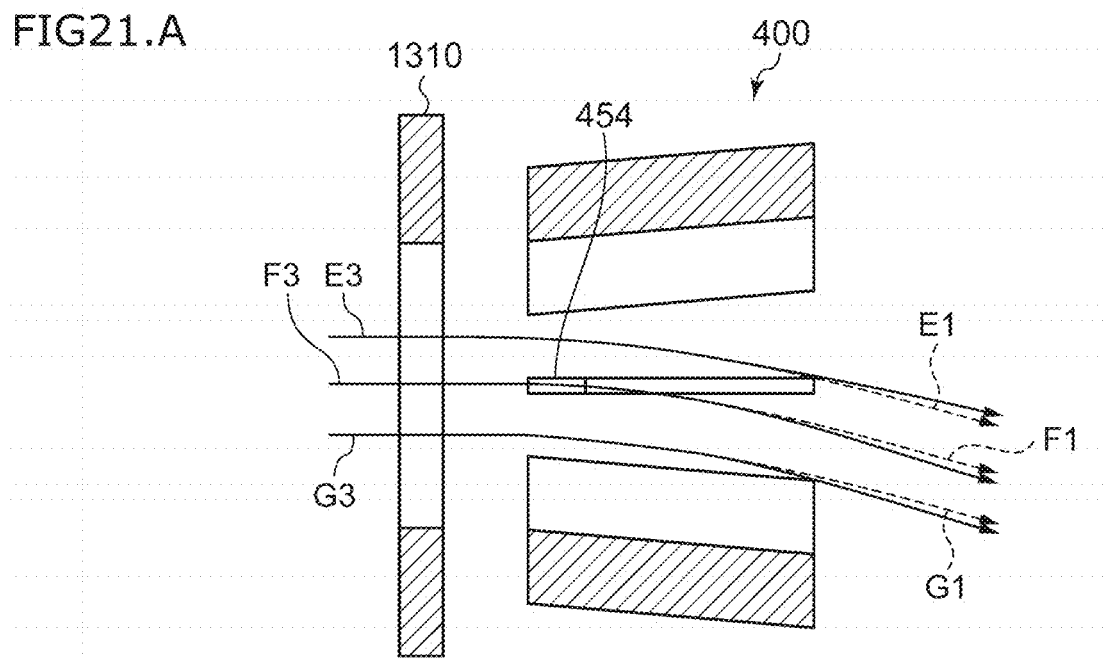
FIG21.B
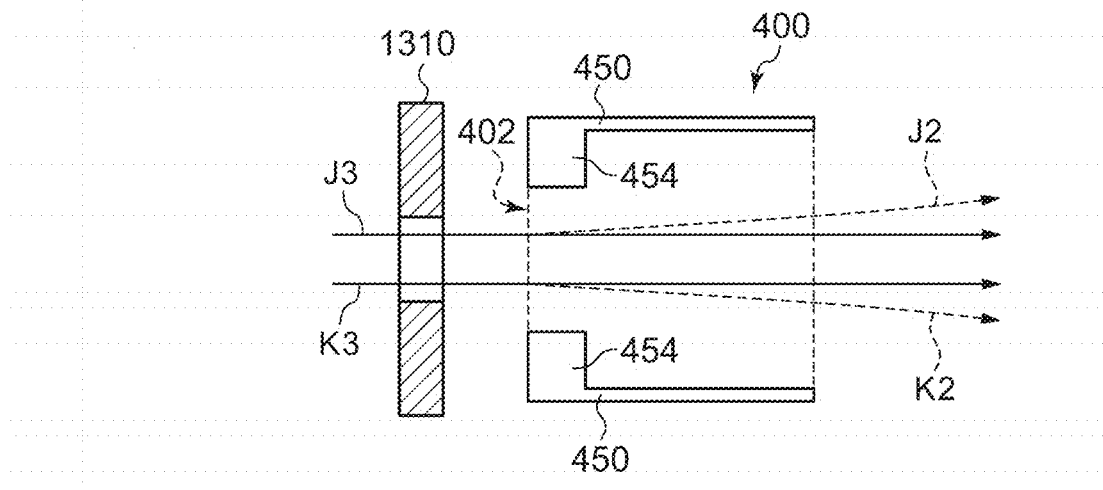

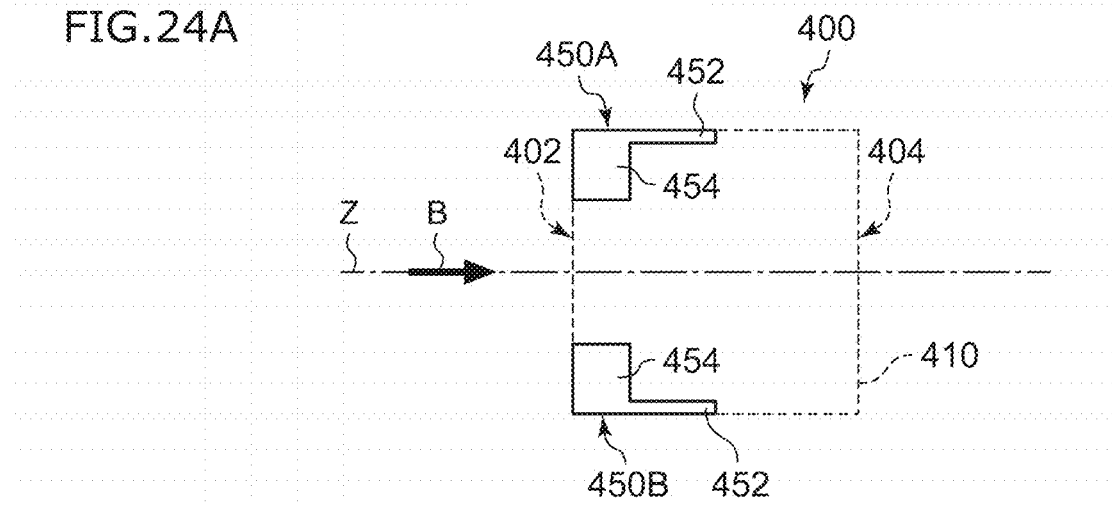
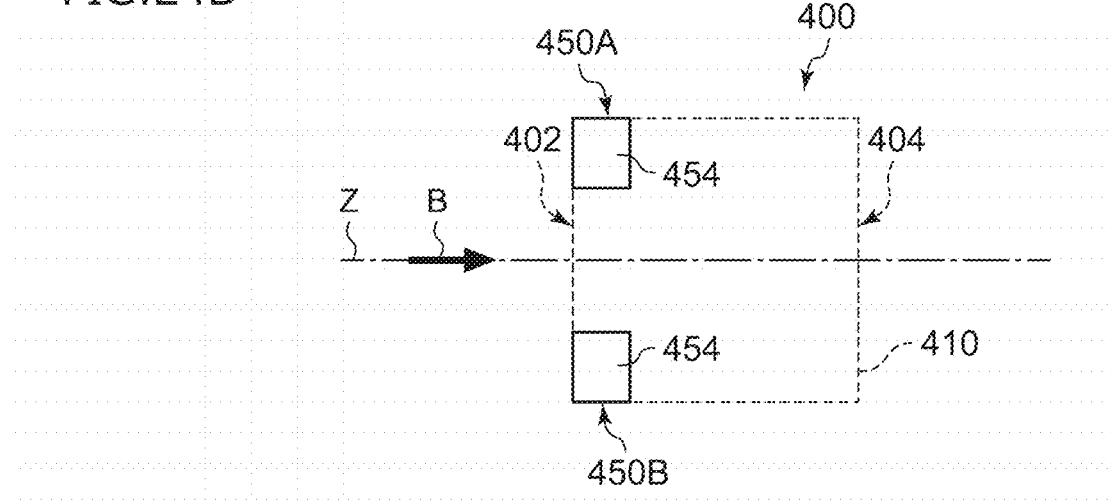

ION IMPLANTATION APPARATUS

RELATED APPLICATION

Priority is claimed to Japanese Patent Application No. 2014-108008, filed on May 26, 2014, the entire content of which is incorporated herein by reference.

BACKGROUND OF THE INVENTION

1. Field of the Invention

The present invention relates to an ion implantation apparatus.

2. Description of the Related Art

In a certain ion implantation apparatus, an ion source is connected to a power supply thereof such that an ion beam having a small amount of beam current is extracted from the ion source. In this apparatus, the connection between the ion source and the power supply may be modified such that an ion beam having a large amount of beam current is extracted from the ion source.

Another ion implantation apparatus includes an ion source, an acceleration tube, and an electric circuit connecting power supplies thereof, so as to implant ions into a target at high ion energy. The electric circuit is provided with a selector switch for switching the connection so as to implant ions at low ion energy.

Attempts to extend the operating range of the ion implantation apparatus to some degree have been made as described above. However, a realistic proposal to the extension of the operating range beyond the existing categories is rare.

Generally, ion implantation apparatuses are classified into three categories: a high-current ion implantation apparatus, a medium-current ion implantation apparatus, and a high-energy ion implantation apparatus. Since practical design requirements are different for each category, an apparatus of one category and an apparatus of another category may have significantly different configurations in, for example, beamline. Therefore, in the use of the ion implantation apparatus (for example, in a semiconductor manufacturing process), it is considered that apparatuses of different categories have no compatibility. That is, for particular ion implantation processing, an apparatus of a particular category is selected and used. Therefore, for a variety of ion implantation processing, it is necessary to own various types of ion implantation apparatuses.

SUMMARY OF THE INVENTION

An exemplary object of an aspect of the present invention is to provide an ion implantation apparatus and an ion implantation method which can be used in a wide range, for example, an ion implantation apparatus which can serve as both a high-current ion implantation apparatus and a medium-current ion implantation apparatus, and an ion implantation method.

According to an aspect of the present invention, there is provided an ion implantation apparatus including a scanning unit, the scanning unit including a scanning electrode device that allows a deflecting electric field to act on an ion beam incident along a reference trajectory and scans the ion beam in a horizontal direction perpendicular to the reference trajectory, and a downstream electrode device disposed downstream of the scanning electrode device and provided with openings through which the ion beam scanned in the horizontal direction passes, wherein the scanning electrode device includes a pair of scanning electrodes disposed to face each other in the horizontal direction with the reference trajectory interposed therebetween. The downstream electrode device includes an electrode body configured such that, with respect to an opening width in a vertical direction perpendicular to both the reference trajectory and the horizontal direction and/or an opening thickness in a direction along the reference trajectory, the opening width and/or the opening thickness in a central portion in which the reference trajectory is disposed is different from the opening width and/or the opening thickness in the vicinity of a position facing the downstream end of the scanning electrode.

Also, while arbitrary combinations of the above components or the components or representations of the present invention are mutually substituted among methods, apparatuses, systems, and programs, these are also effective as the aspects of the present invention.

BRIEF DESCRIPTION OF THE DRAWINGS

FIG. 9A is a diagram illustrating a voltage in an ion implantation apparatus according to an embodiment of the present invention, and FIG. 9B is a diagram illustrating an energy in an ion implantation apparatus according to an embodiment of the present invention;

FIG. 15 is a perspective cross-sectional view illustrating a configuration of a scanning unit included in anion implantation apparatus according to an embodiment of the present invention;

FIGS. 16A and 16B are cross-sectional views schematically illustrating a configuration of an upstream electrode device, a scanning electrode device, and a downstream electrode device illustrated in FIG. 15;

FIGS. 19A and 19B are diagrams schematically illustrating trajectories of ion beams passing through a first upstream reference voltage electrode and a scanning electrode device according to a comparative example;

FIGS. 20A and 20B are diagrams schematically illustrating trajectories of ion beams passing through a first upstream reference voltage electrode and a scanning electrode device according to the comparative example;

FIGS. 21A and 21B are diagrams schematically illustrating trajectories of ion beams passing through a first upstream reference voltage electrode and a scanning electrode device according to an embodiment of the present invention;

FIGS. 24A and 24B are diagrams schematically illustrating a shape of a beam transport correction electrode according to a modification;

DETAILED DESCRIPTION OF THE INVENTION

Figure 1:
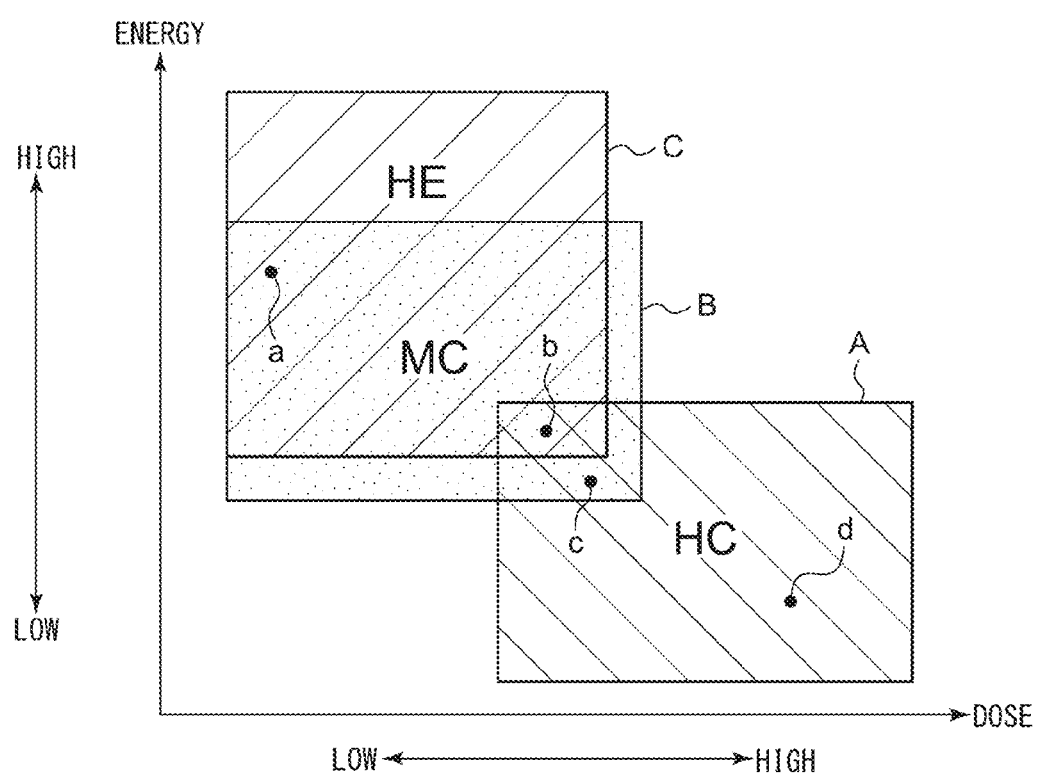
FIG. 1 is a diagram schematically illustrating ranges of an energy and a dose amount in several types of typical ion implantation apparatuses.

The invention will now be described by reference to the preferred embodiments. This does not intend to limit the scope of the present invention, but to exemplify the invention.

Hereinafter, embodiments of the present invention will be described in detail with reference to the drawings. Also, in the description of the drawings, the same reference numerals are assigned to the same components, and a redundant description thereof is appropriately omitted. Also, the configurations described below are exemplary, and do not limit the scope of the present invention. For example, in the following, a semiconductor wafer is described as an example of an object to which an ion implantation is performed, but other materials or members may also be used.

First, a description will be given of circumstances that led to an embodiment of the present invention to be described below. An ion implantation apparatus can select an ion species to be implanted and set an energy and a dose amount thereof, based on desired properties to be established within a workpiece. Generally, ion implantation apparatuses are classified into several categories according to the ranges of energy and dose amount of ions to be implanted. As representative categories, there are a high-dose high-current ion implantation apparatus (hereinafter, referred to as HC), a medium-dose medium-current ion implantation apparatus (hereinafter, referred to as MC), and a high-energy ion implantation apparatus (hereinafter, referred to as HE).

FIG. 1 schematically illustrates the energy ranges and the dose ranges of a typical serial-type high-dose high-current ion implantation apparatus HC, a serial-type medium-dose medium-current ion implantation apparatus MC, and a serial-type high-energy ion implantation apparatus HE. In FIG. 1, a horizontal axis represents the dose, and a vertical axis represents the energy. The dose is the number of ions (atoms) implanted per unit area (for example, $cm^2$), and the total amount of implanted material is provided by a time integral of ion current. The ion current provided by the ion implantation is generally expressed as mA or µA. The dose is also referred to as an implantation amount or a dose amount. In FIG. 1, the energy and dose ranges of the HC, the MC, and the HE are indicated by symbols A, B, and C, respectively. These are a set range of implantation conditions required according to implantation conditions (also called a recipe) for each implantation, and represent practically reasonable apparatus configuration categories matched with the implantation conditions (recipe), considering practically allowable productivity. Each of the illustrated ranges represents an implantation condition (recipe) range that can be processed by the apparatus of each category. The dose amount represents an approximate value when a realistic processing time is assumed.

The HC is used for ion implantation in a relatively low energy range of about 0.1 to 100 keV and in a high dose range of about $1\times10^{14}$ to $1\times10^{17}$ atoms/$cm^2$. The MC is used for ion implantation in a medium energy range of about 3 to 500 keV and in a medium dose range of about $1\times10^{11}$ to $1\times10^{14}$ atoms/ cm². The HE is used for ion implantation in a relatively high energy range of about 100 keV to 5 MeV and in a relatively low dose range of about $1\times10^{10}$ to $1\times10^{13}$ atoms/cm². In this way, the broad ranges of the implantation conditions having about five digits for the energy range and about seven digits for the dose ranges are shared by the HC, the MC, and the HE. However, these energy ranges or dose ranges are a representative example, and are not strict. Also, the way of providing the implantation conditions is not limited to the dose and the energy, but is various. The implantation conditions may be set by a beam current value (representing an area integral beam amount of a beam cross-sectional profile by a current), a throughput, implantation uniformity, and the like.

Since the implantation conditions for ion implantation processing include particular values of energy and dose, the implantation conditions can be expressed as individual points in FIG. 1. For example, an implantation condition a has values of a high energy and a low dose. The implantation condition a is in the operating range of the MC and is also in the operating range of the HE. The ion implantation can be processed accordingly using the MC or the HE. An implantation condition b is a medium energy/dose and the ion implantation can be processed by one of the HC, MC, and HE. An implantation condition c is a medium energy/dose and the ion implantation can be processed by the HC or the MC. An implantation condition d is a low energy/a high dose and can be processed by only the HC.

The ion implantation apparatus is an equipment essential to the production of semiconductor devices, and the improvement of performance and productivity thereof has an important meaning to a device maker. The device maker selects an apparatus, which is capable of realizing implantation characteristics necessary for a device to be manufactured, among a plurality of ion implantation apparatus categories. At this time, the device maker determines the number of apparatuses of the category, considering various circumstances such as the realization of the best manufacturing efficiency, the cost of ownership of the apparatus, and the like.

It is assumed that an apparatus of a certain category is used at a high operating rate and an apparatus of another category has a relatively sufficient processing capacity. At this time, if the former apparatus cannot be replaced with the latter apparatus in order to obtain a desired device because implantation characteristics are strictly different for each category, the failure of the former apparatus cause a bottleneck on production processes, and thus overall productivity is impaired. Such trouble may be avoided to some extent by assuming a failure rate and the like in advance and determining a number configuration based on that.

When a manufacturing device is changed due to a change in demand or a technical advance and the number configuration of necessary apparatuses is changed, apparatuses become lacking or a non-operating apparatus occurs and thus an operating efficiency of the apparatuses may be reduced. Such trouble may be avoided to some extent by predicting the trend of future products and reflecting the predicted trend to the number configuration.

Even though the apparatus can be replaced with an apparatus of another category, the failure of the apparatus or the change of the manufacturing device may reduce the production efficiency or lead to wasted investment for the device maker. For example, in some cases, a manufacturing process having been mainly processed till now by a medium-current ion implantation apparatus is processed by a high-current ion implantation apparatus due to the change of the manufacturing device. If doing so, the processing capacity of the high-current ion implantation apparatus becomes lacking, and the processing capacity of the medium-current ion implantation apparatus becomes surplus. If it is expected that the state after the change will not change for a long period of time, the operating efficiency of the apparatus can be improved by taking measures of purchasing a new high-current ion implantation apparatus and selling the medium-current ion implantation apparatus having been owned. However, when a process is frequently changed, or such a change is difficult to predict, a trouble may be caused in production.

In practice, a process having already been performed in an ion implantation apparatus of a certain category in order to manufacture a certain device cannot be immediately used in an ion implantation apparatus of another category. This is because a process of matching device characteristics on the ion implantation apparatus is required. That is, device characteristics obtained by performing a process with the same ion species, energy, and dose amount in the new ion implantation apparatus may be significantly different from device characteristics obtained in the previous ion implantation apparatus. Various conditions other than the ion species, the energy, and the dose amount, for example, a beam current density (that is, a dose rate), an implantation angle, or an overspray method of an implantation region, also affect the device characteristics. Generally, when the categories are different, apparatus configurations also are different. Therefore, even though the ion species, the energy, and the dose amount are specified, it is impossible to automatically match the other conditions affecting the device characteristics. These conditions depend on implantation methods. Examples of the implantation methods include a method of relative movement between a beam and a workpiece (for example, a scanning beam, a ribbon beam, a two-dimensional wafer scanning, or the like), a batch type and a serial type to be described below.

In addition, rough classification of the high-dose high-current ion implantation apparatus and the high-energy ion implantation apparatus into a batch type and the medium-dose medium-current ion implantation apparatus into a serial type also increases a difference between the apparatuses. The batch type is a method of processing a plurality of wafers at one time, and these wafers are disposed on, for example, the circumference. The serial type is a method of processing wafers one by one and is also called a single wafer type. Also, in some cases, the high-dose high-current ion implantation apparatus and the high-energy ion implantation apparatus are configured as the serial type.

Also, a beamline of the batch-type high-dose high-current ion implantation apparatus is typically made shorter than that of the serial-type medium-dose medium-current ion implantation apparatus by a request on beamline design according to high-dose high-current beam characteristics. This is done for suppressing beam loss caused by divergence of ion beams in a low energy/high beam current condition in the design of the high-dose high-current beamline. In particular, this is done for reducing a tendency to expand outward in a radial direction, so-called a beam blow-up, because ions forming the beam include charged particles repelling each other. The necessity for such design is more remarkable when the high-dose high-current ion implantation apparatus is the batch type than when that is the serial type.

The beamline of the serial-type medium-dose medium-current ion implantation apparatus is made relatively long for ion beam acceleration or beam forming. In the serial-type medium-dose medium-current ion implantation apparatus, ions having considerable momentum are moving at high speed. The momentum of the ions increases while the ions pass through one or several of acceleration gaps added to the beamline. Also, in order to modify a trajectory of particles having considerable momentum, a focusing portion needs to be relatively long enough to fully apply a focusing power.

Since the high-energy ion implantation apparatus adopts a linear acceleration method or a tandem acceleration method, it is essentially different from an acceleration method of the high-dose high-current ion implantation apparatus or the medium-dose medium-current ion implantation apparatus. This essential difference is equally applied when the high-energy ion implantation apparatus is the serial type or the batch type.

As such, the ion implantation apparatuses HC, MC and HE are recognized as completely different apparatuses because the beamline types or the implantation methods are different according to categories. A difference in configuration between apparatuses of different categories is recognized as inevitable. Among the different types of apparatuses such as HC, MC and HE, process compatibility considering the influence on the device characteristics is not guaranteed.

Therefore, it is preferable that the ion implantation apparatus has a broader energy range and/or dose range than the apparatus of the existing category. In particular, it is desirable to provide an ion implantation apparatus capable of implantation in a broad range of energy and dose amount including at least two existing categories, without changing the type of the implantation apparatus.

Also, in recent years, the mainstream is that all implantation apparatuses adopt the serial type. It is therefore desirable to provide an ion implantation apparatus that has a serial-type configuration and also has a broad energy range and/or dose range.

Also, the HE uses an essentially different acceleration method, and the HC and the MC are common in that ion beams are accelerated or decelerated by a DC voltage. Therefore, there is a probability that the HC and the MC can share the beamline. It is therefore desirable to provide an ion implantation apparatus that can serve as both the HC and the MC.

The apparatus capable of operating at a broad range helps to improve productivity or operating efficiency in view of device makers.

Also, the medium-current ion implantation apparatus MC can operate in a high energy range and a low dose range as compared with the high-current ion implantation apparatus HC. Therefore, in this application, the medium-current ion implantation apparatus MC is also referred to as a low-current ion implantation apparatus. Likewise, regarding the medium-current ion implantation apparatus MC, the energy and the dose are also referred to as high energy and low dose, respectively. Alternatively, regarding the high-current ion implantation apparatus HC, the energy and the dose are also referred to as low energy and high dose, respectively. However, these expressions in this application are not intended to restrictively indicate only the energy range and the dose range of the medium-current ion implantation apparatus MC, but may mean "a high (or low) energy (or dose) range" literally according to the context.

Figure 2:
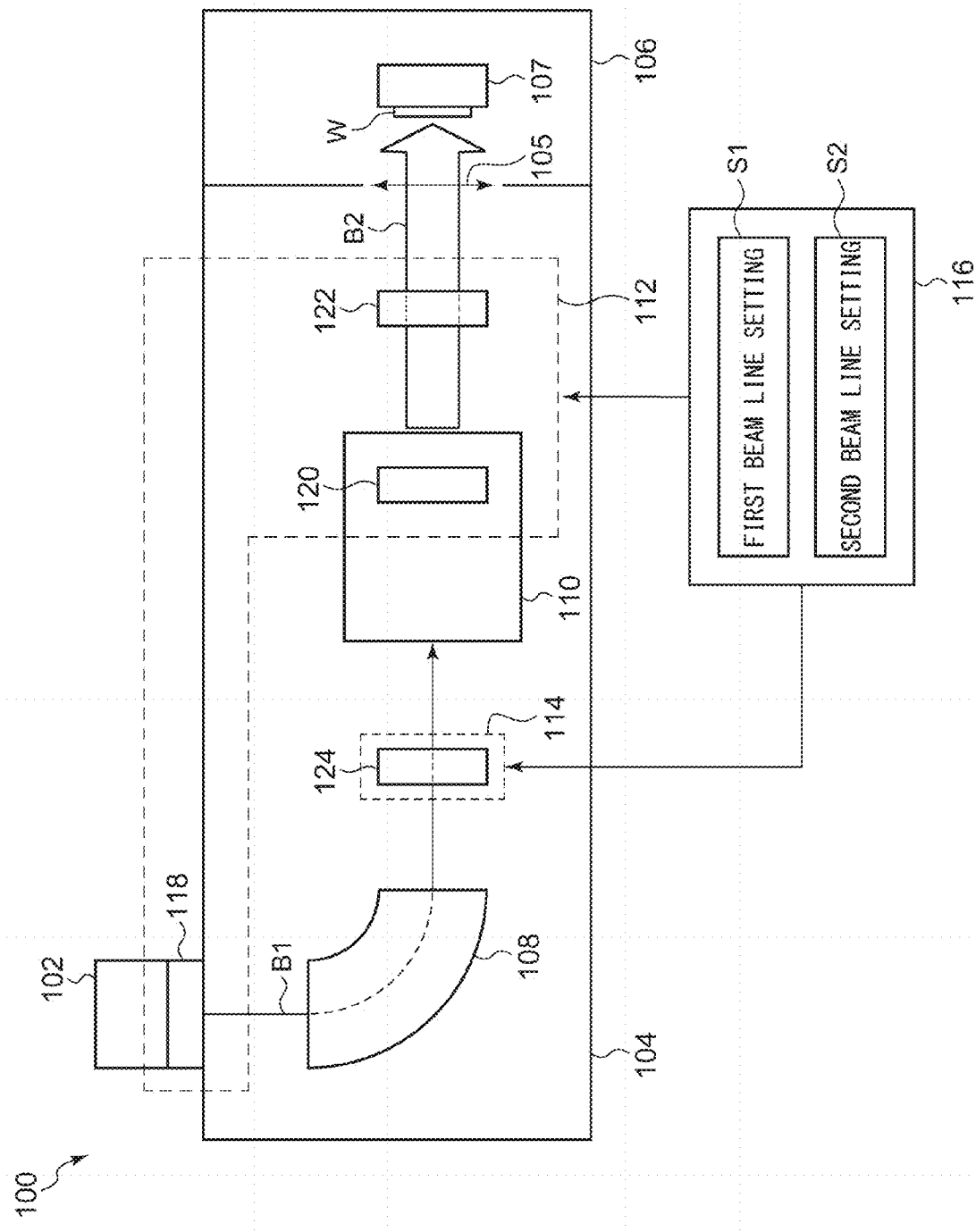
FIG. 2 is a diagram schematically illustrating an ion implantation apparatus according to an embodiment of the present invention.

FIG. 2 is a diagram schematically illustrating an ion implantation apparatus 100 according to an embodiment of the present invention. The ion implantation apparatus 100 is configured to perform ion implantation processing on a surface of a workpiece W according to given ion implantation conditions. The ion implantation conditions include, for example, an ion species to be implanted into the workpiece W, an ion dose amount, and ion energy. The workpiece W is, for example, a substrate, or, for example, a wafer. Therefore, in the following, the workpiece W is also referred to as a substrate W for convenience of description. This is not intended to limit a target of the implantation processing to a particular object.

The ion implantation apparatus 100 includes an ion source 102, a beamline device 104, and an implantation processing chamber 106. Also, the ion implantation apparatus 100 includes a vacuum exhaust system (not illustrated) for providing desired vacuum environments to the ion source 102, the beamline device 104, and the implantation processing chamber 106.

The ion source 102 is configured to generate ions to be implanted into the substrate W. The ion source 102 provides the beamline device 104 with an ion beam B1 accelerated and extracted from the ion source 102 by an extraction electrode unit 118 that is an example of a component for adjusting a beam current. Hereinafter, this may be also referred to as an initial ion beam B1.

The beamline device 104 is configured to transport ions from the ion source 102 to the implantation processing chamber 106. The beamline device 104 provides a beamline for transporting the ion beam. The beamline is a passage of the ion beam and may be also said as a path of beam trajectory. The beamline device 104 performs operations including deflection, acceleration, deceleration, shaping, and scanning, with respect to the initial ion beam B1, thereby forming an ion beam B2. Hereinafter, this may be also referred to as an implantation ion beam B2. The beamline device 104 includes a plurality of beamline components arranged for such beam operations. In this manner, the beamline device 104 provides the implantation processing chamber 106 with the implantation ion beam B2.

The implantation ion beam B2 has a beam irradiation region 105 in the plane perpendicular to a beam transport direction (or a direction along a beam trajectory) of the beamline device 104. Generally, the beam irradiation region 105 has a width including the width of the substrate W. For example, when the beamline device 104 includes a beam scanning device scanning a spot-shaped ion beam, the beam irradiation region 105 is an elongated irradiation region extending over a scanning range along a longitudinal direction perpendicular to the beam transport direction. Also, likewise, when the beamline device 104 includes a ribbon beam generator, the beam irradiation region 105 is an elongated irradiation region extending in a longitudinal direction perpendicular to the beam transport direction. However, the elongated irradiation region is a cross-section of a corresponding ribbon beam. The elongated irradiation region is longer than the width (diameter when the substrate W is circular) of the substrate W in a longitudinal direction.

The implantation processing chamber 106 includes a workpiece holder 107 holding the substrate W such that the substrate W receives the implantation ion beam B2. The workpiece holder 107 is configured to move the substrate W in a direction perpendicular to the beam transport direction of the beamline device 104 and the longitudinal direction of the beam irradiation region 105. That is, the workpiece holder 107 provides a mechanical scan of the substrate W. In this application, the mechanical scan is the same as reciprocating motion. Also, the "perpendicular direction" is not limited to only a strict right angle. For example, when the implantation is performed in a state in which the substrate W is inclined in a vertical direction, the "perpendicular direction" may include such an inclined angle.

The implantation processing chamber 106 is configured as a serial-type implantation processing chamber. Therefore, the workpiece holder 107 typically holds one sheet of the substrate W. However, like the batch type, the workpiece holder 107 may include a support holding a plurality of (for example, small) substrates, and may be configured to mechanically scan the plurality of substrates by linearly reciprocating the support. In another embodiment, the implantation processing chamber 106 may be configured as a batch-type implantation processing chamber. In this case, for example, the workpiece holder 107 may include a rotating disk that rotatably holds a plurality of substrates W on the circumference of the disk. The rotating disk may be configured to provide a mechanical scanning.

Figure 3:
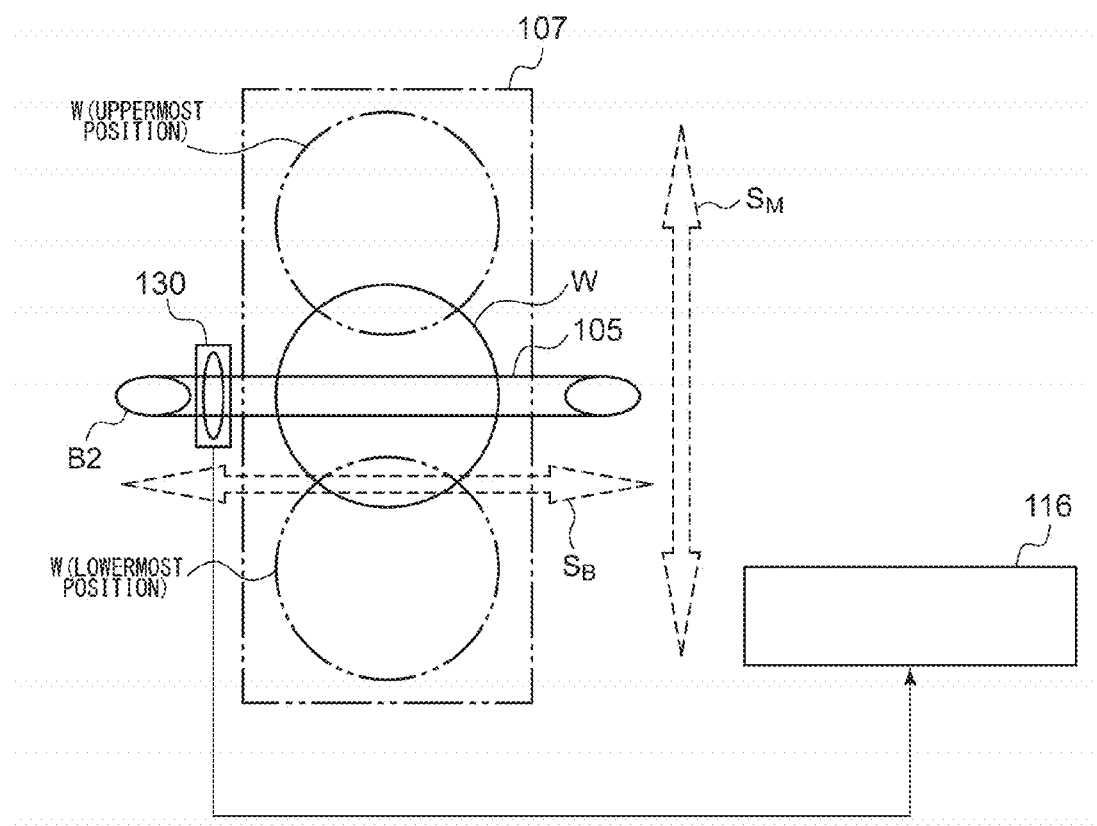
FIG. 3 is a diagram schematically illustrating an ion implantation apparatus according to an embodiment of the present invention.

FIG. 3 illustrates an example of the beam irradiation region 105 and the relevant mechanical scanning. The ion implantation apparatus 100 is configured to perform ion implantation by a hybrid scanning method using both one-dimensional beam scanning $S_B$ of the spot-shaped ion beam B2 and one-dimensional mechanical scanning $S_M$ of the substrate W. On the side of the workpiece holder 107, a beam measurement device 130 (for example, Faraday cup) is provided to overlap the beam irradiation region 105, and the measurement result may be provided to a control unit 116.

In this manner, the beamline device 104 is configured to supply the implantation processing chamber 106 with the implantation ion beam B2 having the beam irradiation region 105. The beam implantation region 105 is formed to irradiate the implantation ion beam B2 across the substrate W in cooperation with the mechanical scanning of the substrate W. Therefore, ions can be implanted into the substrate W by the relative movement of the substrate W and the ion beam.

In another embodiment, the ion implantation apparatus 100 is configured to perform ion implantation by a ribbon beam+wafer scanning method using both the ribbon-shaped ion beam B2 and the one-dimensional mechanical scanning of the substrate W. The horizontal width of the ribbon beam is expanded while maintaining uniformity, and the substrate W is scanned so as to intersect with the ribbon beam. In a further embodiment, the ion implantation apparatus 100 may be configured to perform ion implantation by a method of two-dimensionally mechanically scanning the substrate W in a state in which the beam trajectory of the spot-shaped ion beam B2 is fixed.

Also, the ion implantation apparatus 100 is not limited to a particular implantation method for implanting ions across a broad region on the substrate W. An implantation method using no mechanical scanning is also possible. For example, the ion implantation apparatus 100 may be configured to perform ion implantation by a two-dimensional beam scanning method of two-dimensionally scanning the substrate W with the spot-shaped ion beam B2. Alternatively, the ion implantation apparatus 100 may be configured to perform ion implantation by a large-size beam method using the two-dimensionally expanded ion beam B2. The large-size beam is expanded to make a beam size equal to or larger than a substrate size while maintaining uniformity, and can process the entire substrate at one time.

Although details will be described below, the ion implantation apparatus 100 may be operated under a first beamline setting S1 for high-dose implantation or a second beamline setting S2 for low-dose implantation. Therefore, the beamline device 104 has the first beamline setting S1 or the second beamline setting S2 during operations. The two settings are determined to generate the ion beams for different ion implantation conditions under the common implantation method. Thus, in the first beamline setting S1 and the second beamline setting S2, the beam center trajectories being the reference of the ion beams B1 and B2 are identical to each other. The beam irradiation regions 105 are also identical to each other in the first beamline setting S1 and the second beamline setting S2.

The beam center trajectory being the reference refers to a beam trajectory when beam is not scanned in the beam scanning method. Also, in the case of the ribbon beam, the beam center trajectory being the reference corresponds to a locus of a geometric center of a beam cross-section.

The beamline device 104 may be divided into a beamline upstream part on the ion source 102 side and a beamline downstream part on the implantation processing chamber 106 side. In the beamline upstream part, for example, a mass spectrometer 108 including a mass analysis magnet and a mass analysis slit is provided. The mass spectrometer 108 performs mass spectrometry on the initial ion beam B1 and provides only necessary ion species to the beamline downstream part. In the beamline downstream part, for example, a beam irradiation region determination unit 110 is provided to determine the beam irradiation region 105 of the implantation ion beam B2.

The beam irradiation region determination unit 110 is configured to emit the ion beam having the beam irradiation region 105 (for example, the implantation ion beam B2) by applying either (or both) of an electric field and a magnetic field to the incident ion beam (for example, the initial ion beam B1). In an embodiment, the beam irradiation region determination unit 110 includes a beam scanning device and a beam parallelizing device. Examples of the beamline components will be described below with reference to FIG. 5.

Also, it should be understood that the division into the upstream part and the downstream part, as above-described, is mentioned for conveniently describing a relative position relationship of the components in the beamline device 104. Therefore, for example, a component in the beamline downstream part may be disposed at a place closer to the ion source 102 than the position described above. The opposite holds true as well. Therefore, in an embodiment, the beam irradiation region determination unit 110 may include a ribbon beam generator and a beam parallelizing device, and the ribbon beam generator may include the mass spectrometer 108.

The beamline device 104 includes an energy adjustment system 112 and a beam current adjustment system 114. The energy adjustment system 112 is configured to adjust implantation energy to the substrate W. The beam current adjustment system 114 is configured to adjust the beam current in a broad range so as to change a dose amount implanted into the substrate W in a broad range. The beam current adjustment system 114 is provided to adjust the beam current of the ion beam quantitatively (rather than qualitatively). In an embodiment, the adjustment of the ion source 102 can be also used to adjust the beam current. In this case, the beam current adjustment system 114 may be considered to include the ion source 102. Details of the energy adjustment system 112 and the beam current adjustment system 114 will be described below.

Also, the ion implantation apparatus 100 includes a control unit 116 for controlling all or part of the ion implantation apparatus 100 (for example, all or part of the beamline device 104). The control unit 116 is configured to select any one from a plurality of beamline settings including the first beamline setting S1 and the second beamline setting S2, and operate the beamline device 104 under the selected beamline setting. Specifically, the control unit 116 sets the energy adjustment system 112 and the beam current adjustment system 114 according to the selected beamline setting, and controls the energy adjustment system 112 and the beam current adjustment system 114. Also, the control unit 116 may be a dedicated controller for controlling the energy adjustment system 112 and the beam current adjustment system 114.

The control unit 116 is configured to select a beamline setting suitable for given ion implantation conditions among the plurality of beamline settings including the first beamline setting S1 and the second beamline setting S2. The first beamline setting S1 is suitable for transport of a high-current beam for high-dose implantation into the substrate W. Therefore, for example, the control unit 116 selects the first beamline setting S1 when a desired ion dose amount implanted into the substrate W is in the range of about $1\times10^{14}$ to $1\times10^{17}$ atoms/cm$^2$. Also, the second beamline setting S2 is suitable for transport of a low-current beam for low-dose implantation into the substrate. Therefore, for example, the control unit 116 selects the second beamline setting S2 when a desired ion dose amount implanted into the substrate W is in the range of about $1\times10^{11}$ to $1\times10^{14}$ atoms/cm$^2$. Details of the beamline settings will be described below.

The energy adjustment system 112 includes a plurality of energy adjustment elements arranged along the beamline device 104. The plurality of energy adjustment elements is disposed at fixed positions on the beamline device 104. As illustrated in FIG. 2, the energy adjustment system 112 includes, for example, three adjustment elements, specifically, an upstream adjustment element 118, an intermediate adjustment element 120, and a downstream adjustment element 122. Each of these adjustment elements includes one or more electrodes configured to exert an electric field for accelerating or decelerating the initial ion beam B1 and/or the implantation ion beam B2.

The upstream adjustment element 118 is provided in the upstream part of the beamline device 104, for example, the most upstream part of the beamline device 104. The upstream adjustment element 118 includes, for example, an extraction electrode system for extracting the initial ion beam B1 from the ion source 102 to the beamline device 104. The intermediate adjustment element 120 is installed in the middle portion of the beamline device 104 and includes, for example, an electrostatic beam parallelizing device. The downstream adjustment element 122 is provided in the downstream part of the beamline device 104 and includes, for example, an acceleration/deceleration column. The downstream adjustment element 122 may include an angular energy filter (AEF) disposed in the downstream of the acceleration/deceleration column.

Also, the energy adjustment system 112 includes a power supply system for the above-described energy adjustment elements. This will be described below with reference to FIGS. 6 and 7. Also, the plurality of energy adjustment elements may be provided in any number anywhere on the beamline device 104, which is not limited to the illustrated arrangement. Also, the energy adjustment system 112 may include only one energy adjustment element.

The beam current adjustment system 114 is provided in the upstream part of the beamline device 104, and includes a beam current adjustment element 124 for adjusting the beam current of the initial ion beam B1. The beam current adjustment element 124 is configured to block at least a portion of the initial ion beam B1 when the initial ion beam B1 passes through the beam current adjustment element 124. In an embodiment, the beam current adjustment system 114 may include a plurality of current adjustment elements 124 arranged along the beamline device 104. Also, the beam current adjustment system 114 may be provided in the downstream part of the beamline device 104.

The beam current adjustment element 124 includes a movable portion for adjusting a passage region of the ion beam cross-section perpendicular to the beam transport direction of the beamline device 104. According to the movable portion, the beam current adjustment element 124 constitutes a beam limiting device having a variable-width slit or a variable-shape opening for limiting a portion of the initial ion beam B1. Also, the beam current adjustment system 114 includes a driving device for continuously or discontinuously adjusting the movable portion of the beam current adjustment element 124.

Additionally or alternatively, the beam current adjustment element 124 may include a plurality of adjustment members (for example, adjustment aperture) each having a plurality of beam passage regions having different areas and/or shapes. The beam current adjustment element 124 may be configured to switch the adjustment member disposed on the beam trajectory among the plurality of adjustment members. In this manner, the beam current adjustment element 124 may be configured to adjust the beam current stepwise.

As illustrated, the beam current adjustment element 124 is a beamline component separate from the plurality of energy adjustment elements of the energy adjustment system 112. By separately installing the beam current adjustment element and the energy adjustment element, the beam current adjustment and the energy adjustment may be individually performed. This may increase the degree of freedom in the setting of the beam current range and the energy range in the individual beamline settings.

The first beamline setting S1 includes a first energy setting for the energy adjustment system 112 and a first beam current setting for the beam current adjustment system 114. The second beamline setting S2 includes a second energy setting for the energy adjustment system 112 and a second beam current setting for the beam current adjustment system 114. The first beamline setting S1 is directed to the low-energy and high-dose ion implantation, and the second beamline setting S2 is directed to the high-energy and low-dose ion implantation.

Therefore, the first energy setting is determined to be suitable for the transport of the low-energy beam as compared with the second energy setting. Also, the second beam current setting is determined to reduce the beam current of the ion beam as compared with the first beam current setting. By combining the beam current adjustment and the irradiation time adjustment of the implantation ion beam B2, a desired dose amount can be implanted into the substrate W.

The first energy setting includes a first power supply connection setting that determines the connection between the energy adjustment system 112 and the power supply system thereof. The second energy setting includes a second power supply connection setting that determines the connection between the energy adjustment system 112 and the power supply system thereof. The power supply connection settings are determined such that the intermediate adjustment element 120 and/or the downstream adjustment element 122 generate an electric field for helping the beam transport. For example, the beam parallelizing device and/or the acceleration/deceleration column, as a whole, are configured to decelerate the implantation ion beam B2 under the first energy setting and accelerate the implantation ion beam B2 under the second energy setting. Due to the power supply connection settings, a voltage adjustment range of each adjustment element of the energy adjustment system 112 is determined. In the adjustment range, a voltage of the power supply corresponding to each adjustment element can be adjusted to provide a desired implantation energy to the implantation ion beam B2.

The first beam current setting includes a first opening setting that determines the ion beam passage region of the beam current adjustment element 124. The second beam current setting includes a second opening setting that determines the ion beam passage region of the beam current adjustment element 124. The second opening setting is determined such that the ion beam passage region is small as compared with the first opening setting. The opening settings determine, for example, the movable range of the movable portion of the beam current adjustment element 124. Alternatively, the opening settings may determine the adjustment member to be used. In this manner, the ion beam passage region corresponding to the desired beam current within the adjustment range determined by the opening settings may be set to the beam current adjustment element 124. The ion beam passage region can be adjusted such that a desired dose amount is implanted into the substrate W within a processing time permitted to the ion implantation processing.

Thus, the beamline device 104 has a first energy adjustment range under the first beamline setting S1 and has a second energy adjustment range under the second beamline setting S2. In order to enable a broad range of the adjustment, the first energy adjustment range has a portion overlapping the second energy adjustment range. That is, two adjustment ranges overlap each other in at least the ends thereof. The overlapping portion may be a straight-line in the diagram schematically illustrating range of an energy and dose of ion implantation apparatuses. In this case, two adjustment ranges contact each other. In another embodiment, the first energy adjustment range may be separated from the second energy adjustment range.

Likewise, the beamline device 104 has a first dose adjustment range under the first beamline setting S1 and has a second dose adjustment range under the second beamline setting S2. The first dose adjustment range has a portion overlapping the second dose adjustment range. That is, two adjustment ranges overlap each other in at least the ends thereof. The overlapping portion may be a straight-line in the diagram schematically illustrating range of an energy and dose of ion implantation apparatuses. In this case, two adjustment ranges contact each other. In another embodiment, the first dose adjustment range may be separated from the second dose adjustment range.

In this manner, the beamline device 104 is operated in a first operation mode under the first beamline setting S1. The first operation mode may be referred to as a low-energy mode (or a high-dose mode). Also, the beamline device 104 is operated in a second operation mode under the second beamline setting S2. The second operation mode may be referred to as a high-energy mode (or a low-dose mode). The first beamline setting S1 can be also referred to as a first implantation setting configuration suitable for the transport of a low-energy/high-current beam for the high-dose implantation into the workpiece W. The second beamline setting S2 can be also referred to as a second implantation setting configuration suitable for the transport of a high-energy/low-current beam for the low-dose implantation into the workpiece W.

An operator of the ion implantation apparatus 100 can switch the beamline settings before a certain ion implantation processing is performed, depending on the implantation conditions of the processing. Therefore, the broad range from the low-energy (or high-dose) to the high-energy (or low-dose) can be processed by one ion implantation apparatus.

Also, the ion implantation apparatus 100 corresponds to the broad range of the implantation conditions in the same implantation method. That is, the ion implantation apparatus 100 processes abroad range with substantially the same beamline device 104. Also, the ion implantation apparatus 100 has the serial-type configuration that is recently becoming the mainstream. Therefore, although details will be described below, the ion implantation apparatus 100 is suitable for use as a shared unit of the existing ion implantation apparatuses (for example, HC and MC).

The beamline device 104 can also be considered to include abeam control device for controlling the ion beam, a beam conditioning device for conditioning the ion beam, and a beam shaping device for shaping the ion beam. The beamline device 104 supplies the ion beam having the beam irradiation region 105 exceeding the width of the workpiece W in the implantation processing chamber 106 by using the beam control device, the beam conditioning device, and the beam shaping device. In the ion implantation apparatus 100, the beam control device, the beam conditioning device, and the beam shaping device may have the same hardware configuration in the first beamline setting S1 and the second beamline setting S2. In this case, the beam control device, the beam conditioning device, and the beam shaping device may be disposed with the same layout in the first beamline setting S1 and the second beamline setting S2. Therefore, the ion implantation apparatus 100 may have the same installation floor area (so-called footprint) in the first beamline setting S1 and the second beamline setting S2.

The beam center trajectory being the reference is a beam trajectory that is a locus of geometric center of the beam cross-section without beam scanning in the beam scanning method. Also, in the case of the ribbon beam that is a stationary beam, the beam center trajectory being the reference corresponds to a locus of a geometric center of the beam cross-section, regardless of a change in the beam cross-sectional shape in the implantation ion beam B2 of the downstream part.

The beam control device may include the control unit 116. The beam conditioning device may include the beam irradiation region determination unit 110. The beam conditioning device may include an energy filter or a deflection element. The beam shaping device may include a first XY convergence lens 206, a second XY convergence lens 208, and a Y convergence lens 210, which are to be described below.

It can be considered that, in the case of the beam scanning method, the initial ion beam B1 takes a single beam trajectory in the upstream part of the beamline device 104, and in the downstream part the implantation ion beam B2 takes a plurality of beam trajectories due to the beam scanning and parallelizing with reference to the beam center trajectory being the reference. However, in the case of the ribbon beam, it becomes a beam irradiation zone because the beam cross-sectional shape of the single beam trajectory is changed and the beam width is widened. Thus, the beam trajectory is also single. According to this view, the beam irradiation region 105 may be also referred to as an ion beam trajectory zone. Therefore, in the ion implantation apparatus 100, the implantation ion beam B2 has the same ion beam trajectory zone in the first beamline setting S1 and the second beamline setting S2.

Figure 4:
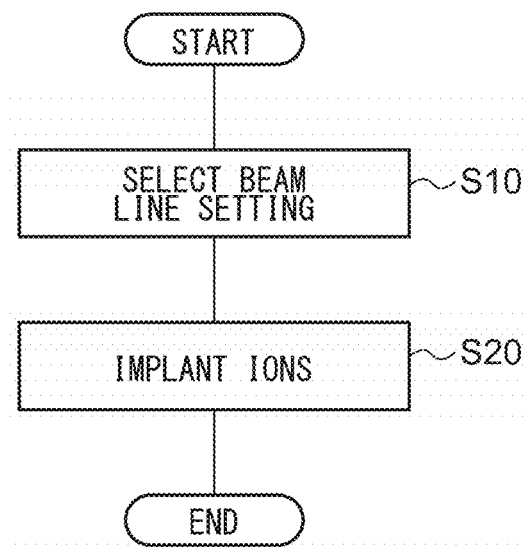
FIG. 4 is a flowchart illustrating an ion implantation method according to an embodiment of the present invention.

FIG. 4 is a flowchart illustrating an ion implantation method according to an embodiment of the present invention. This ion implantation method is suitable for use in the ion implantation apparatus 100. This method is performed by the control unit 116. As illustrated in FIG. 4, this method includes a beamline setting selecting step (S10) and an ion implantation step (S20).

The control unit 116 selects a beamline setting suitable forgiven ion implantation conditions among a plurality of beamline settings (S10). As described above, the plurality of beamline settings includes a first beamline setting S1 suitable for transport of a high-current beam for high-dose implantation into a workpiece, and a second beamline setting S2 suitable for transport of a low-current beam for low-dose implantation into a workpiece. For example, the control unit 116 selects the first beamline setting S1 when a desired ion dose amount implanted into a substrate W exceeds a threshold value, and selects the second beamline setting S2 when the desired ion dose amount is smaller than the threshold value. Also, as described below, the plurality of beamline settings (or implantation setting configurations) may include a third beamline setting (or third implantation setting configuration) and/or a fourth beamline setting (or fourth implantation setting configuration).

When the first beamline setting S1 is selected, the control unit 116 sets the energy adjustment system 112 by using the first energy setting. The energy adjustment system 112 and the power supply thereof are connected according to a first power supply connection setting. Also, the control unit 116 sets the beam current adjustment system 114 by using the first beam current setting. Therefore, the ion beam passage region (or adjustment range thereof) is set according to the first opening setting. Likewise, when the second beamline setting S2 is selected, the control unit 116 sets the energy adjustment system 112 by using the second energy setting, and sets the beam current adjustment system 114 by using the second beam current setting.

The selecting process step may include a process step of adjusting the beamline device 104 in the adjustment range according to the selected beamline setting. In the adjusting process step, each adjustment element of the beamline device 104 is adjusted within a corresponding adjustment range so as to generate the ion beam of a desired implantation condition. For example, the control unit 116 determines a voltage of a power supply corresponding to each adjustment element of the energy adjustment system 112 so as to obtain a desired implantation energy. Also, the control unit 116 determines the ion beam passage region of the beam current adjustment element 124 so as to obtain a desired implantation dose amount.

In this manner, the control unit 116 operates the ion implantation apparatus 100 under the selected beamline setting (S20). The implantation ion beam B2 having the beam irradiation region 105 is generated and supplied to the substrate W. The implantation ion beam B2 scans the entire substrate W in cooperation with the mechanical scanning of the substrate W (or with the beam alone). As a result, ions are implanted into the substrate W at the energy and dose amount of the desired ion implantation conditions.

The serial-type high-dose high-current ion implantation apparatus, which is being used in device production, currently adopts a hybrid scanning method, a two-dimensional mechanical scanning method, and a ribbon beam+wafer scanning method. However, the two-dimensional mechanical scanning method has a limitation in increase of a scanning speed due to a load of mechanical driving mechanism of the mechanical scanning, and thus, the two-dimensional mechanical scanning method disadvantageously cannot suppress implantation non-uniformity sufficiently. Also, in the ribbon beam+wafer scanning method, uniformity is easily degraded when the beam size is expanded in a horizontal direction. Therefore, in particular, there are problems in the uniformity and the identity of beam angle in the low-dose condition (low beam current condition). However, when the obtained implantation result is within an allowable range, the ion implantation apparatus of the present invention may be configured by the two-dimensional mechanical scanning method or the ribbon beam+wafer scanning method.

On the other hand, the hybrid scanning method can achieve excellent uniformity in the beam scanning direction by adjusting the bean scanning speed at high accuracy. Also, by performing the beam scanning at a sufficient high speed, implantation non-uniformity in the wafer scanning direction can be sufficiently suppressed. Therefore, the hybrid scanning method is considered as optimal over a broad range of the dose condition.

FIG. 5A is a plan view illustrating a schematic configuration of an ion implantation apparatus 200 according to an embodiment of the present invention, and FIG. 5B is a side view illustrating a schematic configuration of an ion implantation apparatus 200 according to an embodiment of the present invention. The ion implantation apparatus 200 is an embodiment when the hybrid scanning method is applied to the ion implantation apparatus 100 illustrated in FIG. 2. Also, like the ion implantation apparatus 100 illustrated in FIG. 2, the ion implantation apparatus 200 is a serial-type apparatus.

As illustrated, the ion implantation apparatus 200 includes a plurality of beamline components. The beamline upstream part of the ion implantation apparatus 200 includes, in order from the upstream side, an ion source 201, a mass analysis magnet 202, a beam dump 203, a resolving aperture 204, a current suppression mechanism 205, a first XY convergence lens 206, a beam current measurement device 207, and a second XY convergence lens 208. An extraction electrode 218 (see FIGS. 6 and 7) for extracting ions from the ion source 201 is provided between the ion source 201 and the mass analysis magnet 202.

A scanner 209 is provided between the beamline upstream part and the beamline downstream part. The beamline downstream part includes, in order from the upstream side, a Y convergence lens 210, a beam parallelizing mechanism 211, an AD (Accel/Decel) column 212, and an energy filter 213. A wafer 214 is disposed in the most downstream part of the beamline downstream part. The beamline components from the ion source 201 to the beam parallelizing mechanism 211 are accommodated in a terminal 216.

The current suppression mechanism 205 is an example of the above-described beam current adjustment system 114. The current suppression mechanism 205 is provided for switching a low-dose mode and a high-dose mode. The current suppression mechanism 205 includes, for example, a continuously variable aperture (CVA). The CVA is an aperture capable of adjusting an opening size by a driving mechanism. Therefore, the current suppression mechanism 205 is configured to operate in a relatively small opening size adjustment range in the low-dose mode, and operate in a relatively large opening size adjustment range in the high-dose mode. In an embodiment, in addition or alternative to the current suppression mechanism 205, a plurality of resolving apertures 204 having different opening widths may be configured to operate with different settings in the low-dose mode and the high-dose mode.

The current suppression mechanism 205 serves to help beam adjustment under the low beam current condition by limiting an ion beam amount arriving at the downstream. The current suppression mechanism 205 is provided in the beamline upstream part (that is, from the ion extraction from the ion source 201 to the upstream side of the scanner 209). Therefore, the beam current adjustment range can be increased. Also, the current suppression mechanism 205 may be provided in the beamline downstream part.

The beam current measurement device 207 is, for example, a movable flag Faraday.

The first XY convergence lens 206, the second XY convergence lens 208, and the Y convergence lens 210 constitute the beam shaping device for adjusting the beam shape in the vertical and horizontal directions (beam cross-section in an XY plane). As such, the beam shaping device includes a plurality of lenses arranged along the beamline between the mass analysis magnet 202 and the beam parallelizing mechanism 211. The beam shaping device can use the convergence/divergence effect of these lenses in order to appropriately transport the ion beam up to the downstream in a broad range of energy/beam current condition. That is, the ion beam can be appropriately transported to the wafer 214 in any condition of low energy/low beam current, low energy/high beam current, high energy/low beam current, and high energy/high beam current.

The first XY convergence lens 206 is, for example, a Q lens. The second XY convergence lens 208 is, for example, an XY-direction einzel lens. The Y convergence lens 210 is, for example, a Y-direction einzel lens or Q lens. Each of the first XY convergence lens 206, the second XY convergence lens 208, and the Y convergence lens 210 may be a single lens or a group of lenses. In this manner, the beam shaping device is designed to appropriately control the ion beam from the low energy/high beam current condition having a beam self-divergence problem caused by a large beam potential to the high energy/low beam current having a beam cross-sectional shape control problem caused by a small beam potential.

The energy filter 213 is, for example, an angular energy filter (AEF) having a deflection electrode or a deflection electromagnet, or both of the defection electrode and the deflection electromagnet.

The ions generated in the ion source 201 are accelerated with an extraction electric field (not illustrated). The accelerated ions are deflected in the mass analysis magnet 202. In this manner, only ions having a predetermined energy and a mass-to-charge ratio pass through the resolving aperture 204. Subsequently, the ions are guided to the scanner 209 through the current suppression mechanism (CVA) 205, the first XY convergence lens 206, and the second XY convergence lens 208.

The scanner 209 reciprocally scans the ion beam in a horizontal direction (which may be a vertical direction or an oblique direction) by applying either (or both) of a periodic electric field and a periodic magnetic field. Due to the scanner 209, the ion beam is adjusted such that the ion beam is uniformly implanted in a horizontal direction on the wafer 214. The traveling direction of the ion beam 215 with which the scanner 209 scans can be parallelized by the beam parallelizing mechanism 211 using the application of either (or both) of the electric field and the magnetic field. Thereafter, the ion beam 215 is accelerated or decelerated to have a predetermined energy in the AD column 212 by applying the electric field. The ion beam 215 exiting the AD column 212 reaches the final implantation energy (in the low-energy mode, the energy may be adjusted to be higher than the implantation energy, and the ion beam may be deflected while decelerating in the energy filter). The energy filter 213 in the downstream of the AD column 212 deflects the ion beam 215 to the wafer 214 by the application of either (or both) of the electric field and the magnetic field with the deflection electrode or the deflection electromagnet. Thus, a contamination with energy other than target energy is eliminated. In this manner, the purified ion beam 215 is implanted into the wafer 214.

Also, the beam dump 203 is disposed between the mass analysis magnet 202 and the resolving aperture 204. The beam dump 203 deflects the ion beam by applying the electric field when necessary. Therefore, the beam dump 203 can control the arrival of the ion beam at the downstream at high speed.

Figure 5:
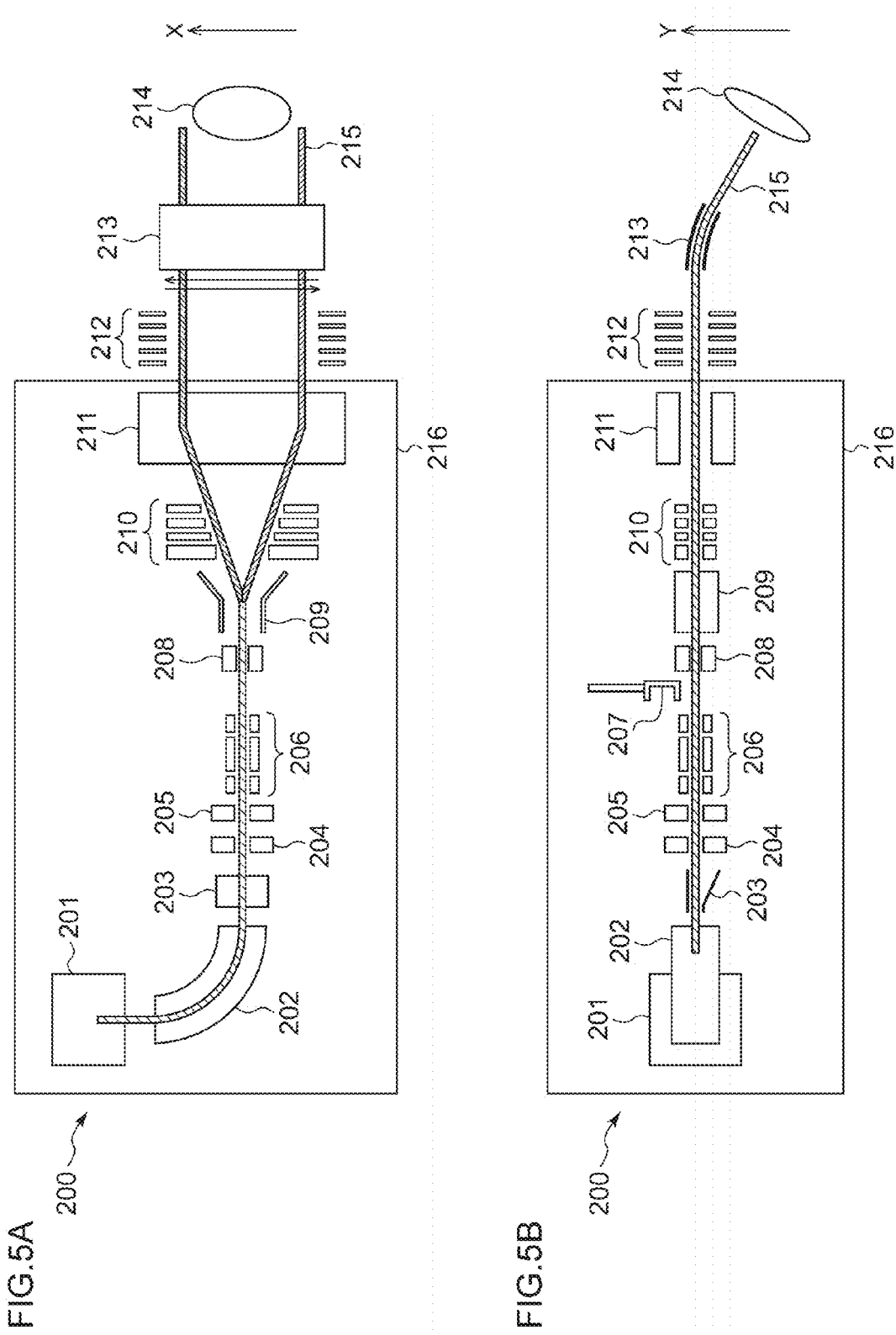
FIG. 5A is a plan view illustrating a schematic configuration of an ion implantation apparatus according to an embodiment of the present invention.
FIG. 5B is a side view illustrating a schematic configuration of an ion implantation apparatus according to an embodiment of the present invention.
Figure 6:
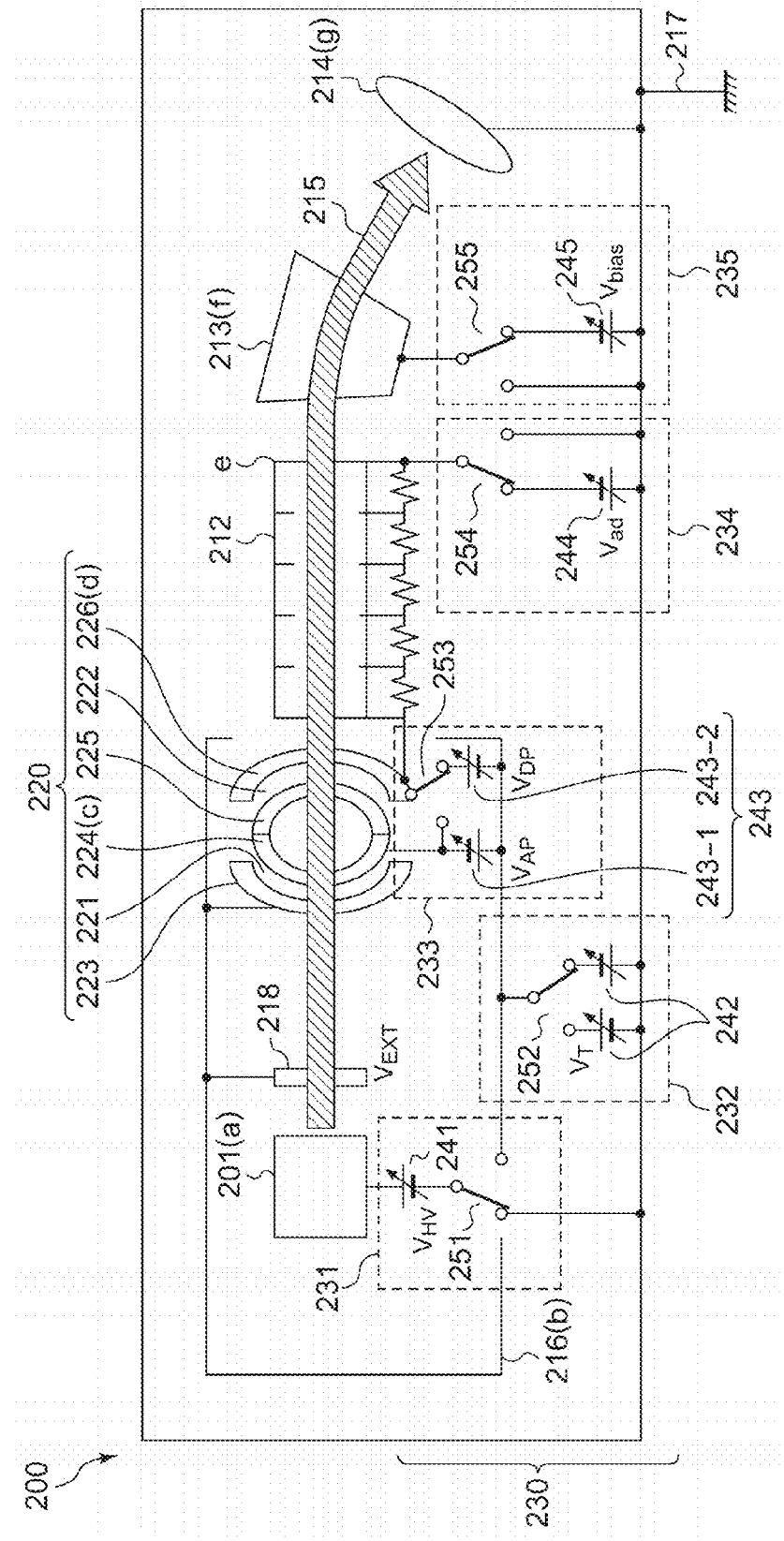
FIG. 6 is a diagram schematically illustrating a configuration of a power supply of an ion implantation apparatus according to an embodiment of the present invention.
Figure 7:
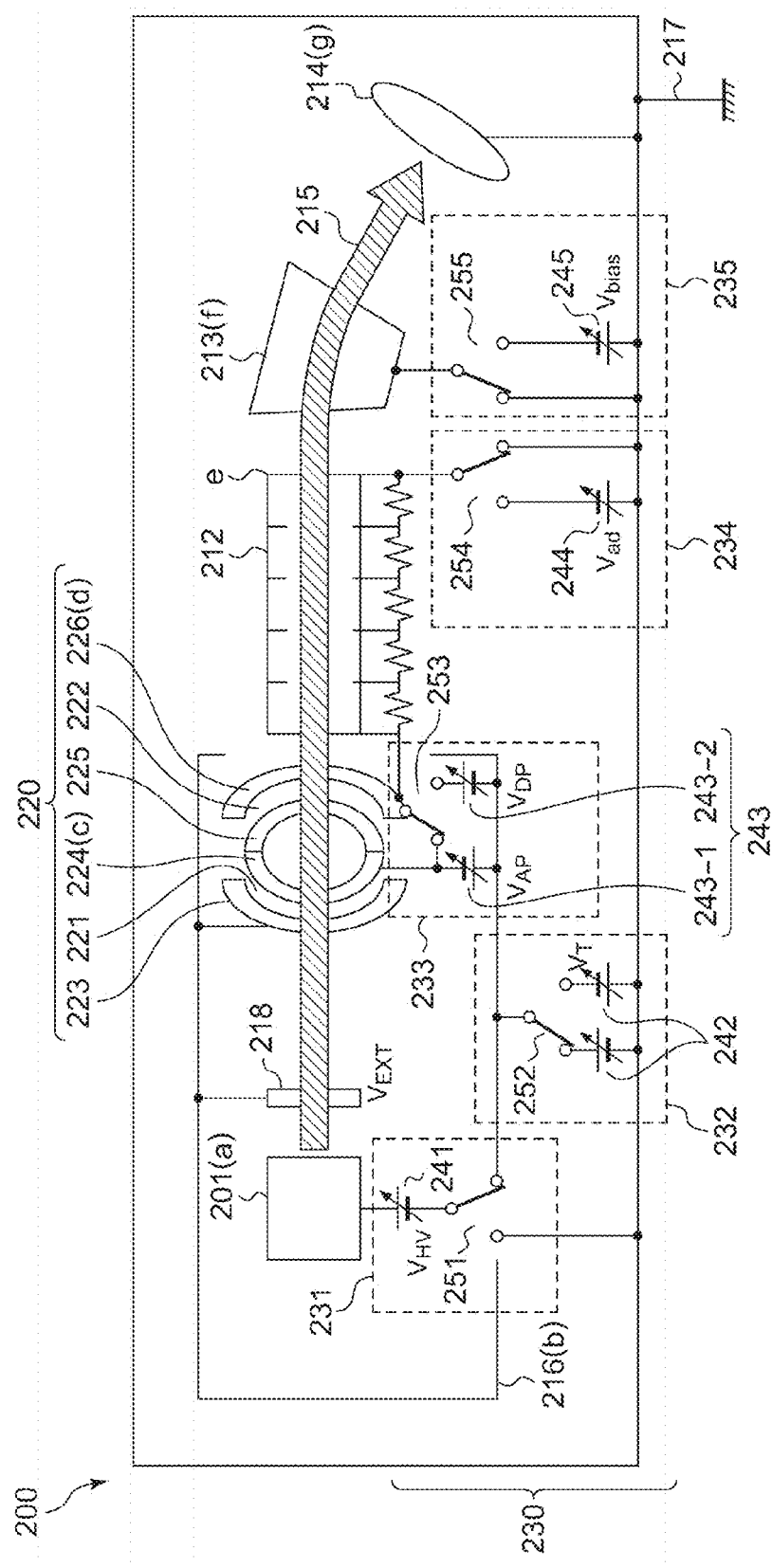
FIG. 7 is a diagram schematically illustrating a configuration of a power supply of an ion implantation apparatus according to an embodiment of the present invention.

Next, the low-energy mode and the high-energy mode in the ion implantation apparatus 200 illustrated in FIG. 5 will be described with reference to the configuration system diagram of the high-voltage power supply system 230 illustrated in FIGS. 6 and 7. FIG. 6 illustrates a power supply switching state of the low-energy mode, and FIG. 7 illustrates a power supply switching state of the high-energy mode. FIGS. 6 and 7 illustrate main components related to the energy adjustment of the ion beam among the beamline components illustrated in FIG. 5. In FIGS. 6 and 7, the ion beam 215 is indicated by an arrow.

As illustrated in FIGS. 6 and 7, the beam parallelizing mechanism 211 (see FIG. 5) includes a double P lens 220. The double P lens 220 includes a first voltage gap 221 and a second voltage gap 222 disposed spaced apart from each other along the ion movement direction. The first voltage gap 221 is disposed in the upstream, and the second voltage gap 222 is disposed in the downstream.

The first voltage gap 221 is formed between a pair of electrodes 223 and 224. The second voltage gap 222 is formed between another pair of electrodes 225 and 226 disposed in the downstream of the electrodes 223 and 224. The first voltage gap 221 and the electrodes 223 and 224 forming the gap 221 have a convex shape toward the upstream side. Conversely, the second voltage gap 222 and the electrodes 225 and 226 forming the gap 222 have a convex shape toward the downstream side. Also, for convenience of description, these electrodes may be also referred to as a first P lens upstream electrode 223, a first P lens downstream electrode 224, a second P lens upstream electrode 225, and a second P lens downstream electrode 226 below.

The double P lens 220 parallelizes the incident ion beam before emission and adjusts the energy of the ion beam by a combination of the electric fields applied to the first voltage gap 221 and the second voltage gap 222. That is, the double P lens 220 accelerates or decelerates the ion beam by the electric fields of the first voltage gap 221 and the second voltage gap 222.

Also, the ion implantation apparatus 200 includes a high-voltage power supply system 230 including a power supply for the beamline components. The high-voltage power supply system 230 includes a first power supply unit 231, a second power supply unit 232, a third power supply unit 233, a fourth power supply unit 234, and a fifth power supply unit 235. As illustrated, the high-voltage power supply system 230 includes a connection circuit for connecting the first to fifth power supply units 231 to 235 to the ion implantation apparatus 200.

The first power supply unit 231 includes a first power supply 241 and a first switch 251. The first power supply 241 is provided between the ion source 201 and the first switch 251, and is a DC power supply that provides the ion source 201 with a positive voltage. The first switch 251 connects the first power supply 241 to a ground 217 in the low-energy mode (see FIG. 6), and connects the first power supply 241 to a terminal 216 in the high-energy mode (see FIG. 7). Therefore, the first power supply 241 provides a voltage $V_{HV}$ to the ion source 201 in the low-energy mode on the basis of a ground potential. This provides the total ion energy as it is. On the other hand, the first power supply 241 provides a voltage $V_{HV}$ to the ion source 201 in the high-energy mode on the basis of a terminal potential.

The second power supply unit 232 includes a second power supply 242 and a second switch 252. The second power supply 242 is provided between the terminal 216 and the ground 217, and is a DC power supply that provides the terminal 216 with one of positive and negative voltages by the switching of the second switch 252. The second switch 252 connects a negative electrode of the second power supply 242 to the terminal 216 in the low-energy mode (see FIG. 6), and connects a positive electrode of the second power supply 242 to the terminal 216 in the high-energy mode (see FIG. 7). Therefore, the second power supply 242 provides a voltage $V_T$ ($V_T<0$) to the terminal 216 in the low-energy mode on the basis of the ground potential. On the other hand, the second power supply 242 provides a voltage $V_T$ ($V_T>0$) to the terminal 216 in the high-energy mode on the basis of the ground potential.

Therefore, an extraction voltage $V_{EXT}$ of the extraction electrode 218 is $V_{EXT}=V_{HV}-V_T$ in the low-energy mode, and is $V_{EXT}=V_{HV}$ in the high-energy mode. When a charge of an ion is q, the final energy is $qV_{HV}$ in the low-energy mode, and is $q(V_{HV}+V_T)$ in the high-energy mode.

The third power supply unit 233 includes a third power supply 243 and a third switch 253. The third power supply 243 is provided between the terminal 216 and the double P lens 220. The third power supply 243 includes a first P lens power supply 243-1 and a second P lens power supply 243-2. The first P lens power supply 243-1 is a DC power supply that provides a voltage $V_{AP}$ to the first P lens downstream electrode 224 and the second P lens upstream electrode 225 on the basis of the terminal potential. The second P lens power supply 243-2 is a DC power supply that provides a voltage $V_{DP}$ to a destination through the third switch 253 on the basis of the terminal potential. The third switch 253 is provided between the terminal 216 and the double P lens 220 to connect one of the first P lens power supply 243-1 and the second P lens power supply 243-2 to the second P lens downstream electrode 226 by the switching. Also, the first P lens upstream electrode 223 is connected to the terminal 216.

The third switch 253 connects the second P lens power supply 243-2 to the second P lens downstream electrode 226 in the low-energy mode (see FIG. 6), and connects the first P lens power supply 243-1 to the second P lens downstream electrode 226 in the high-energy mode (see FIG. 7). Therefore, the third power supply 243 provides a voltage $V_{DP}$ to the second P lens downstream electrode 226 in the low-energy mode on the basis of the terminal potential. On the other hand, the third power supply 243 provides a voltage $V_{AP}$ to the second P lens downstream electrode 226 in the high-energy mode on the basis of the terminal potential.

The fourth power supply unit 234 includes a fourth power supply 244 and a fourth switch 254. The fourth power supply 244 is provided between the fourth switch 254 and the ground 217 and is a DC power supply that provides a negative voltage to an exit (that is, the downstream end) of the AD column 212. The fourth switch 254 connects the fourth power supply 244 to the exit of the AD column 212 in the low-energy mode (see FIG. 6), and connects the exit of the AD column 212 to the ground 217 in the high-energy mode (see FIG. 7). Therefore, the fourth power supply 244 provides a voltage $V_{ad}$ to the exit of the AD column 212 in the low-energy mode on the basis of the ground potential. On the other hand, the fourth power supply 244 is not used in the high-energy mode.

The fifth power supply unit 235 includes a fifth power supply 245 and a fifth switch 255. The fifth power supply 245 is provided between the fifth switch 255 and the ground 217. The fifth power supply 245 is provided for the energy filter (AEF) 213. The fifth switch 255 is provided for switching the operation modes of the energy filter 213. The energy filter 213 is operated in a so-called offset mode in the low-energy mode, and is operated in a normal mode in the high-energy mode. The offset mode is an operation mode of the AEF in which an average value of the positive electrode and the negative electrode is a negative potential. The beam convergence effect of the offset mode can prevent beam loss caused by the beam divergence in the AEF. The normal mode is an operation mode of the AEF in which an average value of the positive electrode and the negative electrode is the ground potential.

The ground potential is provided to the wafer 214.

Figure 8A:
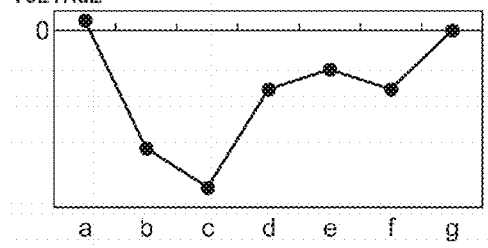
FIG. 8A is a diagram illustrating a voltage in an ion implantation apparatus according to an embodiment of the present invention.
Figure 8B:
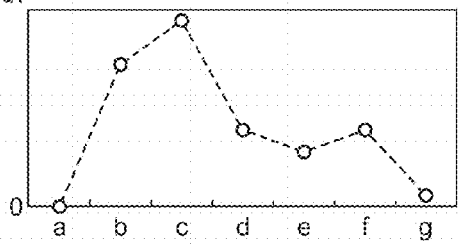
FIG. 8B is a diagram illustrating an energy in an ion implantation apparatus according to an embodiment of the present invention.

FIG. 8A illustrates an example of a voltage applied to each portion of the ion implantation apparatus 200 in the low-energy mode, and FIG. 8B illustrates an example of energy of the ion in each portion of the ion implantation apparatus 200 in the low-energy mode. FIG. 9A illustrates an example of a voltage applied to each portion of the ion implantation apparatus 200 in the high-energy mode, and FIG. 9B illustrates an example of energy of the ion in each portion of the ion implantation apparatus 200 in the high-energy mode. The vertical axes in FIGS. 8A and 9A represent the voltage, and the vertical axes in FIGS. 8B and 9B represent the energy. In the horizontal axes of the respective drawings, locations in the ion implantation apparatus 200 are represented by symbols a to g. The symbols a, b, c, d, e, f, and P represent the ion source 201, the terminal 216, the acceleration P lens (first P lens downstream electrode 224), the deceleration P lens (second P lens downstream electrode 226), the exit of the AD column 212, the energy filter 213, and the wafer 214, respectively.

The double P lens 220 has a configuration that uses the acceleration P lens c alone, or uses the deceleration P lens d alone, or uses both of the acceleration P lens c and the deceleration P lens d, when necessary according to the implantation condition. In the configuration that uses both of the acceleration P lens c and the deceleration P lens d, the double P lens 220 can be configured to change the distribution of the acceleration and deceleration effects by using both of the acceleration effect and the deceleration effect. In this case, the double P lens 220 can be configured such that a difference between the incident beam energy to the double P lens 220 and the exit beam energy from the double P lens 220 is used to accelerate or decelerate the beam. Alternatively, the double P lens 220 can be configured such that the difference between the incident beam energy and the exit beam energy becomes zero, and thus, the beam is neither accelerated nor decelerated.

As an example, as illustrated, in the low-energy mode, the double P lens 220 is configured to decelerate the ion beam in the deceleration P lens d, accelerate the ion beam in the acceleration P lens c to some extent when necessary, and thereby the ion beam is decelerated as a whole. On the other hand, in the high-energy mode, the double P lens 220 is configured to accelerate the ion beam only in the acceleration P lens c. Also, in the high-energy mode, the double P lens 220 may be configured to decelerate the ion beam in the deceleration P lens d to some extent when necessary, as long as the ion beam is accelerated as a whole.

Since the high-voltage power supply system 230 is configured as above, the voltages applied to several regions on the beamline can be changed by the switching of the power supply. Also, the voltage application paths in some regions can also be changed. By using these, it is possible to switch the low-energy mode and the high-energy mode in the same beamline.

In the low-energy mode, the potential $V_{HV}$ of the ion source 201 is directly applied on the basis of the ground potential. Therefore, a high-accuracy voltage application to the source unit is possible, and the accuracy of energy setting can be increased during the ion implantation at low energy. Also, by setting the terminal voltage $V_T$, the P lens voltage $V_{DP}$, the AD column exit voltage $V_{ad}$, and the energy filter voltage $V_{bias}$ to negative, it is possible to transport the ions to the energy filter at a relatively high energy. Therefore, the transport efficiency of the ion beam can be improved, and the high current can be obtained.

Also, in the low-energy mode, the deceleration P lens is employed to facilitate the ion beam transport in the high-energy state. This helps the low-energy mode coexist with the high-energy mode in the same beamline. Also, in the low-energy mode, an expanded beam by design is generated by adjusting the convergence/divergence elements of the beamline in order to transport the beam such that the self-divergence of the beam is minimized. This also helps the low-energy mode coexist with the high-energy mode in the same beamline.

In the high-energy mode, the potential of the ion source 201 is the sum of the acceleration extraction voltage $V_{HV}$ and the terminal potential $V_T$. This can enable the application of the high voltage to the source unit, and accelerate ions at high energy.

Figure 10:
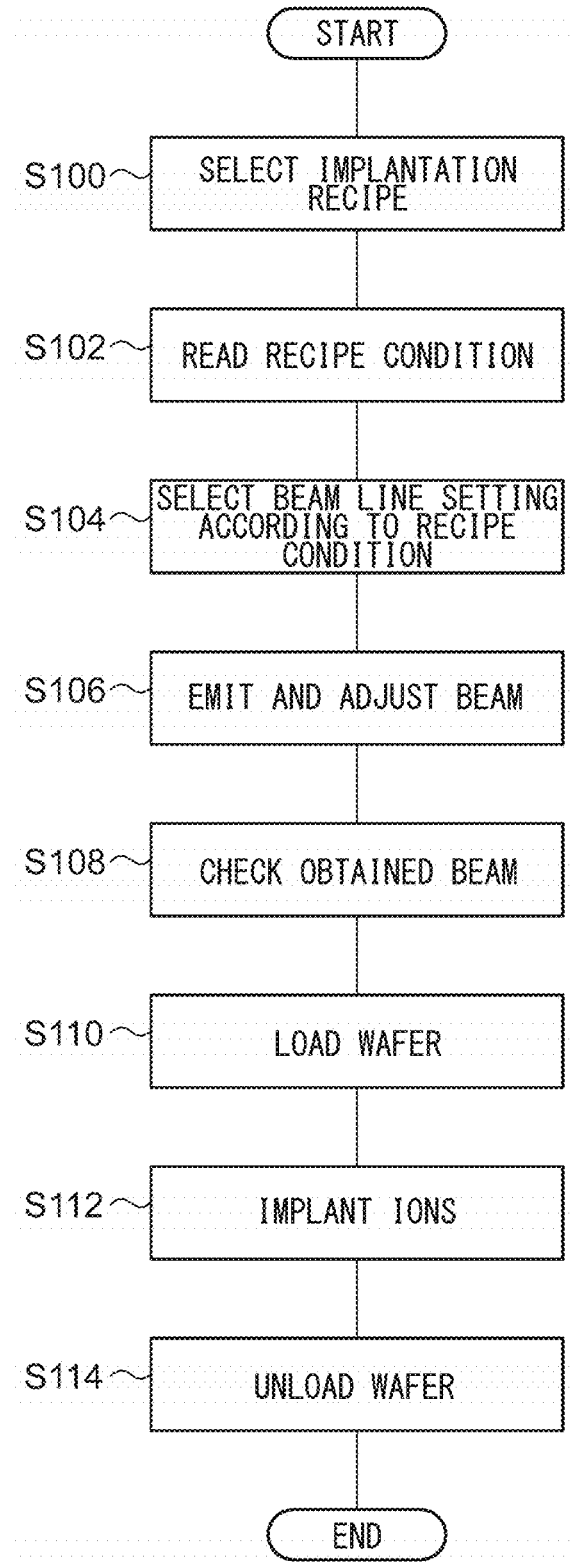
FIG. 10 is a flowchart illustrating an ion implantation method according to an embodiment of the present invention.

FIG. 10 is a flowchart illustrating an ion implantation method according to an embodiment of the present invention. This method may be performed by, for example, the beam control device for the ion implantation apparatus. As illustrated in FIG. 10, first, the implantation recipe is selected (S100). The control device reads the recipe condition (S102), and selects the beamline setting according to the recipe condition (S104). The ion beam adjusting process is performed under the selected beamline setting. The adjusting process includes a beam emission and adjustment (S106) and an obtained beam checking (S108). In this manner, the preparing process for the ion implantation is ended. Next, the wafer is loaded (S110), the ion implantation is performed (S112), and the wafer is unloaded (S114). Steps 110 to 114 may be repeated until the desired number of wafers are processed.

Figure 11:
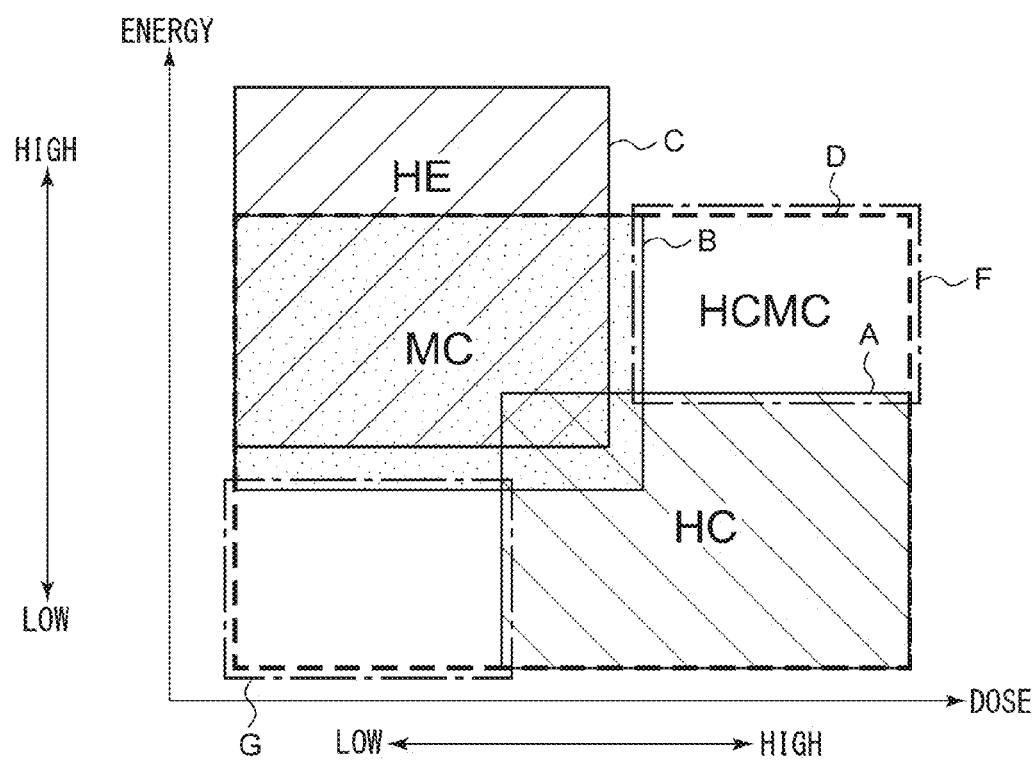
FIG. 11 is a diagram schematically illustrating ranges of an energy and a dose amount in an ion implantation apparatuses according to an embodiment of the present invention.

FIG. 11 schematically illustrates a range D of energy and dose amount that is realized by the ion implantation apparatus 200. Like in FIG. 1, FIG. 11 illustrates the range of energy and dose amount that can be processed in the actually allowable productivity. For comparison, ranges A, B and C of energy and dose amount of the HC, the MC, and the HE illustrated in FIG. 1 are illustrated in FIG. 11.

As illustrated in FIG. 11, it can be seen that the ion implantation apparatus 200 includes all the operation ranges of the existing apparatuses HC and MC. Therefore, the ion implantation apparatus 200 is a novel apparatus beyond the existing framework. Even one novel ion implantation apparatus can serve as the two existing types of categories HC and MC while maintaining the same beamline and the implantation method. Therefore, this apparatus may be referred to as HCMC.

Therefore, according to the present embodiment, it is possible to provide the HCMC in which the serial-type high-dose high-current ion implantation apparatus and the serial-type medium-dose medium-current ion implantation apparatus are configured as a single apparatus. The HCMC can perform the implantation in a broad range of energy condition and dose condition by changing the voltage applying method in the low-energy condition and the high-energy condition and changing the beam current from high current to low current in the CVA.

Figure 12:
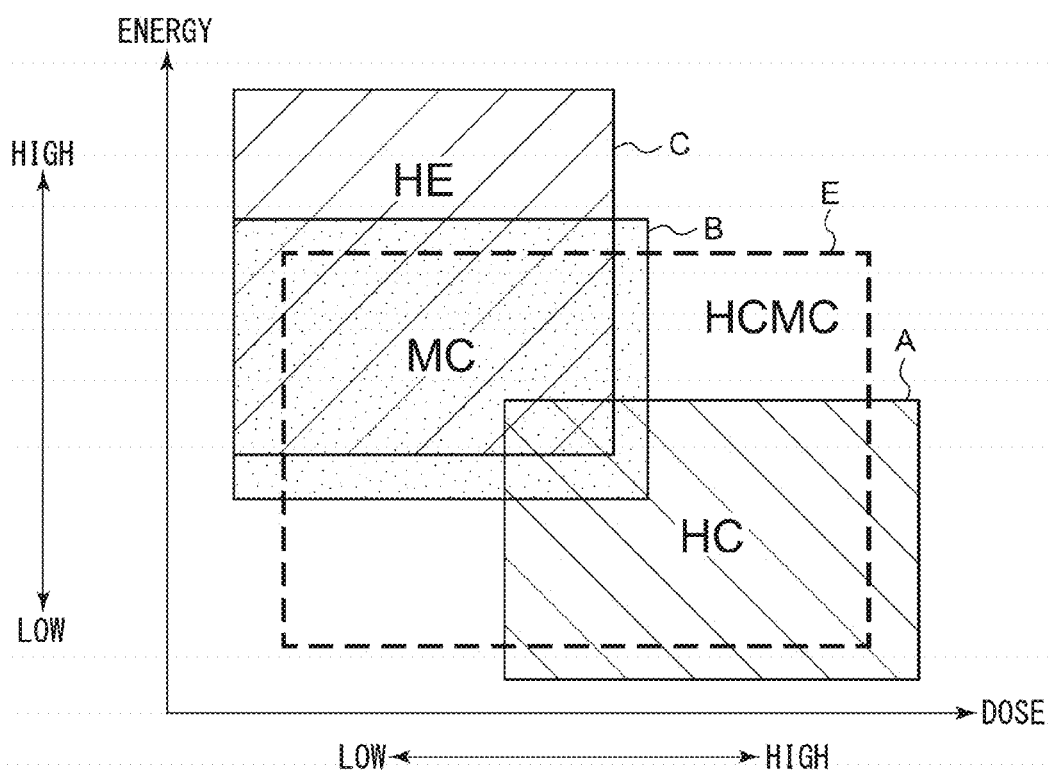
FIG. 12 is a diagram schematically illustrating ranges of an energy and a dose amount in an ion implantation apparatuses according to an embodiment of the present invention.

Also, the HCMC-type ion implantation apparatus may not include all the implantation condition ranges of the existing HC and MC. Considering the tradeoff of the device manufacturing cost and the implantation performance, it may be thought to provide an apparatus having a range E (see FIG. 12) narrower than the range D illustrated in FIG. 11. In this case, the ion implantation apparatus having excellent practicality can be provided as long as it covers the ion implantation conditions required for the device maker.

Figure 13:
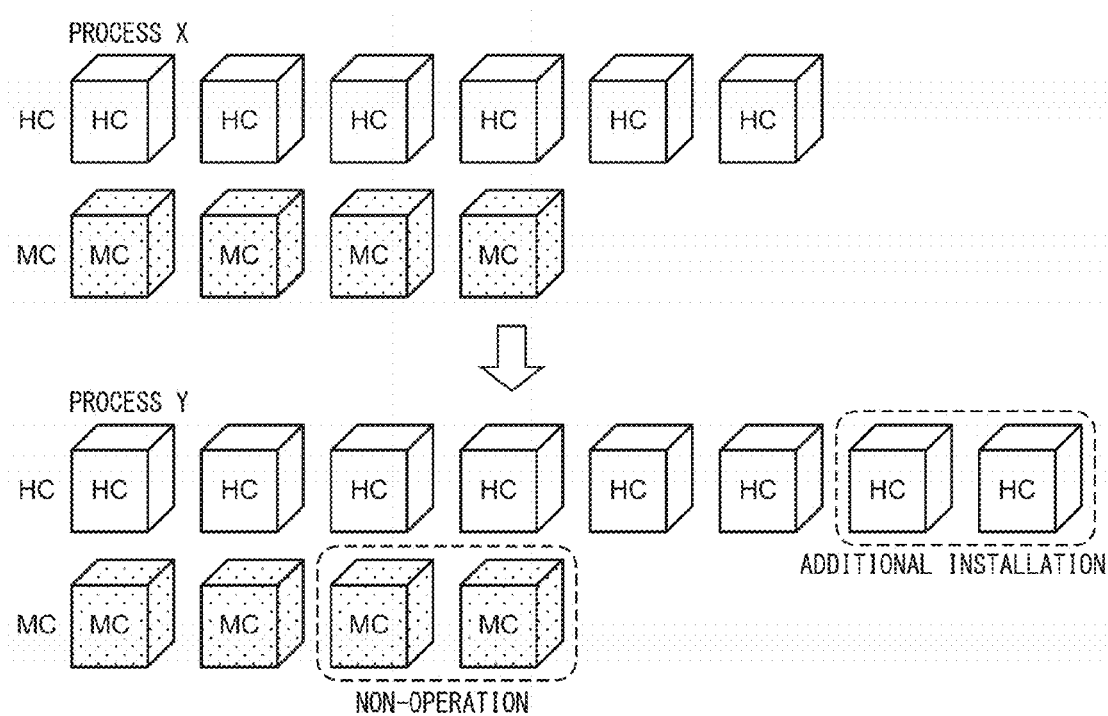
FIG. 13 is a diagram describing the use of a typical ion implantation apparatus.

The improvement in the operation efficiency of the apparatus realized by the HCMC in the device manufacturing process will be described. For example, as illustrated in FIG. 13, it is assumed that a device maker uses six HCs and four MCs in order to process a manufacturing process X (that is, this device maker owns only the existing apparatuses HC and MC). Thereafter, the device maker changes the process X to a process Y according to a change in a manufacturing device. As a result, the device maker needs eight HCs and two MCs. The maker needs to install two more HCs, and thus, the increase in investment and the lead time are required. At the same time, two MCs are not operated, and thus, the maker unnecessarily owns these. As described above, since the HC and the MC are generally different in the implantation method, it is difficult to convert the non-operating MCs to newly necessary HCs.

Figure 14:
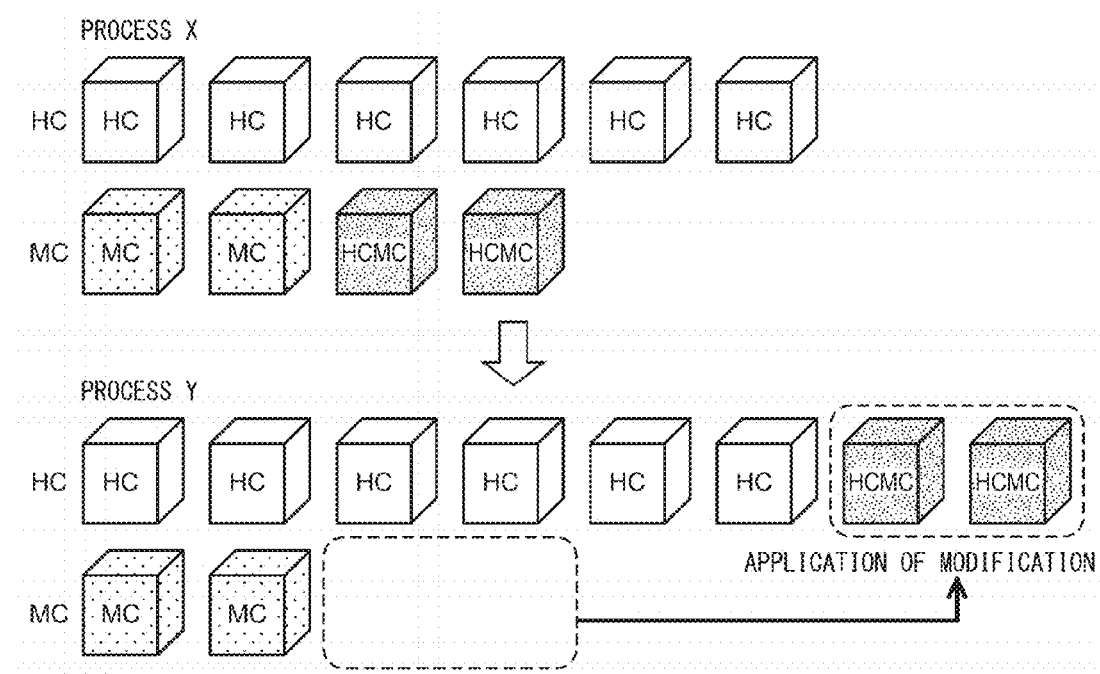
FIG. 14 is a diagram describing the use of an ion implantation apparatus according to an embodiment of the present invention.

Next, as illustrated in FIG. 14, it is considered that the device maker uses six HCs, two MCs, and two HCMCs in order to process the process X. In this case, even when the process X is changed to the process Y according to the change in the manufacturing device, the HCMC can be operated as the HC because the HCMC is the process shared machine of the HC and the MC. Therefore, additional equipment installation and non-operation are unnecessary.

As such, there is a great merit when the device maker owns a certain number of HCMCs. This is because the process change of HC and the MC can be absorbed by the HCMC. Also, when some apparatuses cannot be used due to malfunction or maintenance, the HCMC can also be used as the HC or the MC. Therefore, by owning the HCMC, the overall operating rate of the apparatus can be significantly improved.

Also, ultimately, it can be considered that all apparatuses are provided with HCMCs. However, in many cases, it is practical that part of the apparatuses are provided with HCMCs considering a price difference between the HCMC and the HC (or MC) or the utilization of the already owned HC or MC.

Also, when a type of the existing ion implantation apparatus is replaced with other apparatuses having different methods of implanting ions into the wafer in order for an ion implantation process to be performed, it may be difficult to match the implantation characteristics. This is because a beam divergence angle or a beam density may be different even though the energy and dose are matched in two types of ion implantation apparatuses for the ion implantation process. However, the HCMC can process the high-dose high-current ion implantation condition and the medium-dose medium-current ion implantation condition on the same beamline (the same ion beam trajectory). In this way the HCMC can separately use the high-dose high-current ion implantation condition and the medium-dose medium-current ion implantation condition. Therefore, it is expected to facilitate the matching because the change in the implantation characteristics followed by the replacement of the apparatus is sufficiently suppressed.

The HCMC is the shared machine of the HC and the MC and can also process the implantation condition out of the operation range of the existing HC or the MC. As illustrated in FIG. 11, the HCMC is a new apparatus that can also process the high energy/high dose implantation (right upper region F in the range D) and low energy/low dose implantation (left lower region G in the range D). Therefore, in addition or alternative to the first beamline setting S1 and the second beamline setting S2 described above, in an embodiment, the ion implantation apparatus may include a third beamline setting for high energy/high dose implantation and/or a fourth beamline setting for low energy/low dose implantation.

As described above, in the present embodiment, the beamlines of the serial-type high-dose high-current ion implantation apparatus and the serial-type medium-dose medium-current ion implantation apparatus are matched and shared. Moreover, a structure for switching the beamline configuration is constructed. In this manner, the implantation processing is possible over a broad range of energy and beam current regions on the same beamline (the same ion beam trajectory and the same implantation method).

The present invention has been described based on the embodiments. The present invention is not limited to the embodiments, and it can be understood by those skilled in the art that designs can be modified in various ways, various modifications can be made, and such modifications fall within the scope of the present invention.

In addition or alternative to the above-described configurations, the quantitative adjustment of the beam current by the beam current adjustment system can be configured in various ways. For example, when the beam current adjustment system includes a variable-width aperture arranged on the beamline, the variable-width aperture may be disposed at any arbitrary position. Therefore, the variable-width aperture may be disposed between the ion source and the mass analysis magnet, between the mass analysis magnet and the mass analysis slit, between the mass analysis slit and the beam shaping device, between the beam shaping device and the beam control device, between the beam control device and the beam conditioning device, between the respective elements of the beam conditioning device, and/or between the beam conditioning device and the workpiece. The variable-width aperture may be the mass analysis slit.

The beam current adjustment may be configured to adjust the amount of ion beam passing through the aperture by arranging the divergence/convergence lens system before and/or after a fixed-width aperture. The fixed-width aperture may be the mass analysis slit.

The beam current adjustment may be performed using an energy slit opening width variable (and/or a beamline end opening width variable slit apparatus). The beam current adjustment may be performed using an analyzer magnet (mass analysis magnet) and/or a steerer magnet (trajectory modification magnet). The dose amount adjustment may be accompanied by an expansion of the variable range of mechanical scan speed (for example, from ultra-low speed to ultra-high speed) and/or a change in the number of times of the mechanical scanning.

The beam current adjustment may be performed by the adjustment of the ion source (for example, amount of gas or arc current). The beam current adjustment may be performed by the exchange of the ion source. In this case, the ions source for MC and the ion source for HC may be selectively used. The beam current adjustment may be performed by the gap adjustment of the extraction electrode of the ion source. The beam current adjustment may be performed by providing the CVA immediately downstream of the ion source.

The beam current adjustment may be performed according to the change in the vertical width of the ribbon beam. The dose amount adjustment may be performed according to the change in the scanning speed during the two-dimensional mechanical scanning.

The beamline device may include a plurality of beamline components configured to operate under only one of the first beamline setting and the second beamline setting, and thus, the ion implantation apparatus may be configured as a high-current ion implantation apparatus or a medium-current ion implantation apparatus. That is, with the HCMC as a platform, for example, by exchanging some beamline components, or changing the power supply configuration, the serial-type high-dose dedicated ion implantation apparatus or the serial-type medium-dose dedicated ion implantation apparatus can be produced from the serial-type high-dose medium-dose wide-use ion implantation apparatus. Since it is expected to manufacture each dedicated apparatus at lower cost than the wide-use apparatus, it can contribute to reducing the manufacturing costs for the device maker.

In the MC, implantation at higher energy may be achieved by using multivalent ions such as divalent ions or trivalent ions. However, in the typical ion source (thermionic emission type ion source), the generation efficiency of multivalent ions is much lower than the generation efficiency of monovalent ions. Therefore, practical dose implantation in the high-energy range is actually difficult. When a multivalent ion enhancement source, such as an RF ion source, is employed as the ion source, tetravalent or pentavalent ions can be obtained. Therefore, more ion beams can be obtained in the higher energy condition.

Therefore, by employing the multivalent ion enhancement source, such as the RF ion source, as the ion source, the HCMC can operate as the serial-type high energy ion implantation apparatus (HE). Therefore, a portion of the implantation condition that has been processed by only the serial-type high energy/low-dose ion implantation apparatus can be processed by the HCMC (the range of the MC illustrated in FIG. 8 may be expanded to include at least a portion of the range C).

Hereinafter, several aspects of the present invention will be described.

An ion implantation apparatus according to an embodiment includes: an ion source for generating ions and extracting the ions as an ion beam; an implantation processing chamber for implanting the ions into a workpiece; and a beamline device for providing a beamline to transport the ion beam from the ion source to the implantation processing chamber, wherein the beamline device supplies the ion beam having a beam irradiation region exceeding the width of the workpiece in the implantation processing chamber, the implantation processing chamber includes a mechanical scanning device for mechanically scanning the workpiece with respect to the beam irradiation region, the beamline device is operated under one of a plurality of implantation setting configurations according to an implantation condition, the plurality of implantation setting configurations including a first implantation setting configuration suitable for transport of a low energy/high current beam for high-dose implantation into the workpiece, and a second implantation setting configuration suitable for transport of a high energy/low current beam for low-dose implantation into the workpiece, and the beamline device is configured such that a same beam center trajectory being a reference in the beamline is provided from the ion source to the implantation processing chamber in the first implantation setting configuration and the second implantation setting configuration.

An ion implantation apparatus according to an embodiment includes: an ion source for generating ions and extracting the ions as an ion beam; an implantation processing chamber for implanting the ions into a workpiece; and a beamline device for providing a beamline to transport the ion beam from the ion source to the implantation processing chamber, wherein the ion implantation apparatus is configured to irradiate the workpiece with the ion beam in cooperation with mechanical scanning of the workpiece, the beamline device is operated under one of a plurality of implantation setting configurations according to an implantation condition, the plurality of implantation setting configurations including a first implantation setting configuration suitable for transport of a low energy/high current beam for high-dose implantation into the workpiece, and a second implantation setting configuration suitable for transport of a high energy/low current beam for low-dose implantation into the workpiece, and the beamline device is configured such that a same beam center trajectory being a reference in the beamline is provided from the ion source to the implantation processing chamber in the first implantation setting configuration and the second implantation setting configuration.

The beamline device may take the same implantation method in the first implantation setting configuration and the second implantation setting configuration. The beam irradiation region may be equal in the first implantation setting configuration and the second implantation setting configuration.

The beamline apparatus may include a beam conditioning device for conditioning the ion beam, and a beam shaping device for shaping the ion beam. The beam conditioning device and the beam shaping device in the beamline device may be disposed in the same layout in the first implantation setting configuration and the second implantation setting configuration. The beam implantation apparatus may have the same installation floor area in the first implantation setting configuration and the second implantation setting configuration.

The beamline device may include a beam current adjustment system for adjusting the total amount of beam current of the ion beam. The first implantation setting configuration may include a first beam current setting for the beam current adjustment system, the second implantation setting configuration may include a second beam current setting for the beam current adjustment system, and the second beam current setting may be determined to make the beam current of the ion beam smaller than that of the first beam current setting.

The beam current adjustment system may be configured to block at least a portion of the ion beam when passing through an adjustment element. The beam current adjustment system may include a variable-width aperture arranged on the beamline. The beam current adjustment system may include a beamline end opening width variable slit device. The ion source may be configured to adjust the total amount of beam current of the ion beam. The ion source may include an extraction electrode for extracting the ion beam, and the total amount of beam current of the ion beam may be adjusted by adjusting an opening of the extraction electrode.

The beamline device may include an energy adjustment system for adjusting an implantation energy of the ions into the workpiece. The first implantation setting configuration may include a first energy setting for the energy adjustment system, the second implantation setting configuration may include a second energy setting for the energy adjustment system, the first energy setting may be suitable for transport of a lower energy beam as compared with the second energy setting.

The energy adjustment system may include a beam parallelizing device for parallelizing the ion beam. The beam parallelizing device may be configured to decelerate, or decelerate and accelerate the ion beam under the first implantation setting configuration, and accelerate, or accelerate and decelerate the ion beam under the second implantation setting configuration. The beam parallelizing device may include an acceleration lens for accelerating the ion beam, and a deceleration lens for decelerating the ion beam, and may be configured to modify a distribution of acceleration and deceleration, and the beam parallelizing device may be configured to mainly decelerate the ion beam under the first implantation setting configuration, and mainly accelerate the ion beam under the second implantation setting configuration.

The beamline device may include a beam current adjustment system for adjusting the total amount of beam current of the ion beam, and an energy adjustment system for adjusting an implantation energy of the ions into the workpiece, and may adjust the total amount of the beam current and the implantation energy individually or simultaneously. The beam current adjustment system and the energy adjustment system may be separate beamline components.

The ion implantation apparatus may include a control unit configured to manually or automatically select one implantation setting configuration suitable for a given ion implantation condition among the plurality of implantation setting configurations including the first implantation setting configuration and the second implantation setting configuration.

The control unit may select the first implantation setting configuration when a desired ion dose amount implanted into the workpiece is in the range of about $1 \times 10^{14}$ to $1 \times 10^{17}$ atoms/cm$^2$, and may select the second implantation setting configuration when a desired ion dose amount implanted into the workpiece is in the range of about $1 \times 10^{11}$ to $1 \times 10^{14}$ atoms/cm$^2$.

The beamline device may have a first energy adjustment range under the first implantation setting configuration, and may have a second energy adjustment range under the second implantation setting configuration, and the first energy adjustment range and the second energy adjustment range may have a partially overlapped range.

The beamline device may have a first dose adjustment range under the first implantation setting configuration, and may have a second dose adjustment range under the second implantation setting configuration, and the first dose adjustment range and the second dose adjustment range may have a partially overlapped range.

The beamline device may include a beam scanning device for providing scanning of the ion beam to form an elongated irradiation region extending in a longitudinal direction perpendicular to a beam transport direction. The implantation processing chamber may include a workpiece holder configured to provide mechanical scanning of the workpiece in a direction perpendicular to the longitudinal direction and the beam transport direction.

The beamline device may include a ribbon beam generator for generating a ribbon beam having an elongated irradiation region extending in a longitudinal direction perpendicular to a beam transport direction. The implantation processing chamber may include a workpiece holder configured to provide mechanical scanning of the workpiece in a direction perpendicular to the longitudinal direction and the beam transport direction.

The implantation processing chamber may include a workpiece holder configured to provide mechanical scanning of the workpiece in two directions perpendicular to each other in a plane perpendicular to the beam transport direction.

The beamline device may be configured to be selectable from a plurality of beamline components configured to be operated under only one of the first implantation setting configuration and the second implantation setting configuration, and the ion implantation apparatus may be configured as a high-current dedicated ion implantation apparatus or a medium-current dedicated ion implantation apparatus.

An ion implantation method according to an embodiment includes: selecting one implantation setting configuration, with respect to a beamline device, which is suitable for a given ion implantation condition among a plurality of implantation setting configurations including a first implantation setting configuration suitable for transport of a low energy/high current beam for high-dose implantation into a workpiece, and a second implantation setting configuration suitable for transport of a high energy/low current beam for low-dose implantation into the workpiece; transporting an ion beam along a beam center trajectory being a reference in a beamline from an ion source to an implantation processing chamber by using the beamline device under the selected implantation setting configuration; and irradiating the workpiece with the ion beam in cooperation with mechanical scanning of the workpiece, wherein the beam center trajectory being the reference is equal in the first implantation setting configuration and the second implantation setting configuration.

The transporting may include adjusting an implantation dose amount into the workpiece by adjusting the total amount of beam current of the ion beam. The implantation dose amount may be adjusted in a first dose adjustment range under the first implantation setting configuration, and may be adjusted in a second dose adjustment range under the second implantation setting configuration, the second dose adjustment range including a dose range smaller than the first dose adjustment range.

The transporting may include adjusting the implantation energy into the workpiece. The implantation energy may be adjusted in a first energy adjustment range under the first implantation setting configuration, and may be adjusted in a second energy adjustment range under the second implantation setting configuration, the second energy adjustment range including an energy range higher than the first energy adjustment range.

1. An ion implantation apparatus according to an embodiment has the same beam trajectory and the same implantation method and has a broad energy range by switching a connection of a power supply for deceleration as a whole and a connection of a power supply for acceleration as a whole.

2. An ion implantation apparatus according to an embodiment has the same beam trajectory and the same implantation method and has a broad beam current range by including a device for cutting a portion of beam in a beamline upstream part in a beamline capable of obtaining a high current.

3. An ion implantation apparatus according to an embodiment may have the same beam trajectory and the same implantation method and have a broad energy range and a broad beam current range by including both of the features of the embodiment 1 and the embodiment 2.

An ion implantation apparatus according to an embodiment may be an apparatus that combines a beam scanning and a mechanical wafer scanning as the same implantation method in the embodiments 1 to 3. An ion implantation apparatus according to an embodiment may be an apparatus that combines a ribbon-shaped beam and a mechanical wafer scanning as the same implantation method in the embodiments 1 to 3. An ion implantation apparatus according to an embodiment may be an apparatus that combines a two-dimensional mechanical wafer scanning as the same implantation method in the embodiments 1 to 3.

4. An ion implantation apparatus according to an embodiment is configured to freely select/switch a high-dose high-current ion implantation and a medium-dose medium-current ion implantation by configuring a high-dose high-current ion implantation beamline component and a medium-dose medium-current ion implantation beamline component in parallel on the same beamline (the same ion beam trajectory and the same implantation method), and covers a very broad energy range from low energy to high energy and a very broad dose range from a low dose to a high dose.

5. In the embodiment 4, each beamline component shared in the high dose use and the medium dose use and each beamline component individually switched in the high dose/medium dose use may be configured on the same beamline.

6. In the embodiment 4 or 5, in order to adjust the beam current amount in a broad range, a beam limiting device (vertical or horizontal variable-width slit, or rectangular or circular variable opening) for physically cutting a portion of beam in a beamline upstream part may be provided.

7. In any one of the embodiments 4 to 6, a switch controller control device may be provided to select a high-dose high-current ion implantation and a medium-dose medium-current ion implantation, based on a desired ion dose amount implanted into the workpiece.

8. In the embodiment 7, the switch controller is configured to operate the beamline in a medium-dose acceleration (extraction)/acceleration (P lens)/acceleration or deceleration (AD column) mode when a desired ion dose amount implanted into the workpiece is in the medium-dose medium-current range of about $1 \times 10^{11}$ to $1 \times 10^{14}$ atoms/cm$^2$, and operate the beamline in a high-dose acceleration (extraction)/deceleration (P lens)/deceleration (AD column) mode when a desired ion dose amount implanted into the workpiece is in the high-dose high-current range of about $1 \times 10^{14}$ to $1 \times 10^{17}$ atoms/cm$^2$.

9. In any one of the embodiments 4 to 8, an apparatus for implanting ions of relatively high energy by using an acceleration mode and an apparatus for implanting ions of relatively low energy by using a deceleration mode may have a mutually overlapped energy range.

10. In any one of the embodiments 4 to 8, an apparatus for implanting ions of relatively high energy by using an acceleration mode and an apparatus for implanting ions of relatively low energy by using a deceleration mode may have a mutually overlapped dose range.

11. In any one of the embodiments 4 to 6, by limiting the beamline components, the ion implantation apparatus may easily be changed to a high-dose high-current dedicated ion implantation apparatus or a medium-dose medium-current dedicated ion implantation apparatus.

12. In anyone of the embodiments 4 to 11, the beamline configuration may combine a beam scanning and a mechanical substrate scanning.

13. In anyone of the embodiments 4 to 11, the beamline configuration may combine a mechanical substrate scanning and a ribbon-shaped beam having a width equal to or greater than a width of a substrate (or wafer or workpiece).

14. In anyone of the embodiments 4 to 11, the beamline configuration may include a mechanical substrate scanning in a two-dimensional direction.

FIG. 15 is a perspective cross-sectional view illustrating a configuration of a scanning unit 1000 included in an ion implantation apparatus according to an embodiment of the present invention. The ion implantation apparatus includes the scanning unit 1000 that includes an upstream electrode device 300, a scanning electrode device 400, and a downstream electrode device 500. The upstream electrode device 300, the scanning electrode device 400, and the downstream electrode device 500 which are illustrated in the present drawing have a vertically and horizontally symmetric shape with respect to a reference trajectory of an ion beam B which is incident into the scanning unit 1000. In the present drawing, a lower half configuration thereof is only illustrated in order to facilitate understanding.

The upstream electrode device 300 is disposed just upstream of the scanning electrode device 400, and shapes a profile of an ion beam which is incident into the scanning electrode device 400. The upstream electrode device 300 is configured by a plurality of electrode bodies, and includes a first upstream reference voltage electrode 310, an upstream intermediate electrode 330, and a second upstream reference voltage electrode 350. The upstream electrode device 300 can be used as, for example, the second XY focusing lens 208 of the ion implantation apparatus 200 illustrated in FIGS. 5A and 5B.

The scanning electrode device 400 allows a deflecting electric field to act on the ion beam incident into the scanning electrode device 400 and provides periodical scanning of the ion beam in a horizontal direction (x direction). The scanning electrode device 400 includes a pair of scanning electrodes 410R and 410L (hereinafter, also collectively referred to as a scanning electrode 410) that allow a deflecting electric field to act on the ion beam and a beam transport correction electrode 450. The beam transport correction electrode 450 is provided to suppress a so-called "zero field effect", in which when the deflecting electric field applied by the scanning electrodes 410R and 410L becomes zero, the diameter of the ion beam is reduced as compared to a case in which the deflected filed is applied. A pair of beam transport correction electrodes 450 are provided, which face each other in a vertical direction (y direction). In this drawing, there is illustrated only a lower correction electrode 450B disposed in the lower side. The scanning electrode device 400 can be used as, for example, the scanner 209 of the ion implantation apparatus 200 illustrated in FIGS. 5A and 5B.

The downstream electrode device 500 is disposed just downstream of the scanning electrode device 400, and shapes a profile of an ion beam scanned by the scanning electrode device 400. The downstream electrode device 500 is configured by a plurality of electrode bodies, and includes a first downstream reference voltage electrode 510, a first downstream intermediate electrode 530, a second downstream reference voltage electrode 550, a second downstream intermediate electrode 570, and a third downstream reference voltage electrode 590. The downstream electrode device 500 can be used as, for example, the Y focusing lens 210 of the ion implantation apparatus 200 illustrated in FIGS. 5A and 5B.

FIGS. 16A and 16B are cross-sectional views schematically illustrating a configuration of the scanning unit 1000 illustrated in FIG. 15. FIG. 16A illustrates a horizontal direction cross-section (xz-plane cross-section) including a reference trajectory Z when it is assumed that the reference trajectory Z of an ion beam extends in a z direction. FIG. 16B illustrates a vertical direction cross-section (yz-plane cross-section) including the reference trajectory Z. Hereinafter, the scanning electrode device 400, the upstream electrode device 300, and the downstream electrode device 500 in the scanning unit 1000 will be described in order with reference to the present drawings.

Figure 17:
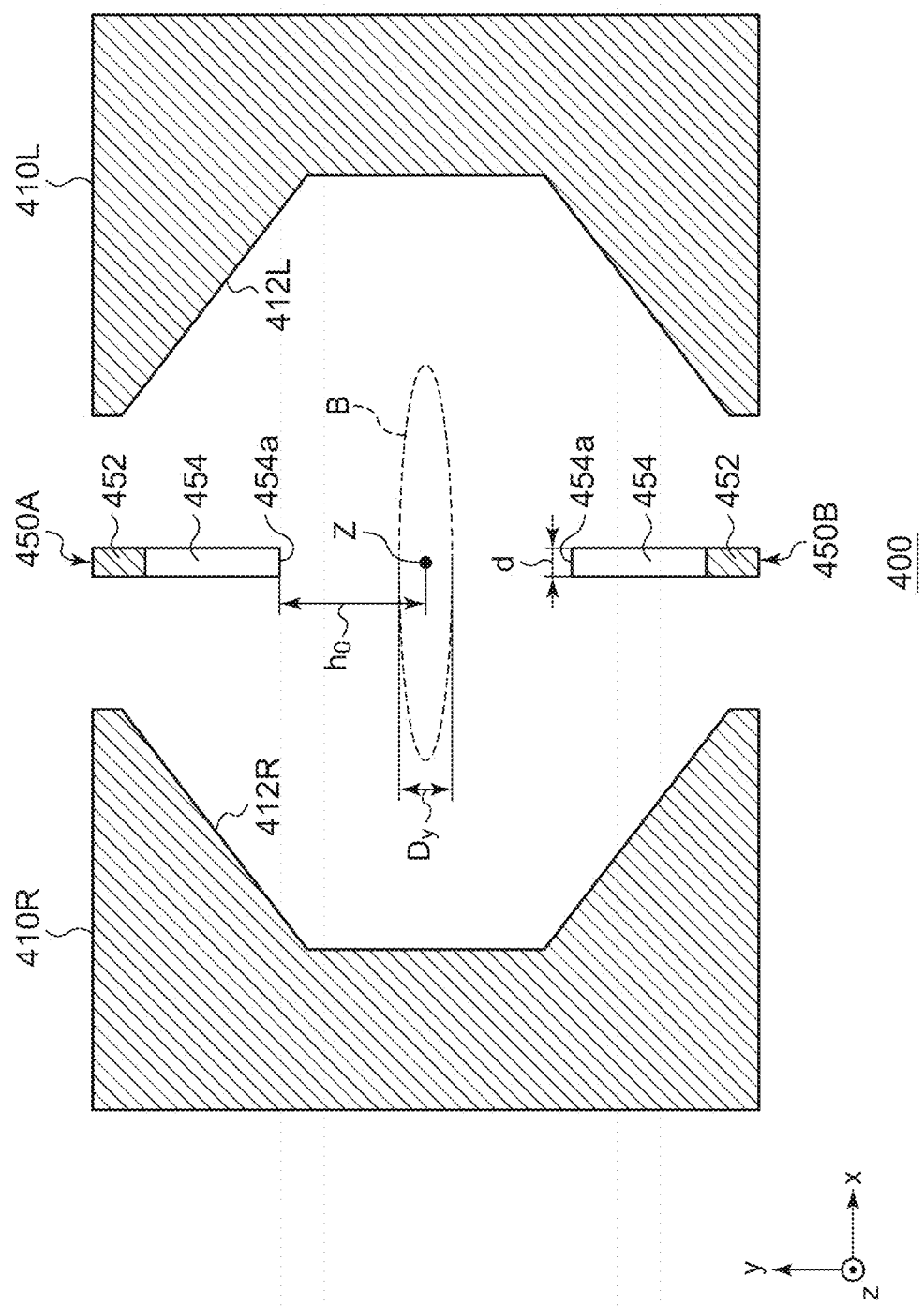
FIG. 17 is a diagram schematically illustrating a configuration of a scanning electrode device.

FIG. 17 is a diagram schematically illustrating the scanning electrode device 400, which illustrates X-X cross-section of FIG. 16A. The pair of scanning electrodes 410R and 410L are provided to face each other in a horizontal direction (x direction) with respect to the reference trajectory Z of the ion beam. B. The scanning electrodes 410R and 410L respectively include electrode inner surfaces 412R and 412L each having a substantially concave shape. By using an electrode having a substantially concave shape, it is possible to deflect the ion beam B having a horizontally-elongated cross-sectional shape uniformly at the same angle. Also, the cross-sectional shape of the ion beam B as indicated by a dashed line schematically illustrates a shape in the vicinity of an inlet 402 of the scanning electrode device 400 illustrated in FIGS. 16A and 16B.

As illustrated in FIG. 16A, the scanning electrodes 410R and 410L have a folding-fan shape such that a distance between the right electrode inner surface 412R and the left electrode inner surface 412L increases toward a downstream direction. Therefore, it is possible to deflect the ion beam B, which is deflected to be close to one of the right scanning electrode 410R and the left scanning electrode 410L, uniformly at the same angle in the vicinity of an outlet 404 of the scanning electrode device 400.

The pair of beam transport correction electrodes 450A and 450B (hereinafter, also collectively referred to as a beam transport correction electrode 450) are provided to face each other in a vertical direction (y direction) with respect to the reference trajectory Z of the ion beam B. The beam transport correction electrode 450 is formed of a plate-shaped member having a thickness d in a horizontal direction (x direction). It is preferable that the thickness d of the beam transport correction electrode 450 is thick enough to have a strength to stand alone and is thin enough to limit an effect due to the beam transport correction electrode 450 to the vicinity of the reference trajectory Z. The reason for this is that the "zero field effect" which is intended to be suppressed by the beam transport correction electrode 450 occurs when the deflecting electric field becomes zero, and the ion beam travels along the reference trajectory Z. A positive bias voltage of about several kV to 20 kV is applied to the beam transport correction electrode 450, for example, a voltage of about +10 kV is applied to the beam transport correction electrode 450.

Each of the beam transport correction electrodes 450A and 450B includes a straight portion 452 extending from the inlet 402 of the scanning electrode device 400 to the outlet 404, and a beam transport correction inlet electrode body 454 protruding from the straight portion 452 toward the reference trajectory Z in a vertical direction. The straight portion 452 mainly has a function of suppressing occurrence of the zero field effect with respect to the entire scanning electrode device 400. On the other hand, the beam transport correction inlet electrode body 454 mainly has a function of allowing ion beams passing through the vicinity of the reference trajectory Z to vertically converge substantially at the inlet 402 of the scanning electrode device 400.

The beam transport correction inlet electrode body 454 is provided in the vicinity of the inlet 402 of the scanning electrode device 400. As illustrated in FIG. 16B, the beam transport correction inlet electrode body 454 is provided such that a length $L_b$ in a z direction is equal to or smaller than one third of a total length $L_a$ of the beam transport correction electrode 450 including the straight portion 452. It is preferable that the length $L_b$ of the beam transport correction inlet electrode body 454 is in a range from about one fourth to about one fifth of the total length $L_a$ of the beam transport correction electrode 450. Accordingly, it is possible to limit the effect of the vertical focusing by the beam transport correction inlet electrode body 454 to the vicinity of the inlet 402 of the scanning electrode device 400. Also, by thinning the thickness d of the beam transport correction inlet electrode body 454, the effect of the vertical focusing is limited to ions passing through the vicinity of the reference trajectory Z, and influence on the ions passing through the outer side than the reference trajectory Z is suppressed.

As illustrated in FIG. 17, the beam transport correction inlet electrode body 454 is provided such that an end 454a is adjacent to the ion beam B. In this case, a distance $h_0$ between the reference trajectory Z and the end 454a needs to be adjusted to a distance enough to reduce influence on a deflecting electric field generated by the scanning electrode 410 and, at the same time, to allow influence due to the beam transport correction inlet electrode body 454 to act on the vicinity of the reference trajectory Z. It is preferable that the distance $h_0$ between the reference trajectory Z and the end 454a is about several times a diameter $D_y$ in a vertical direction of the ion beam B, for example, the distance $h_0$ may be in a range from about three times to about four times the diameter $D_y$.

Returning to FIGS. 16A and 16B, the upstream electrode device 300 will be described below.

Electrodes that constitute the upstream electrode device 300 are arranged in the order of the first upstream reference voltage electrode 310, the upstream intermediate electrode 330, and the second upstream reference voltage electrode 350 from the inlet 402 of the scanning electrode device 400 toward an upstream direction.

Figure 18A:
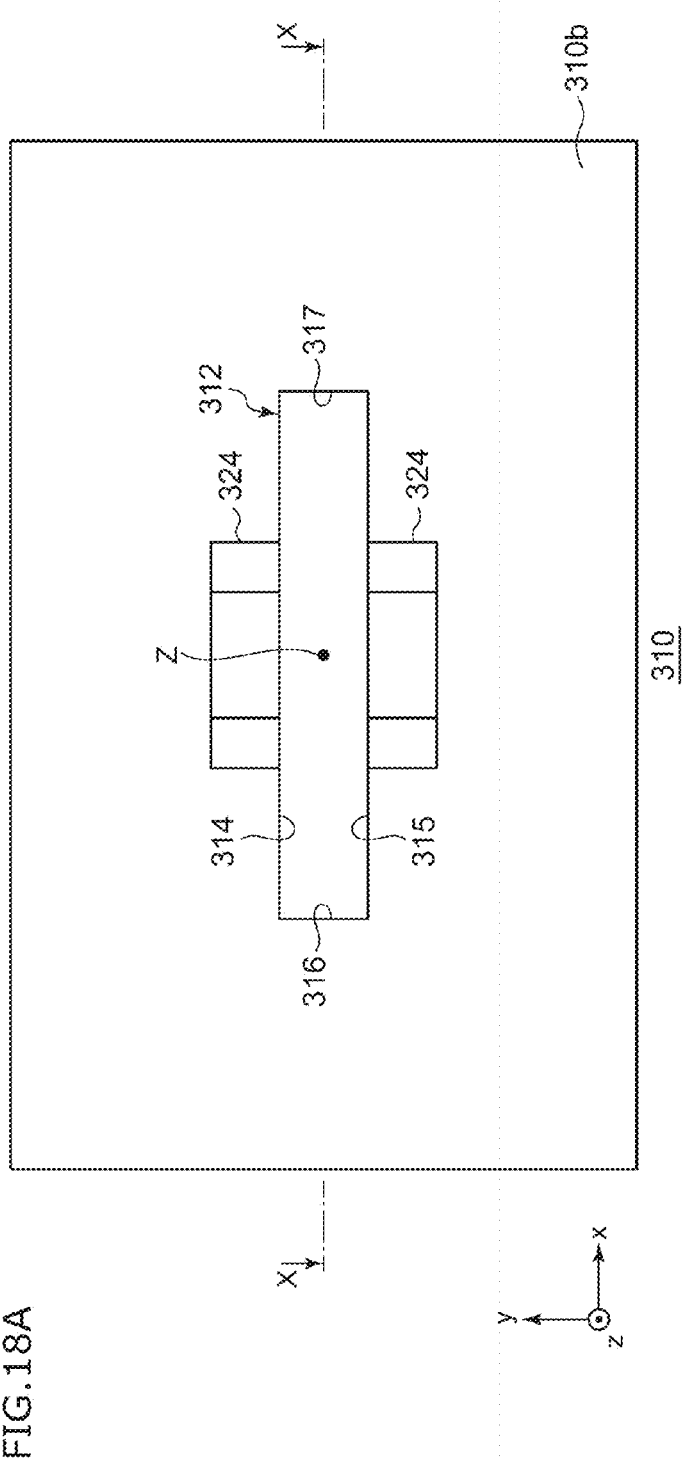
FIGS. 18A and 18B are diagrams schematically illustrating a shape of a first upstream reference voltage electrode.

The first upstream reference voltage electrode 310, the upstream intermediate electrode 330, and the second upstream reference voltage electrode 350 respectively include openings 312, 332, and 352 for ion beam passage. The ion beam B incident into the upstream electrode device 300 has a horizontally-elongated flat shape, and the openings 312, 332 and 352 of the electrodes constituting the upstream electrode device 300 have a horizontally-elongated rectangular cross-sectional shape. For example, the shape of the opening 312 of the first upstream reference voltage electrode 310 is illustrated in FIG. 18A which will be described below.

The first upstream reference voltage electrode 310 and the second upstream reference voltage electrode 350 generally have a ground potential. Therefore, the first upstream reference voltage electrode 310 and the second upstream reference voltage electrode 350 can be also referred to as a first upstream ground electrode and a second upstream ground electrode. Also, instead of the ground potential, other potential being a reference voltage may be applied to the first upstream reference voltage electrode 310 and the second upstream reference voltage electrode 350.

A high negative voltage is applied to the upstream intermediate electrode 330 disposed between the first upstream reference voltage electrode 310 and the second upstream reference voltage electrode 350. Therefore, the upstream intermediate electrode 330 functions as a suppression electrode that suppresses intrusion of electrons into the scanning electrode device 400. Also, by providing reference voltage electrodes both upstream and downstream of the upstream intermediate electrode 330, an electron shielding effect due to the suppression electrode is enhanced. Therefore, the upstream electrode device 300 can be referred to as a suppression electrode device having electron suppression action with respect to the ion beam incident on the scanning electrode device 400.

As another embodiment, a voltage higher than a voltage needed as the suppression voltage can be applied to the upstream intermediate electrode 330. For example, a negative voltage of tens of kV is applied to the upstream intermediate electrode 330. For example, a voltage of about −30 kV to about −50 kV is applied to the upstream intermediate electrode 330. Therefore, the upstream electrode device 300 functions as an einzel lens. Thus, the upstream intermediate electrode 330 can be also referred to as an einzel lens electrode. Accordingly, the upstream electrode device 300 allows an ion beam passing through the upstream electrode device 300 to converge in a vertical direction and/or a horizontal direction, and shapes the ion beam B incident into the scanning electrode device 400. As a result, the upstream electrode device 300 is configured as an electrode lens that has function of shaping or adjusting a profile of the ion beam incident into the scanning electrode device 400.

An upstream surface 330a of the upstream intermediate electrode 330 has an arcuate shape to have a convex curved surface. Also, a downstream surface 350b of the second upstream reference voltage electrode 350 has an arcuate shape to have a concave curved surface corresponding to the upstream surface 330a of the upstream intermediate electrode 330. Therefore, an ion beam passing through the upstream electrode device 300 converges in a horizontal direction. Also, the upstream electrode device 300 may have a shape such that the ion beam passing through the upstream electrode device 300 converges in a vertical direction, or may have a shape such that the ion beam converges in both a horizontal direction and a vertical direction.

Figure 18B:
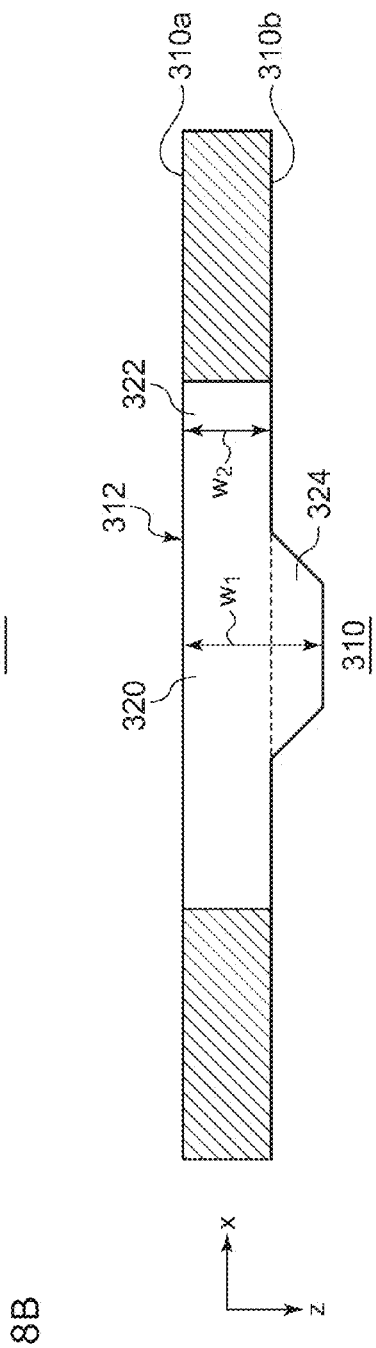

FIGS. 18A and 18B are diagrams schematically illustrating a shape of the first upstream reference voltage electrode 310. FIG. 18A illustrates an appearance of the downstream surface 310b of the first upstream reference voltage electrode 310, and FIG. 18B illustrates a cross-section taken along line X-X of FIG. 18A. As illustrated, the opening 312 of the first upstream reference voltage electrode 310 has a horizontally-elongated rectangular shape. The opening 312 is surrounded by four sides of an upper side 314, a lower side 315, a right side 316, and a left side 317.

The first upstream reference voltage electrode 310 has a pair of aberration correctors 324 protruding from the downstream surface 310b toward the scanning electrode device 400. The pair of aberration correctors 324 are provided on upside and downside of the opening 312 with the opening 312 interposed therebetween in a vertical direction. The aberration correctors 324 have, for example, a shape such that sides facing each other in a vertical direction with the opening 312 interposed therebetween form a triangle shape or a trapezoidal shape.

By providing the aberration correctors 324, the upper side 314 and the lower side 315 of the opening 312 has a shape such that a central portion 320 thereof protrudes toward the scanning electrode device 400. As a result, in the upper side 314 and the lower side 315 of the first upstream reference voltage electrode 310, a thickness $w_1$ of the central portion 320 in a z direction is larger than a thickness $w_2$ of a circumjacent portion 322. Also, the central portion 320 is a position corresponding to the reference trajectory Z, and the circumjacent portion 322 is a position located away from the central portion 320 in a horizontal direction, and a position close to the right side 316 or the left side 317.

The aberration corrector 324 partially shields a deflecting electric field generated by the scanning electrode device 400, and reduces aberration occurring due to provision of the beam transport correction electrode 450 having the beam transport correction inlet electrode body 454. Hereinafter, by referring to a first upstream reference voltage electrode and a scanning electrode device according to a comparative example, effects due to provision of the aberration corrector 324 to the first upstream reference voltage electrode 310 will be represented along with effects of the beam transport correction electrode 450 having the beam transport correction inlet electrode body 454.

FIGS. 19A and 19B are diagrams schematically illustrating trajectories of ion beams passing through a first upstream reference voltage electrode 1310 and a scanning electrode device 1400 according to the comparative example. The first upstream reference voltage electrode 1310 according to the comparative example does not include the aberration corrector 324, and has an opening shape such that thicknesses of a central portion and a circumjacent portion in a z direction along a trajectory of an ion beam are the same as each other. Also, the scanning electrode device 1400 according to the comparative example is provided with a beam transport correction electrode 1450 including no beam transport correction inlet electrode body protruding toward a beam trajectory.

FIGS. 19A and 19B illustrate trajectories in a case in which a current value of a transported ion beam is relatively low, and a state in which a transported ion beam is hard to divergence due to a negligible space charge effect. Therefore, the trajectories of the transported ion beams substantially trace the trajectories intended in the design. Both when an ion beam passing along the reference trajectory, and even when an ion beam passing outside of the reference trajectory, the ion beams are deflected at the substantially same angle due to the deflecting electric field applied by the scanning electrode. Therefore, as illustrated in FIG. 19A, ion beams passing along the central trajectory F1 and ion beams passing along the left outer trajectory E1 and the right outer trajectory G1 with respect to the central trajectory F1 are deflected at the substantially same angle. Also, as illustrated in FIG. 19B, ion beams passing along the upper outer trajectory J1 and the lower outer trajectory K1 with respect to the central trajectory are transported while hardly diverging in a vertical direction at all, due to the negligible space charge effect.

Here, the "space charge effect" means to a phenomenon in which, with respect to an ion beam including many ions with positive charge, a diameter of the ion beam is expanded in a horizontal direction, in a vertical direction, or in both directions due to a repulsive force acting between adjacent ions. In a case in which a current value of an ion beam is low, since a spatial charge density of ions included in the ion beam is also low and a distance between adjacent ions is spaced apart from each other, the repulsive force hardly occurs. On the other hand, in a case in which a current value of an ion beam is high, since a spatial charge density of ions included in the ion beam is also high and adjacent ions is close to each other, a relatively strong repulsive force occurs, which is resulted in a state in which a beam diameter is likely to be easily expanded. Therefore, in order to appropriately transport a high current ion beam, there is a need to design a beamline in consideration of the space charge effect.

A beam trajectory in a case in which a current value of a transported ion beam is relatively high will be described below. In this case, it is assumed that trajectories E1, F1, G1, J1 and K1 of an ion beam illustrated in FIGS. 19A and 19B are designed trajectories being references. The designed trajectories may be trajectories for which influence of the space charge effect that needs to be taken into account in the case of transport of a high current ion beam is compensated, and may be ideal trajectories which correspond to a target in transport of a high current beam.

FIGS. 20A and 20B are diagrams schematically illustrating trajectories of ion beams passing through the first upstream reference voltage electrode 1310 and the scanning electrode device 1400 according to the comparative example. In the present drawings, there are illustrated trajectories in a case in which a current value of a transported ion beam is relatively high in the same device configuration as FIGS. 19A and 19B, and in a state in which the beam diverges due to the space charge effect in both a horizontal direction and a vertical direction.

As illustrated in FIG. 20A, an ion beam passing along a central trajectory F2 passes along a trajectory substantially identical to the designed trajectory F1 whereas ion beams passing along a right outer trajectory E2 and a left outer trajectory G2 pass along trajectories slightly deviated to outside from the designed trajectories E1 and G1. Also, as illustrated FIG. 20B, ion beams passing along an upper outer trajectory J2 and a lower outer trajectory K2 greatly diverge in a vertical direction with respect to designed trajectories J1 and K1. An ion beam incident into the scanning electrode device 1400 strongly converges in a vertical direction and has a beam cross-sectional shape which is expanded in a horizontal direction, based on which it is considered that the space charge effect acts strongly in a vertical direction.

When a diameter of the beam emitted from the scanning electrode device 1400 is expanded greatly in a vertical direction as described above, this affects devices downstream from the scanning electrode device 1400. For example, when it is tried to transport an ion beam having a wide beam diameter as it is, there is a need to expand openings for ion beam passage which are provided in various electrodes, resulting in a requirement to increase a size of electrodes disposed downstream. Also, when the electrodes are sized up, capacities of power supplies that apply high voltage to electrodes need to be increased. This results in an increase in the size of the entire apparatus and therefore, a cost for the apparatus increases.

Therefore, according to the present embodiment, the beam transport correction inlet electrode body 454 protruding toward a reference trajectory is provided in the beam transport correction electrode 450, thereby causing an ion beam to converge in a vertical direction in the vicinity of the inlet of the scanning electrode device 400. FIGS. 21A and 21B are diagrams schematically illustrating trajectories of ion beams passing through a first upstream reference voltage electrode 1310 and a scanning electrode device 400 according to an embodiment of the present invention. The first upstream reference voltage electrode 1310 has the same configuration as the above-described comparative example, but the scanning electrode device 400 is different from that of the comparative example in that the beam transport correction electrode 450 has the beam transport correction inlet electrode body 454.

As illustrated in FIG. 21B, by providing the beam transport correction inlet electrode body 454, it is possible to cause a beam to converge in a vertical direction in the inlet 402 of the scanning electrode device 400. Therefore, in the present embodiment, ion beams passing along the upper outer and lower outer trajectories J3 and K3 is suppressed so as not to diverge in a vertical direction, compared to the trajectories J2 and K2 according to the comparative example. Thus, it is possible to prevent influence due to the phenomenon that the ion beam emitted from the scanning electrode device 400 is expanded in a vertical direction.

On the other hand, as illustrated in FIG. 21A, an ion beam passing along a central trajectory F3 which is close to the beam transport correction inlet electrode body 454 is deviated from the designed trajectory F1 due to influence of the beam transport correction inlet electrode body 454. The reason for this is that, due to presence of the beam transport correction inlet electrode body 454, distortion occurs in a deflecting electric field near the beam transport correction inlet electrode body 454, and an ion passing along a trajectory is relatively strongly deflected as the trajectory is closer to the beam transport correction inlet electrode body 454. As a result, aberration occurs in the vicinity of the reference trajectory of an ion beam and a beam quality of an ion beam passing through the scanning electrode device 400 is degraded.

Figure 22A:
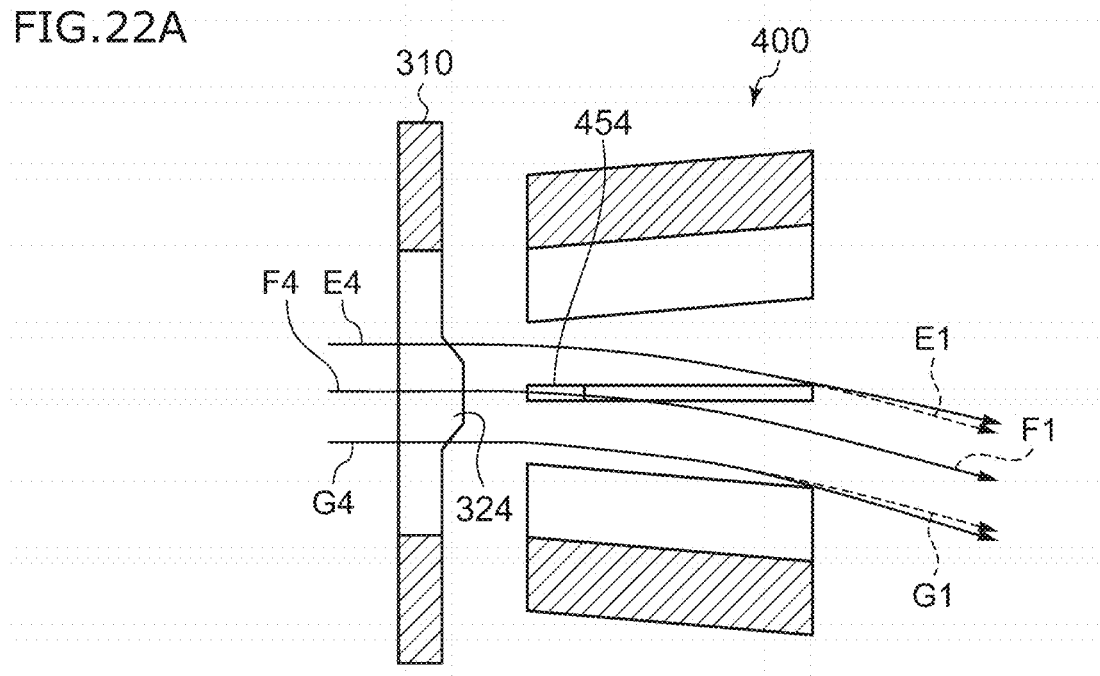
FIGS. 22A and 22B are diagrams schematically illustrating trajectories of ion beams passing through a first upstream reference voltage electrode and a scanning electrode device according to an embodiment of the present invention.
Figure 22B:
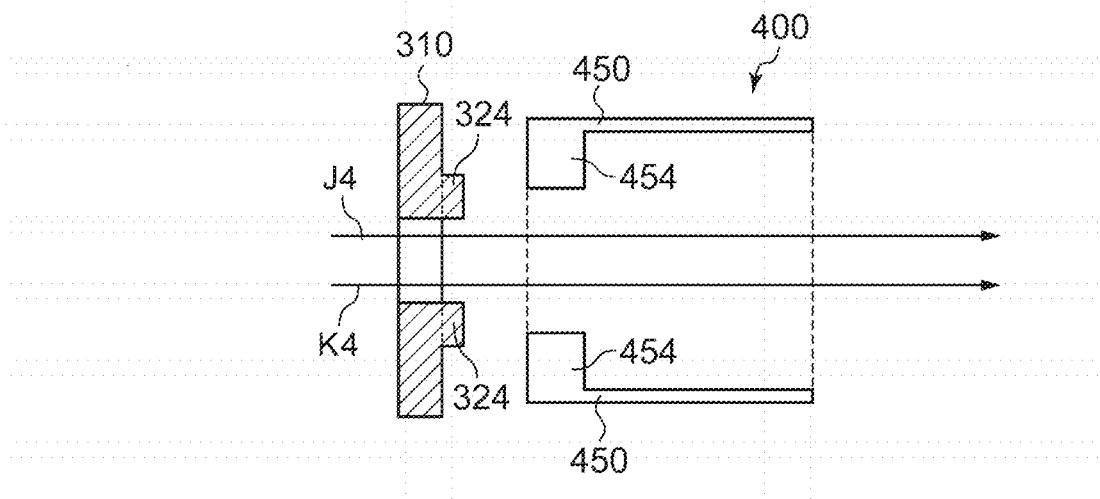

In the present embodiment, by providing the aberration corrector 324 in the central portion 320 of the first upstream reference voltage electrode 310, the influence of aberration occurring in the vicinity of a reference trajectory of an ion beam is suppressed. FIGS. 22A and 22B are diagrams schematically illustrating trajectories of ion beams passing through a first upstream reference voltage electrode 310 and a scanning electrode device 400 according to an embodiment of the present invention. As illustrated, the aberration corrector 324 is provided to protrude toward the beam transport correction inlet electrode body 454. The aberration corrector 324 has an effect that partially shields a deflecting electric field generated by the scanning electrode device 400 in the vicinity of the aberration corrector 324. As a result, with respect to an ion beam passing along the central trajectory F4, a deflecting electric field is partially shielded by the aberration corrector 324 and a substantial distance over which the deflecting electric field acts is shortened. Therefore, influence is suppressed, in which an ion passing along a trajectory is relatively strongly deflected as the ion is closer to the beam transport correction inlet electrode body 454. Thus, by providing the aberration corrector 324, it is possible to suppress the influence of aberration occurring in the vicinity of a reference trajectory of an ion beam and improve a beam quality. The upstream electrode device 300 may be configured as an electrode lens that has function of shaping or adjusting a profile of the ion beam incident on the scanning electrode device 400, in conjunction with the beam transport correction electrode 450.

Figure 23A:
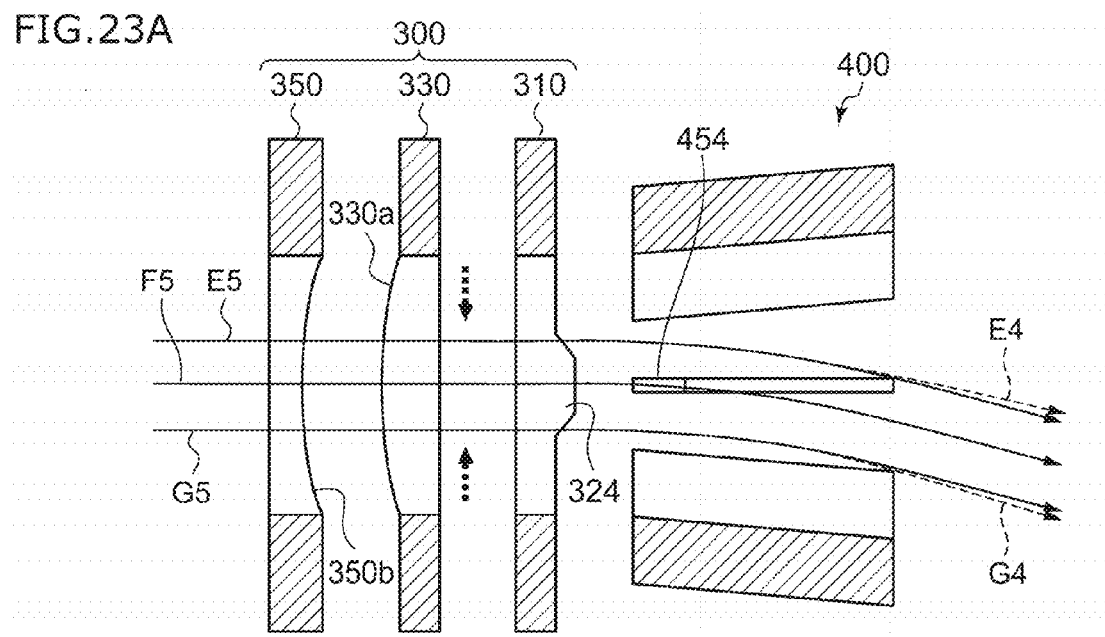
FIGS. 23A and 23B are diagrams schematically illustrating trajectories of ion beams passing through a first upstream reference voltage electrode and a scanning electrode device according to an embodiment of the present invention.
Figure 23B:
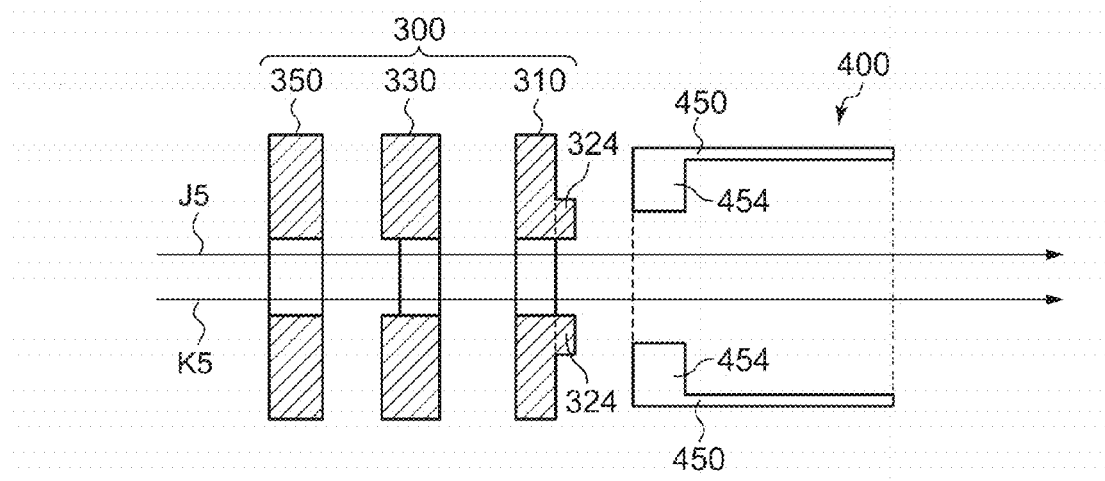

FIGS. 23A and 23B are diagrams schematically illustrating trajectories of ion beams passing through an upstream electrode device 300 and a scanning electrode device 400 according to an embodiment of the present invention. The present drawings illustrate a configuration in which the upstream intermediate electrode 330 and the second upstream reference voltage electrode 350 are added upstream of the first upstream reference voltage electrode 310. As described above, by applying a high voltage higher than the suppression voltage to the upstream intermediate electrode 330, the upstream electrode device 300 functions as an einzel lens. That is, the upstream electrode device 300 allows an ion beam to converge in a horizontal direction before allowing the ion beam to be incident into the scanning electrode device 400. As illustrated in FIG. 23A, this allows ion beams passing along trajectories E5 and G5 on the right outside and the left outside of a center trajectory to converge in a horizontal direction, compared to the trajectories E4 and G4 with no einzel lens.

FIGS. 24A and 24B are diagrams schematically illustrating a shape of a beam transport correction electrode 450 according to a modification. In the above-described embodiment, the beam transport correction electrode 450 includes the straight portion 452 extending from the inlet 402 of the scanning electrode device 400 to the outlet 404. As illustrated in FIG. 24A, in the beam transport correction electrode 450 according to one modification, a length of the straight portion 452 may be shortened and the beam transport correction electrode 450 may be provided only upstream of the scanning electrode device 400. Also, as illustrated in FIG. 24B, in the beam transport correction electrode 450 according to another modification, the straight portion 452 may not be provided, and the beam transport correction electrode 450 may be configured by only the beam transport correction inlet electrode body 454 disposed near the inlet 402 of the scanning electrode device 400. According to the modifications, it is also possible to allow an ion beam to converge in a vertical direction in the vicinity of the inlet 402 of the scanning electrode device 400 and, at the same time, obtain an effect that suppresses occurrence of the zero field effect, like the above-described embodiment.

Figure 25:
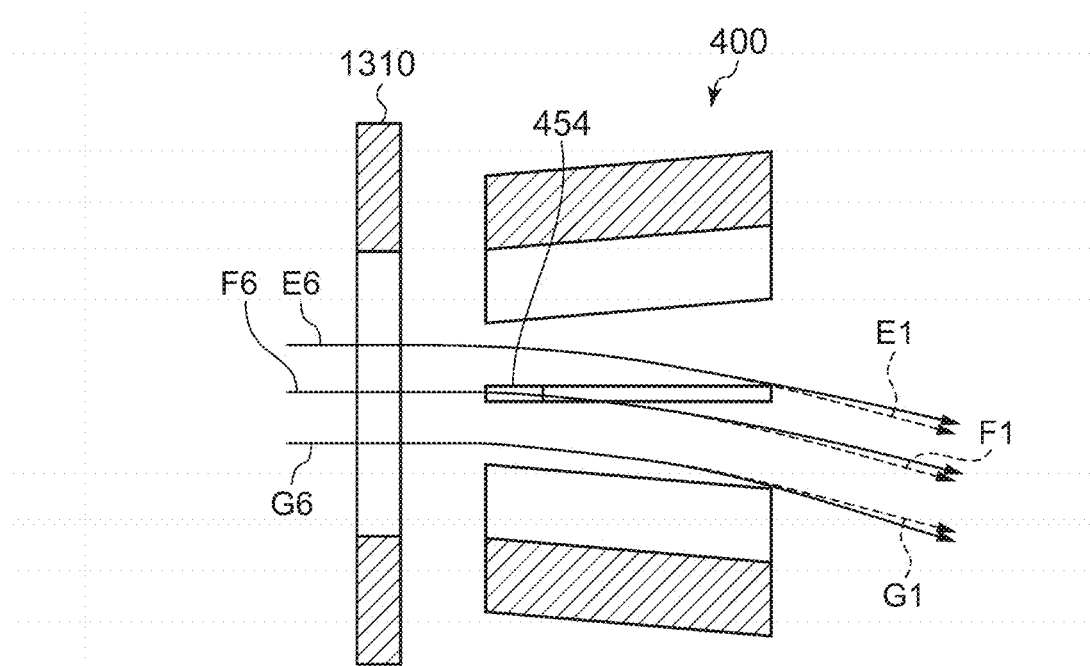
FIG. 25 is a diagram schematically illustrating trajectories of ion beams passing through a first upstream reference voltage electrode and a scanning electrode device according to a modification.

FIG. 25 is a diagram schematically illustrating trajectories of ion beams passing through the first upstream reference voltage electrode 1310 and the scanning electrode device 400 according to another modification. In the above-described embodiment, as illustrated in FIG. 21A, there has been described a case in which an ion beam passing along the central trajectory F3 close to the beam transport correction inlet electrode body 454 is strongly deflected by the influence of the beam transport correction inlet electrode body 454. On the other hand, in the present modification, there is provided a case in which an ion beam passing along a central trajectory F6 close to the beam transport correction inlet electrode body 454 is relatively weakly deflected by the influence of the beam transport correction inlet electrode body 454. Depending on a shape or arrangement of the beam transport correction inlet electrode body 454 as illustrated, a deflection strength may be weakened in the vicinity of the reference trajectory, caused by a distribution of a deflecting electric field is disturbed due to presence of the beam transport correction inlet electrode body 454. Even in this case, since aberration occurs in the vicinity of the reference trajectory of an ion beam, a beam quality of an ion beam passing through the scanning electrode device 400 is degraded.

Figure 26:
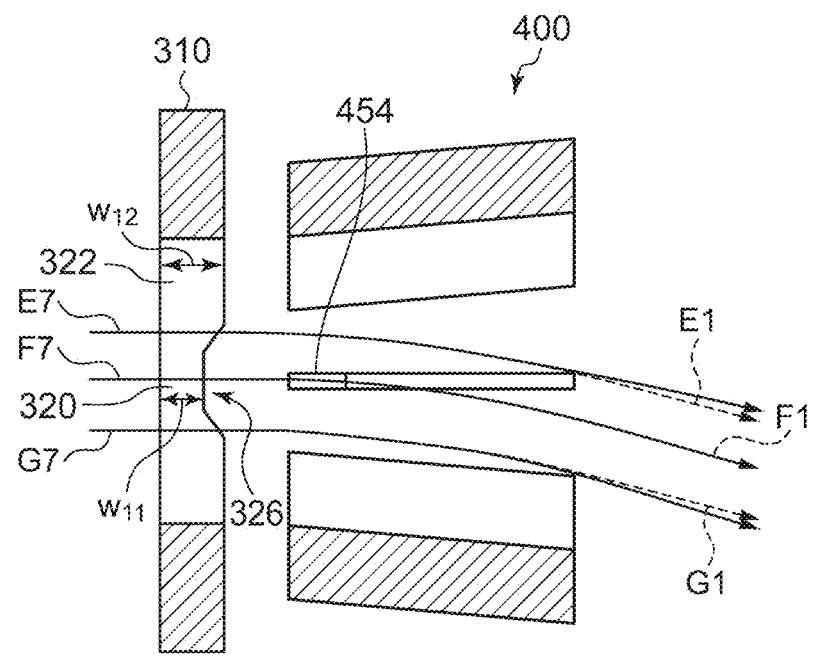
FIG. 26 is a diagram schematically illustrating trajectories of ion beams passing through a first upstream reference voltage electrode and a scanning electrode device according to a modification.

In the present embodiment, by providing the aberration corrector 326 having a concave shape in the central portion 320 of the first upstream reference voltage electrode 310, the influence of aberration occurring in the vicinity of a reference trajectory of an ion beam is suppressed. FIG. 26 is a diagram schematically illustrating trajectories of ion beams passing through the first upstream reference voltage electrode 310 and the scanning electrode device 400 according to a modification. As illustrated, the aberration corrector 326 is provided such that the central portion 320 is recessed with respect to the beam transport correction inlet electrode body 454, and includes a shape such that the downstream surface 310b is concave with respect to the scanning electrode device 400. In other words, an opening shape is formed such that a thickness $w_{11}$ of the central portion 320 of the first upstream reference voltage electrode 310 in a z direction is smaller than a thickness $w_{12}$ of the circumjacent portion 322 in a z direction.

The aberration corrector 326 has an effect that expands an area over which a deflecting electric field generated by the scanning electrode device 400 acts, and with respect to the ion beam passing along the central trajectory F7, a distance over which the deflecting electric field acts becomes longer. Therefore, influence is suppressed, in which an ion passing along a trajectory is relatively weakly deflected as the ion is closer to the beam transport correction inlet electrode body 454. Thus, according to the present modification, by providing the aberration corrector 326 having a concave shape, it is possible to suppress the influence of aberration occurring in the vicinity of a reference trajectory of an ion beam and improve a beam quality.

Also, the first upstream reference voltage electrode 310 with the aberration correctors 324 and 326 may be used for other purposes in addition a purpose to reduce the influence of aberration occurring due to the beam transport correction inlet electrode body 454 of the beam transport correction electrode 450. For example, even in a case in which the beam transport correction inlet electrode body 454 is not provided in the vicinity of the inlet 402 of the scanning electrode device 400, when aberration occurs in an ion beam passing along the vicinity of a reference trajectory, the aberration corrector 324 or 326 may be provided for the purpose of reducing the influence of the aberration. For example, in a case in which a deflection amount of an ion beam incident into the scanning electrode device 400 along the reference trajectory is relatively large, the aberration corrector 324 having a convex shape may be provided in the first upstream reference voltage electrode 310. On the other hand, in a case in which a deflection amount of an ion beam incident into the scanning electrode device 400 along the reference trajectory is relatively small, the aberration corrector 326 having a concave shape may be provided in the first upstream reference voltage electrode 310. Also, since the amount of aberration which is corrected by the aberration corrector 324 or 326 can be adjusted by shapes of aberration corrector 324 or 326, shapes of aberration corrector 324 or 326 may be determined depending on a correction amount as required.

Next, returning to FIGS. 16A and 16B, the downstream electrode device 500 will be described below. Electrodes that constituting the downstream electrode device 500 are arranged in the order of a first downstream reference voltage electrode 510, a first downstream intermediate electrode 530, a second downstream reference voltage electrode 550, a second downstream intermediate electrode 570, and a third downstream reference voltage electrode 590 from the outlet 404 of the scanning electrode device 400 toward a downstream direction.

The first downstream reference voltage electrode 510, the first downstream intermediate electrode 530, the second downstream reference voltage electrode 550, the second downstream intermediate electrode 570, and the third downstream reference voltage electrode 590 respectively include openings 512, 532, 552, 572 and 592 for ion beam passage. In the downstream electrode device 500, since an ion beam emitted from the scanning electrode device 400 is scanned by the scanning electrode device 400 in a horizontal direction, the openings 512, 532, 552, 572 and 592 of the electrodes have a horizontally-elongated shape.

In each of the electrodes constituting the downstream electrode device 500, the opening is formed such that an opening width thereof in a horizontal direction is expanded wide as the electrode disposed downstream. For example, an opening width $w_4$ of the first downstream intermediate electrode 530 in a horizontal direction is larger than an opening width $w_3$ of the first downstream reference voltage electrode 510 in a horizontal direction. In addition, an opening width $w_5$ of the second downstream reference voltage electrode 550 in a horizontal direction is larger than an opening width $w_4$ of the first downstream intermediate electrode 530 in a horizontal direction.

Figure 27:
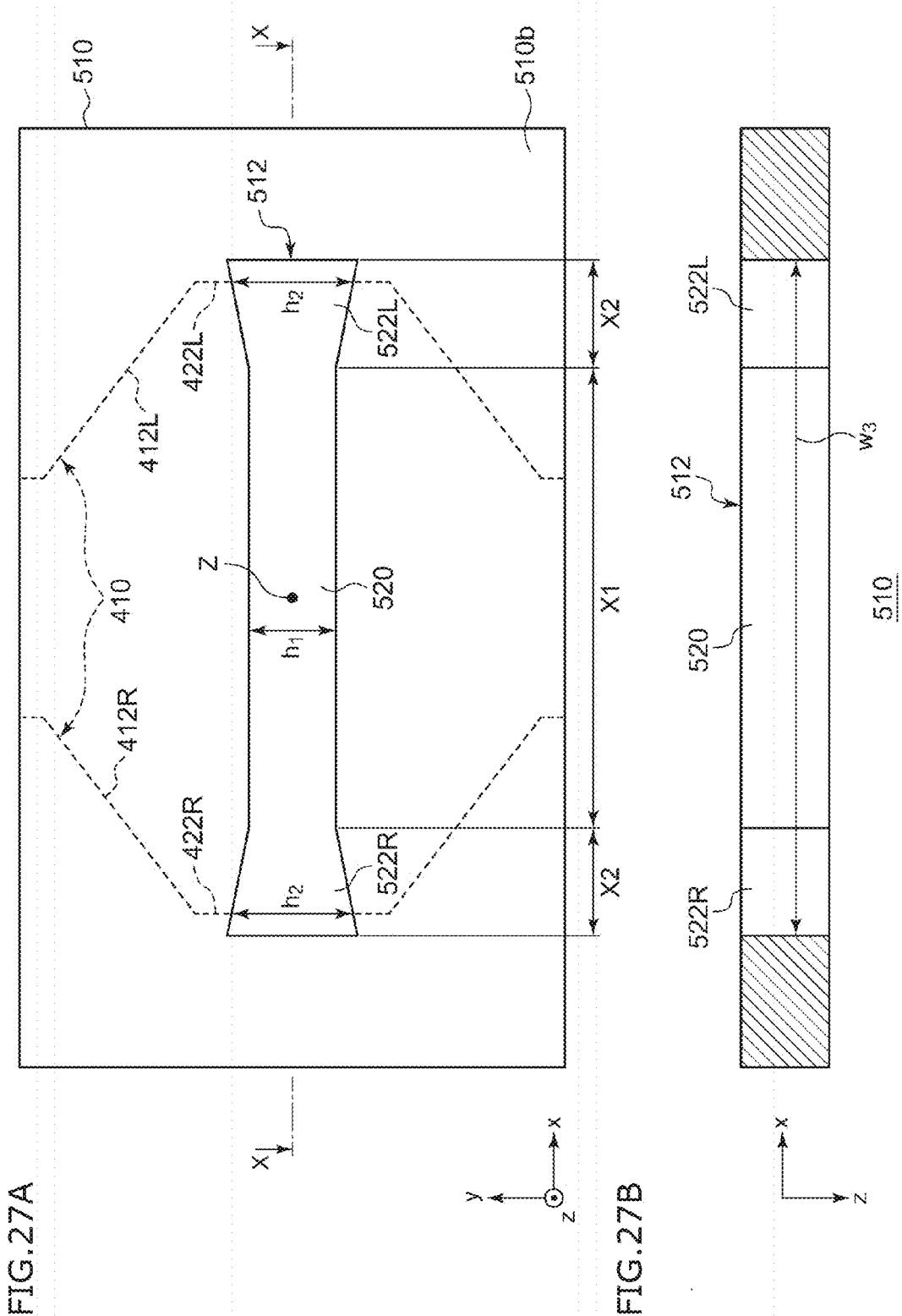
FIGS. 27A and 27B are diagrams schematically illustrating a shape of a first downstream reference voltage electrode.

Except for the opening 512 of the first downstream reference voltage electrode 510, the openings 532, 552, 572 and 592 have a horizontally-elongated rectangular cross-sectional shape. On the other hand, the opening 512 of the first downstream reference voltage electrode 510 has, as illustrated in FIG. 27A (described below), a cross-sectional shape of which opening widths of right and left ends are expanded in a vertical direction (y direction).

The first downstream reference voltage electrode 510, the second downstream reference voltage electrode 550, and the third downstream reference voltage electrode 590 generally have a ground potential. Therefore, the first downstream reference voltage electrode 510, the second downstream reference voltage electrode 550, and the third downstream reference voltage electrode 590 can also be referred to as a first downstream ground electrode, a second downstream ground electrode, and a third downstream ground electrode, respectively. Also, instead of the ground potential, other potential being a reference voltage may be applied to each of the first downstream reference voltage electrode 510, the second downstream reference voltage electrode 550, and the third downstream reference voltage electrode 590.

A positive high voltage of tens of kV is applied to the first downstream intermediate electrode 530 disposed between the first downstream reference voltage electrode 510 and the second downstream reference voltage electrode 550, for example, a voltage of about +30 to about +50 kV is applied thereto. Therefore, the first downstream reference voltage electrode 510, the first downstream intermediate electrode 530, and the second downstream reference voltage electrode 550 function as an einzel lens. Thus, the first downstream intermediate electrode 530 may be also referred to as an einzel lens electrode. Therefore, the first downstream reference voltage electrode 510, the first downstream intermediate electrode 530, and the second downstream reference voltage electrode 550 allow an ion beam passing through the downstream electrode device 500 to converge in a vertical direction and/or a horizontal direction, and shapes the ion beam passing through the downstream electrode device 500. As a result, the downstream electrode device 500 is configured as an electrode lens that has function of shaping or adjusting a profile of the ion beam emitted from the scanning electrode device 400.

Also, a negative high voltage of about several kV is applied to the second downstream intermediate electrode 570 disposed between the second downstream reference voltage electrode 550 and the third downstream reference voltage electrode 590, for example, a voltage of about −1 kV to about −10 kV is applied thereto. Therefore, the second downstream intermediate electrode 570 functions as a suppression electrode that suppresses intrusion of electrons into the scanning electrode device 400. Also, by providing reference voltage electrodes both upstream and downstream of the second downstream intermediate electrode 570, an electron shielding effect due to the suppression electrode is enhanced. Therefore, the downstream electrode device 500 can also be referred to as a suppression electrode device having electron suppression function with respect to the ion beam emitted from the scanning electrode device 400.

FIGS. 27A and 27B are diagrams schematically illustrating a shape of the first downstream reference voltage electrode 510. FIG. 27A illustrates an appearance of a downstream surface 510b of a first downstream reference voltage electrode 510, in which a position of a scanning electrode 410 disposed upstream of the first downstream reference voltage electrode 510 is indicated by a dashed line. FIG. 27B illustrates X-X line cross section of FIG. 27A. As illustrated, an opening 512 of the first downstream reference voltage electrode 510 substantially has a horizontally-elongated rectangular shape, of which an opening width in a vertical direction is expanded in the vicinity of both right and left ends.

In the opening 512 of the first downstream reference voltage electrode 510, an opening width $h_2$ of circumjacent portions 522R and 522L in a vertical direction is larger than an opening width $h_1$ of a central portion 520 corresponding to a reference trajectory Z in a vertical direction. Also, while the opening width in a vertical direction in a central area X1 near the central portion 520 is uniform at $h_1$, and the opening width in a vertical direction in a circumjacent area X2 near the circumjacent regions 522R and 522L increases as closer to left and right ends. In this case, the circumjacent area X2 is a position facing a downstream end of the scanning electrode 410, that is a position facing downstream ends 422R and 422L of the electrode inner surfaces 412R and 412L of the scanning electrode 410.

Unlike in a position spaced apart from the electrode inner surfaces 412R and 412L at a certain distance, electric field distribution is distorted in the vicinity of the downstream ends 422R and 422L of the scanning electrode 410. The reason for this is that the electric field distribution is more disturbed in the vicinity of the ends of the electrodes, as compared to in the vicinity of a center of the electrode surface. Therefore, an ion beam passing through the vicinity of the downstream ends 422R and 422L of the scanning electrode 410 is affected by the distorted deflecting electric field, causing convergence in an unintended direction.

According to the present embodiment, in the circumjacent area X2 being a position facing the downstream ends 422R and 422L of the scanning electrode 410, the influence of the distorted deflecting electric field is reduced by expanding the opening width of the opening 512 of the first downstream reference voltage electrode 510 in a vertical direction.

Figure 28:
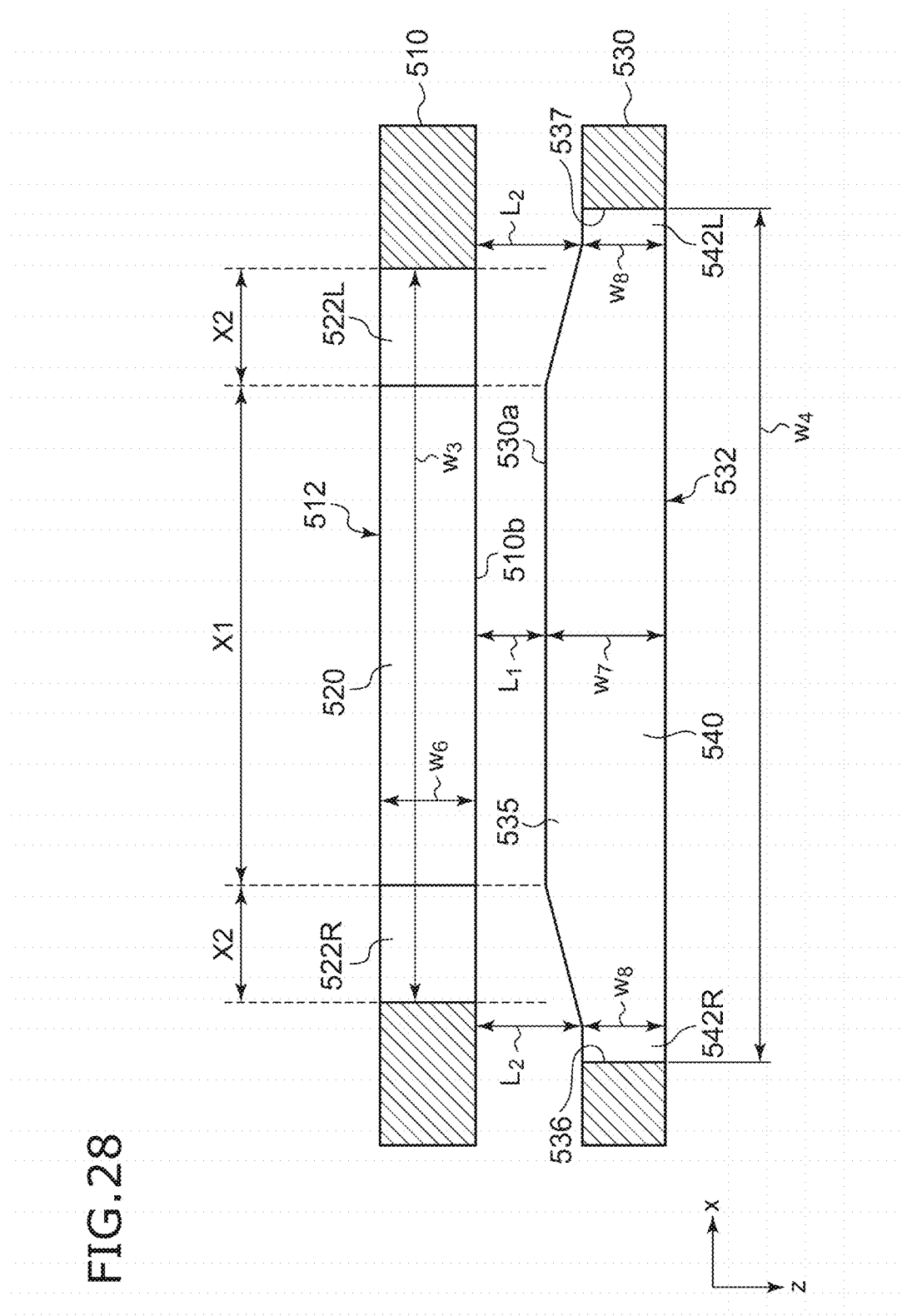
FIG. 28 is a diagram schematically illustrating a structure of a first downstream reference voltage electrode and a first downstream intermediate electrode.

FIG. 28 is a diagram schematically illustrating a configuration of a first downstream reference voltage electrode 510 and a first downstream intermediate electrode 530. The first downstream intermediate electrode 530 has an upstream surface 530a which is perpendicular to a reference trajectory Z and has a shape such that the upstream surface 530a protrudes toward the first downstream reference voltage electrode 510 in the vicinity of the central portion 540 at which the reference trajectory Z is disposed. Also, the first downstream intermediate electrode 530 has an upper side 534, a lower side 535, a right side 536, and a left side 537 which surround the opening 532, and has a shape such that the central portion 540 of the upper side 534 and lower side 535 protrude toward the first downstream reference voltage electrode 510. Therefore, in the first downstream intermediate electrode 530, a thickness of the opening 532 in a z direction along the reference trajectory Z, that is, a thickness $w_7$ of the central portion 540 is larger than a thickness $w_8$ of circumjacent portions 542R and 542L. Also, in the opening 532 of the first downstream intermediate electrode 530, the thickness $w_7$ in a z direction is uniform in the central area X1, and the thickness in a z direction gradually decreases in the circumjacent area X2, and, the thickness $w_8$ becomes smaller than that in the central area X1, outside the circumjacent area X2.

On the other hand, the downstream surface 510b of the first downstream reference voltage electrode 510 has a flat surface, while the downstream surface 510b is perpendicular to the reference trajectory Z. That is, in the opening 512 of the first downstream reference voltage electrode 510, a thickness $w_6$ in a z direction is uniform in both the central area X1 and the circumjacent area X2. Therefore, as to a distance between the downstream surface 510b of the first downstream reference voltage electrode 510 and the upstream surface 530a of the first downstream intermediate electrode 530, the distance $L_1$ is small in the central area X1, the distance is gradually expanded in the circumjacent area X2, and the distance $L_2$ becomes large outside the circumjacent area X2.

In the present embodiment, by making slope in a gap between the first downstream reference voltage electrode 510 and the first downstream intermediate electrode 530 in the circumjacent area X2, the influence of aberration is reduced, aberration occurring due to the fact that the opening width of the opening 512 of the first downstream reference voltage electrode 510 is expanded in a vertical direction in the circumjacent area X2. The downstream electrode device 500 may be configured as an electrode lens that corrects deflection aberration occurring in an ion beam emitted from the scanning electrode device 400. In particular, the downstream electrode device 500 may correct deflection aberration occurring in an ion beam passing through the vicinity of the downstream ends 422 of the scanning electrode 410, from among all ion beams emitted from the scanning electrode device 400.

Hereinafter, effects caused by expanding the opening 512 of the first downstream reference voltage electrode 510 in a vertical direction in the circumjacent area X2 will be described while referring to the scanning electrode device, the first downstream reference voltage electrode and the first downstream intermediate electrode according to the comparative example. Subsequently, in the circumjacent area X2, an effect occurring due to the fact that slope is made in the gap between the first downstream reference voltage electrode 510 and the first downstream intermediate electrode 530 will be described.

Figure 29:
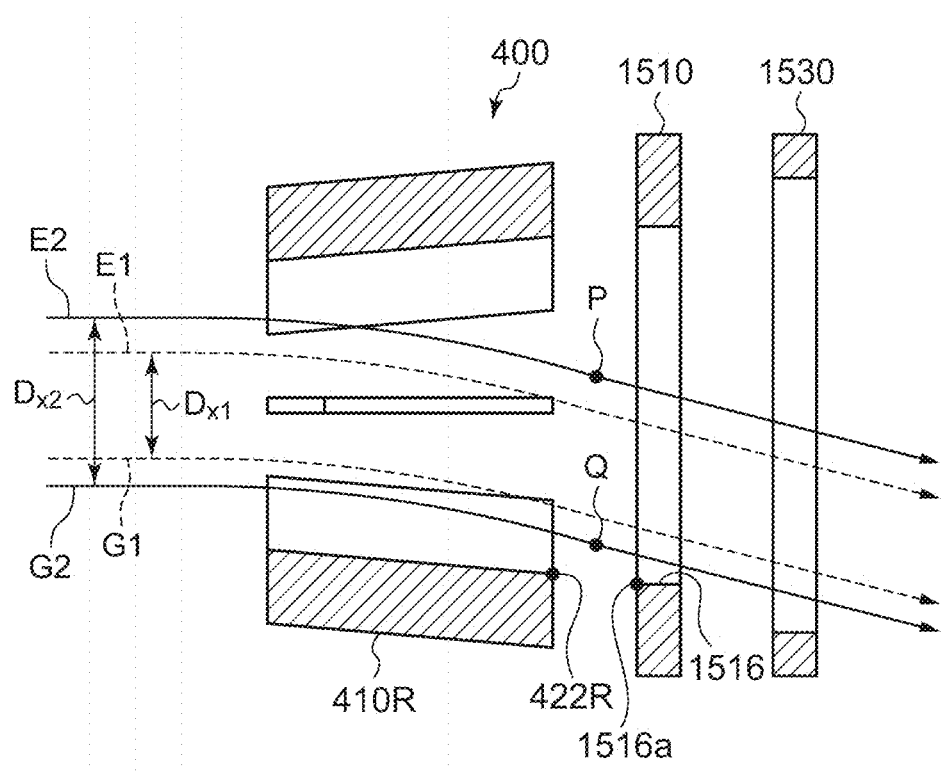
FIG. 29 is a diagram schematically illustrating trajectories of ion beams passing through a first downstream reference voltage electrode and a first downstream intermediate electrode according to the comparative example.
Figure 30:
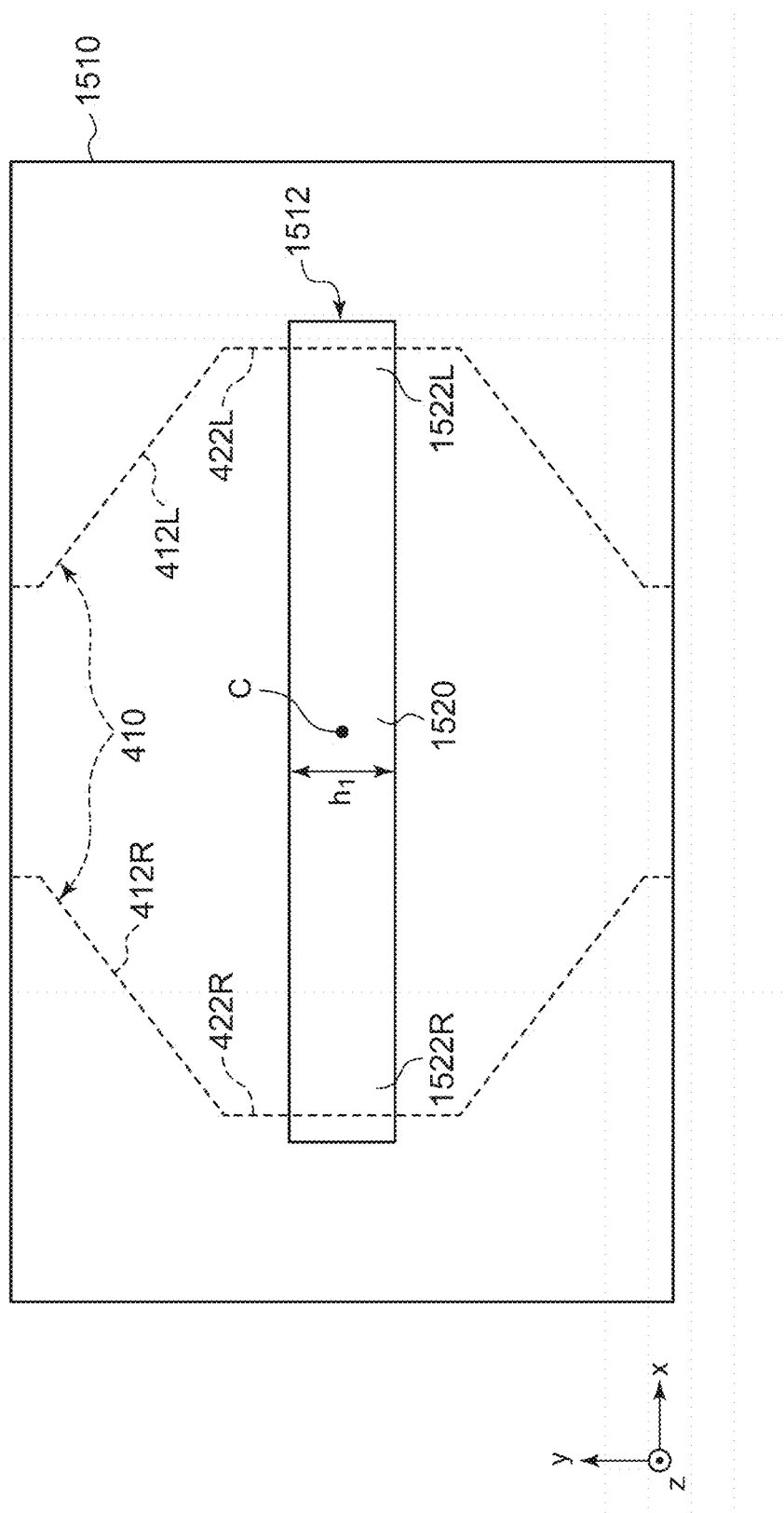
FIG. 30 is a diagram schematically illustrating a shape of a first downstream reference voltage electrode according to the comparative example.

FIG. 29 is a diagram schematically illustrating trajectories of ion beams passing through the scanning electrode device 400, the first downstream reference voltage electrode 1510, and the first downstream intermediate electrode 1530 according to the comparative example. FIG. 30 is a diagram schematically illustrating a shape of the first downstream reference voltage electrode 1510 according to the comparative example. As illustrated in FIG. 30, a shape of an opening 1512 of the first downstream reference voltage electrode 1510 according to the comparative example is a rectangular shape, in which an opening width $h_1$ in a vertical direction is uniform at a central portion 1520 and circumjacent portions 1522R and 1522L. Also, as illustrated in FIG. 29, the central portion of the first downstream intermediate electrode 1530 according to the comparative example does not protrude toward the first downstream reference voltage electrode 1510, and a gap between the first downstream reference voltage electrode 1510 and the first downstream intermediate electrode 1530 is uniform.

In FIG. 29, ion beam trajectories E1 and G1 indicated by dashed lines represent a case in which a beam diameter $D_{x1}$ in a horizontal direction is small, and ion beam trajectories E2 and G2 indicated by solid lines represent a case in which a beam diameter $D_{x2}$ in a horizontal direction is large. In a case in which a current value of an ion beam is relatively low, since the influence of beam divergence due to the space charge effect is small, it is easy to transport an ion beam with a high beam quality, of which a cross-sectional ion distribution is uniform even in the case of reducing the beam diameter $D_{x1}$ as indicated by the dashed lines. However, in a case in which a current value of an ion beam is high, a beam easily diverges due to the space charge effect, and therefore, it is difficult to transport an ion beam with the beam diameter $D_{x1}$ that is small as indicated by the dashed lines. Therefore, it is required to adjust the beam diameter $D_{x2}$ that is large as indicated by the solid lines in order to transport a high current ion beam.

When it is tried to transport an ion beam having the large beam diameter $D_{x2}$ with using a device designed to transport an ion beam having the small beam diameter $D_{x1}$, an ion passing through the outer side of a beam trajectory is brought close to openings end of electrodes. Since the electric field distributions in the vicinities of the opening ends of the electrodes are more disturbed, as compared to a center of the opening, an ion beam passing through the vicinities of the opening ends may be deflected in an unintended direction, and/or converges in an unintended state. For example, in the case of deflecting an ion beam in a right direction, an ion beam passing along a right outer trajectory G2 passes through a point Q close to a downstream end 422R of a right scanning electrode 410R and an upstream end 1516a of a right side 1516 of the first downstream reference voltage electrode 1510. At the point Q, disturbance in electric field distribution is large and the ion beam easily converges in a vertical direction (y direction) as compared to a point P through which an ion beam passing along a left outer trajectory E2 passes.

Then, only an ion beam passing along the right outer trajectory G2 greatly converges in a vertical direction, and therefore, aberration occurs. Thereafter, a beam quality of a transported ion beam is degraded.

It may be considered that it is possible to prevent such a phenomenon from occurring by preventing an ion beam passing along an outer trajectory from passing through the vicinities of the openings of the electrodes. However, it is required to enlarge the openings for ion beam passage which are provided in various electrodes in order to prevent an ion beam from passing through the vicinities of the opening edges of the electrodes, causing a requirement to increase sizes of electrodes disposed downstream. In addition, when the electrodes are increased in size, capacities of a power supplies that apply a high voltages to electrodes also need to be increased. This results in an increase in the size of the entire apparatus and therefore, a cost for the apparatus increases.

Figure 31:
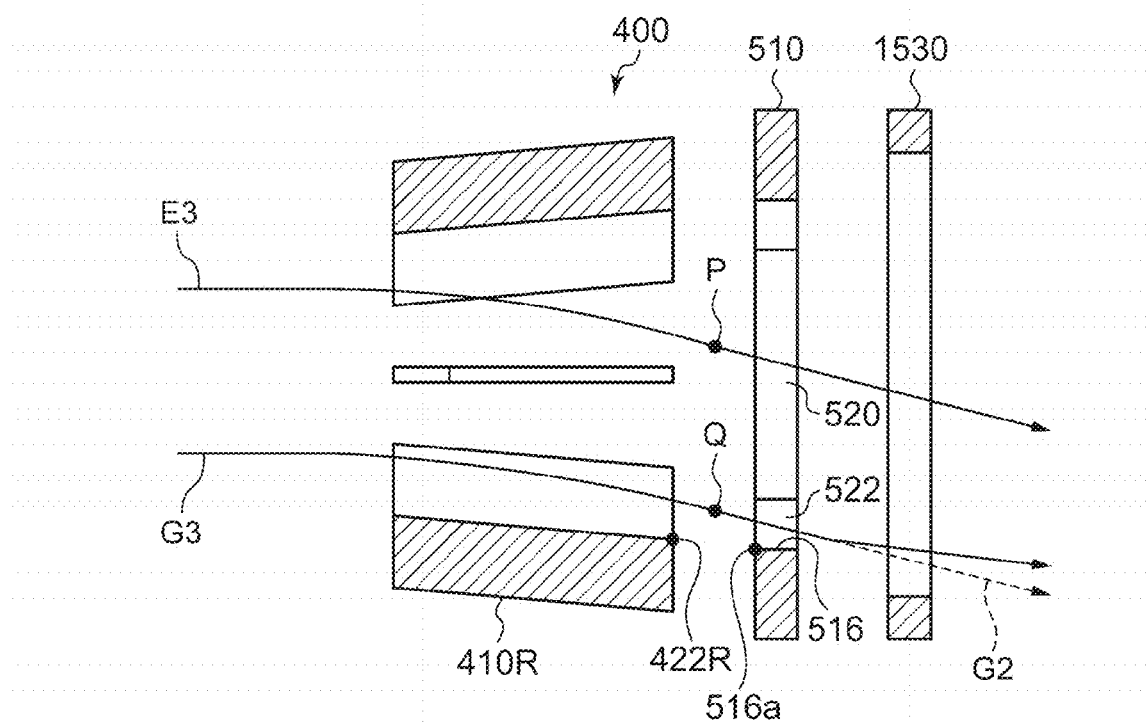
FIG. 31 is a diagram schematically illustrating trajectories of ion beams passing through a scanning electrode device, a first downstream reference voltage electrode, and a first downstream intermediate electrode according to an embodiment of the present invention.

Therefore, in the present embodiment, the influence of the above-described aberration is reduced by using the first downstream reference voltage electrode 510 having an increased opening width in a vertical direction in the circumjacent areas corresponding to a position facing the downstream end 422 of the scanning electrode 410. FIG. 31 is a diagram schematically illustrating trajectories of ion beams passing through the scanning electrode device 400, the first downstream reference voltage electrode 510, and the first downstream intermediate electrode 1530 according to an embodiment of the present invention. The first downstream reference voltage electrode 510 has a shape in which an opening width of the circumjacent portion 522 in a vertical direction is expanded, and therefore, it is possible to reduce vertical convergence occurring when an ion beam passing along the right outer trajectory G3 passes through the point Q.

However, when the opening width of the circumjacent portion 522 of the first downstream reference voltage electrode 510 in vertical direction is expanded, this may cause occurrence of other aberration. When the opening shape of the first downstream reference voltage electrode 510 is changed, similarity of the shape is diminished with respect to the opening shape of the first downstream intermediate electrode 530. Therefore, disturbance in electric field distribution occurs between the first downstream reference voltage electrode 510 and the first downstream intermediate electrode 530. In particular, when a high voltage is applied to the first downstream intermediate electrode 530 in order to allow the first downstream intermediate electrode 530 to function as an einzel lens electrode, disturbance in electric field distribution becomes remarkable, and only an ion beam passing through the vicinity of the circumjacent portion 522 of the first downstream reference voltage electrode 510 converges in a horizontal direction, thereby other aberration occurring.

Figure 32:
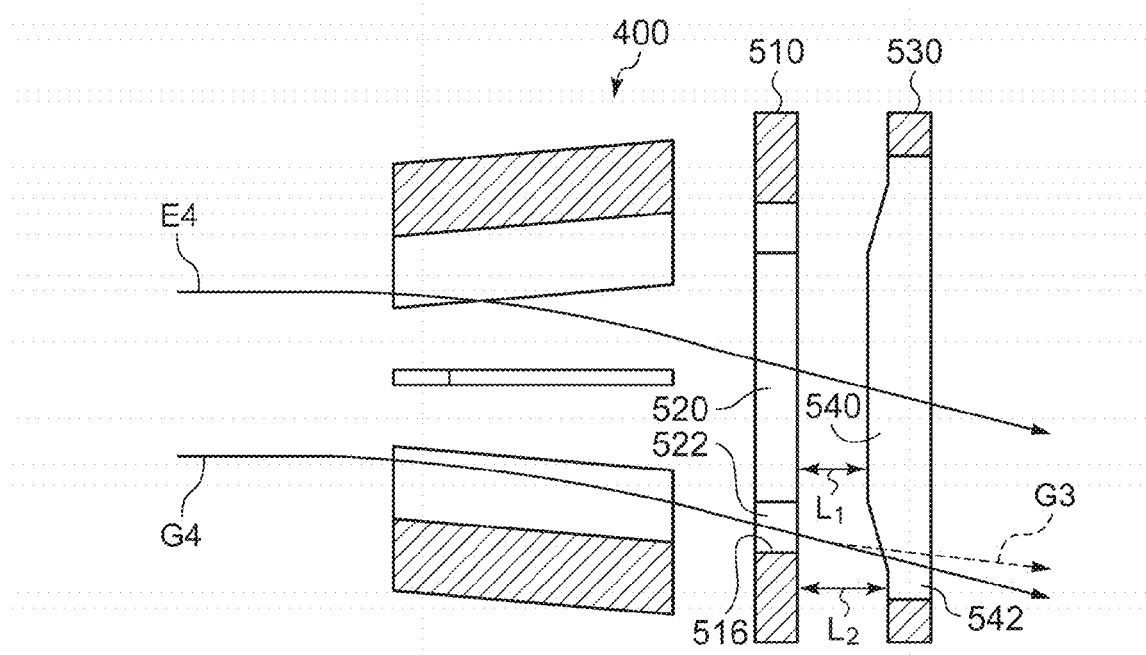
FIG. 32 is a diagram schematically illustrating trajectories of ion beams passing through a scanning electrode device, a first downstream reference voltage electrode, and a downstream first intermediate electrode according to an embodiment of the present invention.

Therefore, in the present embodiment, occurrence of the above-described other aberration is suppressed by making slope in a distance between the first downstream reference voltage electrode 510 and the first downstream intermediate electrode 530 in the circumjacent areas corresponding to a position facing the downstream end 422 of the scanning electrode 410. FIG. 32 is a diagram schematically illustrating trajectories of ion beams passing through the scanning electrode device 400, the first downstream reference voltage electrode 510, and the first downstream intermediate electrode 530 according to an embodiment of the present invention. As illustrated, the first downstream intermediate electrode 530 has a shape in which, with respect to a distance between the first downstream reference voltage electrode 510 and the first downstream intermediate electrode 530, a distance $L_2$ in the circumjacent portion 542 is longer than a distance $L_1$ in the central portion 540 of the first downstream intermediate electrode 530. Therefore, slopes are made such that the distance between the first downstream reference voltage electrode 510 and the first downstream intermediate electrode 530 gradually lengthens toward right and left ends thereof at a position facing the circumjacent portion 522 of the first downstream reference voltage electrode 510. As a result, it is possible to reduce horizontal convergence occurring in the vicinity of the circumjacent portion 522 of the first downstream reference voltage electrode 510, and suppress degradation of a beam quality with respect to an ion beam passing along the right outer trajectory G4.

Figure 33:
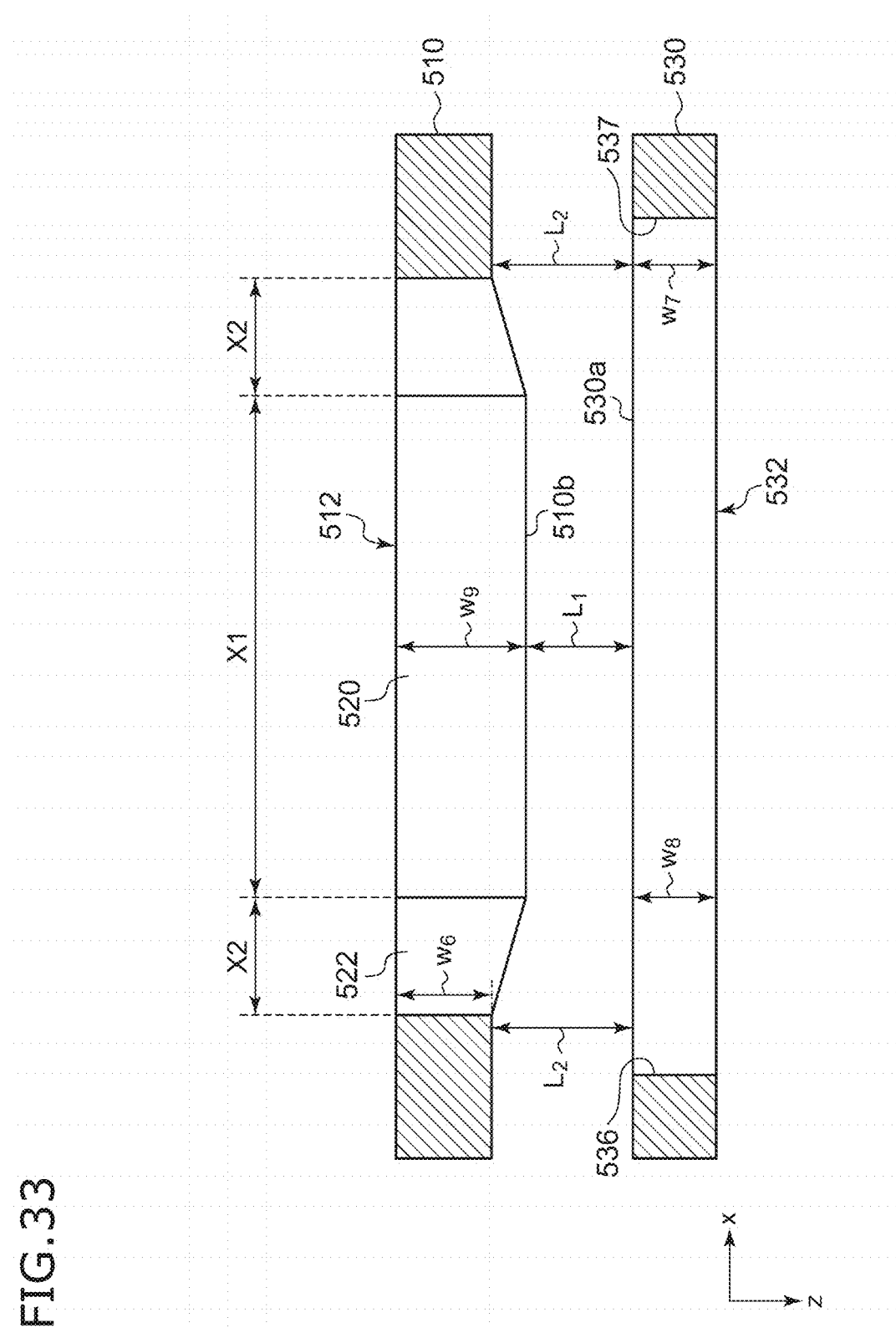
FIG. 33 is a diagram schematically illustrating a shape of a first downstream reference voltage electrode and a first downstream intermediate electrode according to a modification.

FIG. 33 is a diagram schematically illustrating a shape of a first downstream reference voltage electrode 510 and a first downstream intermediate electrode 530 according to a modification. In the first downstream reference voltage electrode 510 and the first downstream intermediate electrode 530 according to the above-described embodiments, the distance $L_1$ in the central area X1 and the distance $L_2$ outside the circumjacent area X2 become different from each other due to protrusion of the upstream surface 530a of the first downstream intermediate electrode 530 toward the first downstream reference voltage electrode 510. On the other hand, according to the present modification, the distance $L_1$ in the central area X1 is shorten and the distance $L_2$ outside the circumjacent area X2 is lengthened due to protrusion of the downstream surface 510b of the first downstream reference voltage electrode 510 toward the first downstream intermediate electrode 530. Therefore, in the first downstream reference voltage electrode 510 according to the present modification, a thickness $w_6$ of the circumjacent portion 522 in z direction is small and a thickness $w_9$ in the central portion 520 is large. Also, among four sides surrounding the opening 512, the central portion 520 of the upper side and the lower side has a shape protruding toward the first downstream intermediate electrode 530. Therefore, like the above-described embodiment, it is possible to reduce horizontal aberration occurring in an ion beam passing through the circumjacent area X2.

Figure 34A:
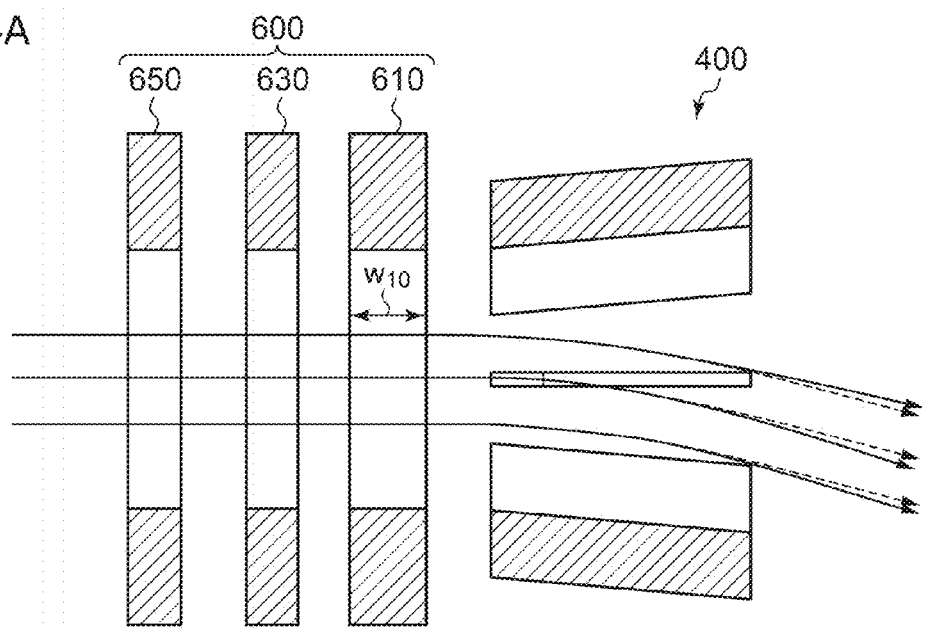
FIGS. 34A and 34B schematically illustrate a trajectory of ion beams passing through an upstream electrode device and a scanning electrode device according to an embodiment of the present invention.
Figure 34B:
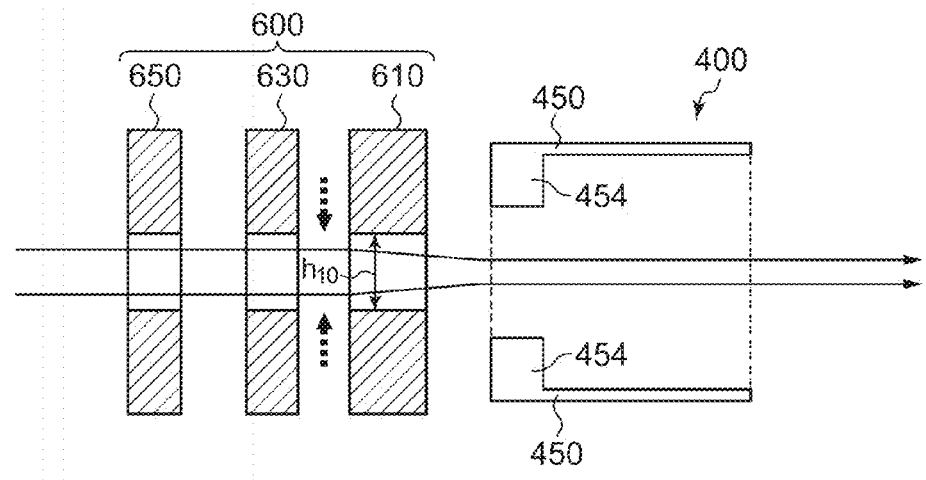

FIGS. 34A and 34B schematically illustrate a trajectory of ion beams passing through an upstream electrode device 600 and a scanning electrode device 400 according to another embodiment of the present invention. Unlike the upstream electrode device 300 according to the embodiment or the modification which have been described, in the upstream electrode device 600 according to the present embodiment, a concave portion or a convex portion is not provided in a first upstream reference voltage electrode 610. Also, a thickness $w_{10}$ of an opening of the first upstream reference voltage electrode 610 in a z direction is large as compared to the first upstream reference voltage electrode 310 according to the embodiment or the modification which have been described. Hereinafter, a description for the upstream electrode device 600 is given focusing on a difference between the upstream electrode device 600 and the upstream electrode device 300 according to the above-described embodiment.

The upstream electrode device 600 is arranged for a purpose to support a role of the beam transport correction inlet electrode body 454 by allowing an ion beam before being incident into the scanning electrode device 400 to converge in a vertical direction, in a case the effect of vertical convergence by the beam transport correction inlet electrode body 454 of the beam transport correction electrode 450 is not sufficient. That is, the upstream electrode device 600 has a role as a beam focusing portion provided upstream of the scanning electrode device 400. A high voltage that is about several times higher than the suppression voltage required for electron shielding is applied to an upstream intermediate electrode 630 of the upstream electrode device 600 in order to enhance the effect of vertical convergence.

In this case, when a high voltage is applied to the upstream intermediate electrode 630, this may affect a deflecting electric field generated by the scanning electrode device 400. Therefore, in order to sufficiently shield the einzel field generated by the upstream intermediate electrode 630, the thickness $w_{10}$ of the first upstream reference voltage electrode 610 in a z direction is thickened. In order to enhance the effect that shields the einzel field, it is preferable that the thickness $w_{10}$ of the first upstream reference voltage electrode 610 in a z direction is similar to the opening width $h_{10}$ of the first upstream reference voltage electrode 610 in the vertical direction, or is larger than the opening width $h_{10}$. As a result, it is possible to relieve the influence on the deflecting electric field generated by the scanning electrode device 400 and allow an ion beam incident into the scanning electrode device 400 to converge in the vertical direction in advance. Accordingly, it is possible to suppress the vertical divergence of the ion beam emitted from the scanning electrode device 400.

Figure 35A:
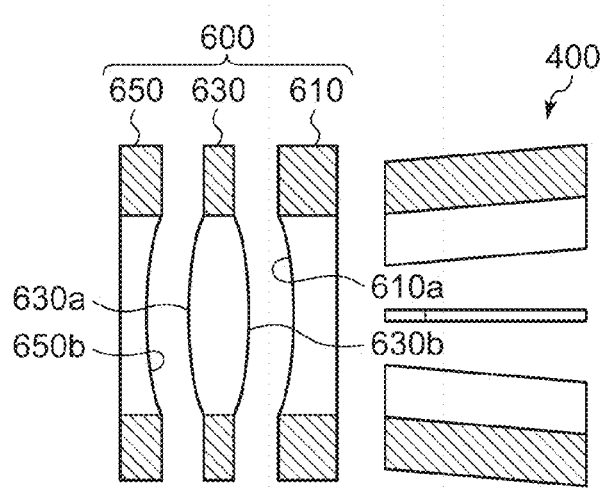
FIGS. 35A, 35B, and 35C are diagrams schematically illustrating a configuration of an upstream electrode device and a scanning electrode device according to a modification.
Figure 35B:
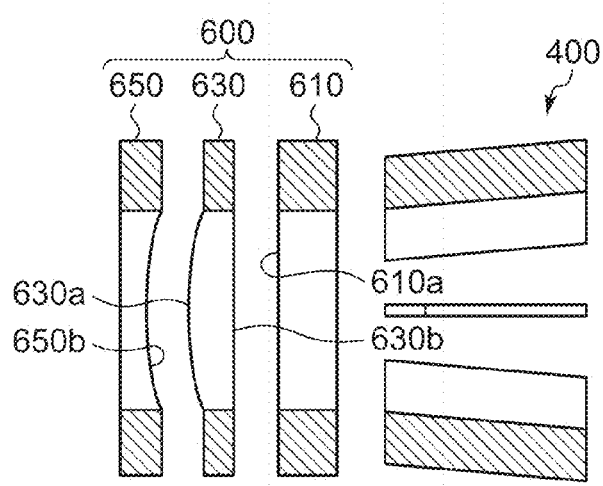
Figure 35C:
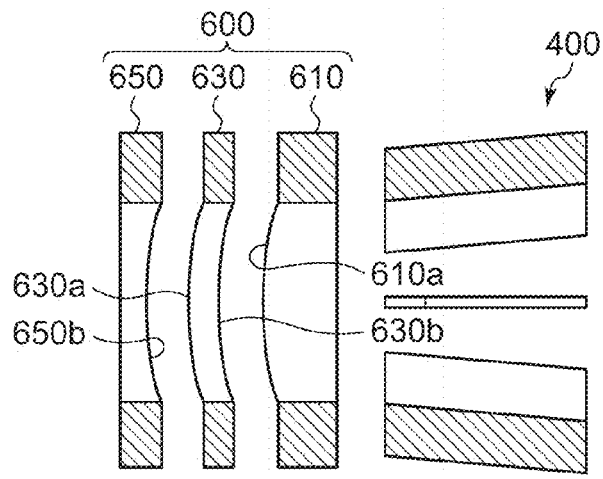

FIGS. 35A, 35B, and 35C are diagrams schematically illustrating a configuration of an upstream electrode device 600 and a scanning electrode device 400 according to other modifications. According to the modifications, it may be possible to provide a horizontal convergence function, by shaping electrode surfaces of electrodes that constitute the upstream electrode device 600 to have arcuate shapes.

As illustrated in FIG. 35A, it may be possible to form a first focusing lens having a concave surface corresponding to a downstream surface 650b of the second upstream reference voltage electrode 650 and a convex surface corresponding to an upstream surface 630a of the upstream intermediate electrode 630, and a second focusing lens having a convex surface corresponding to a downstream surface 630b of the upstream intermediate electrode 630 and a concave surface corresponding to an upstream surface 610a of the first upstream reference voltage electrode 610.

As illustrated in FIG. 35B, it may be possible to form a focusing lens having a concave surface corresponding to a downstream surface 650b of the second upstream reference voltage electrode 650 and a convex surface corresponding to an upstream surface 630a of the upstream intermediate electrode 630, and a non-lens element having flat surfaces corresponding to the downstream surface 630b of the upstream intermediate electrode 630 and the upstream surface 610a of the first upstream reference voltage electrode 610.

As illustrated in FIG. 35C, it may be possible to form a focusing lens having a concave surface corresponding to a downstream surface 650b of the second upstream reference voltage electrode 650 and a convex surface corresponding to an upstream surface 630a of the upstream intermediate electrode 630, and to form a defocusing lens having a concave surface corresponding to the downstream surface 630b of the upstream intermediate electrode 630 and a convex surface corresponding to the upstream surface 610a of the first upstream reference voltage electrode 610.

Hereinafter, several aspects of the present invention will be described.

1-1. An ion implantation apparatus according to an embodiment includes a scanning unit, the scanning unit including a scanning electrode device that allows a deflecting electric field to act on an ion beam incident along a reference trajectory and scans the ion beam in a horizontal direction perpendicular to the reference trajectory, and an upstream electrode device configured by a plurality of electrode bodies provided upstream of the scanning electrode device.

The scanning electrode device includes a pair of scanning electrodes provided to face each other in the horizontal direction with the reference trajectory interposed therebetween, and a pair of beam transport correction electrodes provided to face each other in a vertical direction perpendicular to the horizontal direction with the reference trajectory interposed therebetween.

Each of the pair of beam transport correction electrodes includes a beam transport correction inlet electrode body protruding toward the reference trajectory in the vertical direction in the vicinity of an inlet of the scanning electrode device.

1-2. Each of the beam transport correction electrode may have a straight portion extending from the inlet of the scanning electrode device to an outlet thereof, and each of the beam transport correction inlet electrode bodies may be provided to protrude from the straight portion toward the reference trajectory in the vicinity of the inlet of the scanning electrode device.

1-3. Each of the beam transport correction inlet electrode bodies may have a plate-like member of which a thickness direction is identical to the horizontal direction.

1-4. The upstream electrode device may include a first upstream reference voltage electrode disposed just upstream of the scanning electrode device and having an opening through which an ion beam passes.

The first upstream reference voltage electrode may include a downstream surface that faces the scanning electrode device and is perpendicular to the reference trajectory, and a pair of aberration correctors provided in the downstream surface such that the opening is interposed therebetween in the vertical direction and has a shape protruding toward or recessed from the scanning electrode device on the downstream surface, and the opening may have a thickness in a direction along the reference trajectory in which the thickness in a central portion disposed in the vicinity of the reference trajectory is different from the thickness of a circumjacent portion located away from the central portion in the horizontal direction by providing the pair of aberration correctors.

1-5. Each of the pair of the aberration correctors may have a shape protruding toward the scanning electrode device such that sides facing each other in a vertical direction with the opening interposed therebetween form a triangle shape or a trapezoid shape, and the thickness of the opening in a direction along the reference trajectory may be determined such that the thickness in the central portion is larger than that in the circumjacent portion.

1-6. The upstream electrode device may further include a beam focusing portion that allows an ion beam incident into the scanning electrode device to converge in the vertical direction and/or the horizontal direction.

1-7. The upstream electrode device may include a second upstream reference voltage electrode disposed upstream of the first upstream reference voltage electrode and an upstream intermediate electrode disposed between the first upstream reference voltage electrode and the second upstream reference voltage electrode.

The upstream intermediate electrode and the second upstream reference voltage electrode may respectively have an opening for ion beam passage at a position which communicates with the first upstream reference voltage electrode, and the upstream intermediate electrode may receive a high voltage which is different from potentials of the first upstream reference voltage electrode and the second upstream reference voltage electrode and have a function that allows an ion beam incident into the scanning electrode device to converge in the vertical direction and/or the horizontal direction.

1-8. The upstream electrode device may be configured as an electrode lens that has function of shaping or adjusting a profile of an ion beam incident into the scanning electrode device.

1-9. The upstream electrode device may be configured as an electrode lens that has function of shaping or adjusting a profile of an ion beam incident into the scanning electrode device, in conjunction with the pair of beam transport correction electrodes.

1-10. The upstream electrode device may be configured as a suppression electrode device that has electron suppression function with respect to an ion beam incident into the scanning electrode device.

1-11. The scanning unit may further include a downstream electrode device configured by a plurality of electrode bodies disposed downstream of the scanning electrode device.

1-12. The downstream electrode device may be configured as an electrode lens that has function of shaping or adjusting a profile of an ion beam emitted from the scanning electrode device.

1-13. The downstream electrode device may be configured as an electrode lens that has function of shaping or adjusting a profile of an ion beam emitted from the scanning electrode device, in conjunction with the beam transport correction electrode.

1-14. The downstream electrode device may be configured as a suppression electrode device that has electron suppression function with respect to the ion beam emitted from the scanning electrode device.

1-15. Pair of the beam transport correction electrodes may be configured as correction electrodes that have function of shaping or adjusting a profile of an ion beam passing through the scanning electrode device.

1-16. An ion implantation apparatus according to an embodiment includes a scanning unit, the scanning unit including a scanning electrode device that allows a deflecting electric field to act on an ion beam incident along a reference trajectory and scans the ion beam in a horizontal direction perpendicular to the reference trajectory, and an upstream electrode device configured by a plurality of electrode bodies provided upstream of the scanning electrode device.

The upstream electrode device may include a first upstream reference voltage electrode disposed just upstream of the scanning electrode device and having an opening through which an ion beam passes, the first upstream reference voltage electrode may include a downstream surface that faces the scanning electrode device and is perpendicular to the reference trajectory, and a pair of aberration correctors provided in the downstream surface such that the opening is interposed therebetween in a vertical direction perpendicular to the horizontal direction and has a shape protruding toward or recessed from the scanning electrode device on the downstream surface, and the opening may have a thickness in a direction along the reference trajectory in which the thickness in a central portion disposed in the vicinity of the reference trajectory is different from the thickness of a circumjacent portion located away from the central portion in the horizontal direction by providing the pair of aberration correctors.

2-1. An ion implantation apparatus according to an embodiment includes a scanning unit, the scanning unit including a scanning electrode device that allows a deflecting electric field to act on an ion beam incident along a reference trajectory and scans the ion beam in a horizontal direction perpendicular to the reference trajectory, and a downstream electrode device disposed downstream of the scanning electrode device and provided with openings through which the ion beam scanned in the horizontal direction passes.

The scanning electrode device has a pair of scanning electrode provided to face each other in the horizontal direction with the reference trajectory disposed therebetween, and the downstream electrode device includes an electrode body configured such that, with respect to an opening width in a vertical direction perpendicular to both the reference trajectory and the horizontal direction and/or an opening thickness in a direction along the reference trajectory, the opening width and/or the opening thickness in a central portion in which the reference trajectory is disposed is different from the opening width and/or the opening thickness in the vicinity of a position facing the downstream end of the scanning electrode.

2-2. The downstream electrode device may be configured as an electrode lens that corrects deflected aberration occurring in an ion beam emitted from the scanning electrode device, as a result of scanning deflection by the scanning electrode device.

2-3. The downstream electrode device may be configured as an electrode lens that corrects deflected aberration occurring in an ion beam passing through the vicinity of both scanning ends from among ion beams emitted from the scanning electrode device, as a result of scanning deflection due to the scanning electrode device.

2-4. The downstream electrode device may include a first downstream reference voltage electrode disposed just downstream of the scanning electrode device, and the opening of the first downstream reference voltage electrode may have an opening width in which the opening width in the vertical direction in the vicinity of a position facing the downstream end of the scanning electrode device is larger than the opening width in the vertical direction in the central portion in which the reference trajectory is disposed.

2-5. The opening of the first downstream reference voltage electrode may have an opening width such that the opening width in the vertical direction is uniform in the vicinity of the central portion and the opening width in the vertical direction increases toward right and left ends of the opening in the vicinity of a position facing the downstream end of the scanning electrode.

2-6. The downstream electrode device may further include a second downstream reference voltage electrode disposed downstream of the first downstream reference voltage electrode and a first downstream intermediate electrode disposed between the first downstream reference voltage electrode and the second downstream reference voltage electrode.

The first downstream intermediate electrode and the second downstream reference voltage electrode may respectively have an opening for ion beam passage at a position which communicates with the first downstream reference voltage electrode, the first downstream intermediate electrode may receive a high voltage of which a potential is different from that of the first downstream reference voltage electrode and the second downstream reference voltage electrode, the first downstream reference voltage electrode may have a downstream surface facing the first downstream intermediate electrode and perpendicular to the reference trajectory, the first downstream intermediate electrode may have an upstream surface facing the first downstream reference voltage electrode and perpendicular to the reference trajectory, and the first downstream reference voltage electrode and the first downstream intermediate electrode may have a shape such that with respect to a distance between the downstream surface of the first downstream reference voltage electrode and the upstream surface of the first downstream intermediate electrode, the distance in the vicinity of a position facing the downstream end of the scanning electrode is larger than the distance in the central portion in which the reference trajectory is disposed.

2-7. The first downstream reference voltage electrode and the first downstream intermediate electrode may be configured such that the distance between the downstream surface of the first downstream reference voltage electrode and the upstream surface of the first downstream intermediate electrode gradually increases toward right and left ends of the opening in the vicinity of a position facing the downstream end of the scanning electrode.

2-8. The upstream surface of the first downstream intermediate electrode may have a shape protruding toward the first downstream reference voltage electrode in the vicinity of the central portion in which the reference trajectory is disposed.

2-9. The downstream surface of the first downstream reference voltage electrode may have a shape protruding toward the first downstream intermediate electrode in the vicinity of the central portion in which the reference trajectory is disposed.

2-10. The opening of the first downstream intermediate electrode may have an opening width in the horizontal direction which is larger than an opening width in the horizontal direction of the first downstream reference voltage electrode, and the opening of the second downstream reference voltage electrode may have an opening width in the horizontal direction which is larger than an opening width in the horizontal direction of the first downstream intermediate electrode.

2-11. The downstream electrode device may further include a third downstream reference voltage electrode disposed downstream of the second downstream reference voltage electrode and a second downstream intermediate electrode disposed between the second downstream reference voltage electrode and the third downstream reference voltage electrode, the second downstream intermediate electrode and the third downstream reference voltage electrode may respectively have an opening for ion beam passage at a position which communicates with the second downstream reference voltage electrode, and the second downstream intermediate electrode may receive a high voltage of which a potential is different from a potential of the second downstream reference voltage electrode and the third downstream reference voltage electrode and have a function that suppresses intrusion of electrons into the scanning electrode device.

2-12. The first downstream intermediate electrode may receive a high voltage of which an absolute value is larger than a potential of the second downstream intermediate electrode, and have a function that allows an ion beam emitted from the scanning electrode device to converge in the vertical direction and/or the horizontal direction.

2-13. The scanning unit may further include an upstream electrode device configured by a plurality of electrode bodies provided upstream of the scanning electrode device.

2-14. The upstream electrode device may have function of shaping or adjusting a profile of an ion beam incident into the scanning electrode device.

2-15. The upstream electrode device may be configured as a suppression electrode device having electron suppression function with respect to an ion beam incident into the scanning electrode device.

2-16. The scanning electrode device may include a pair of scanning electrodes provided to face each other in the horizontal direction with the reference trajectory interposed therebetween, and a pair of beam transport correction electrodes provided to face each other in the vertical direction with the reference trajectory interposed therebetween, and the beam transport correction electrode is configured as a correction electrode that have a shaping function or an adjusting function with respect to a beam shape of an ion beam passing through the scanning electrode device.

2-17. The scanning electrode device may include a pair of scanning electrodes provided to face each other in the horizontal direction with the reference trajectory interposed therebetween, and a pair of beam transport correction electrodes provided to face each other in the vertical direction with the reference trajectory interposed therebetween, and the downstream electrode device is configured as an electrode lens that have a shaping function or an adjusting function with respect to a beam shape of an ion beam passing through the scanning electrode device in conjunction with the upstream electrode device and the beam transport correction electrode.

What is claimed is:

1. An ion implantation apparatus including a scanning unit, the scanning unit comprising:

a scanning electrode device that allows a deflecting electric field to act on an ion beam incident along a reference trajectory and scans the ion beam in a horizontal direction perpendicular to the reference trajectory, and a downstream electrode device disposed downstream of the scanning electrode device and provided with openings through which the ion beam scanned in the horizontal direction passes, wherein the scanning electrode device includes a pair of scanning electrodes disposed to face each other in the horizontal direction with the reference trajectory interposed therebetween, and the downstream electrode device includes an electrode body configured such that, with respect to an opening width in a vertical direction perpendicular to both the reference trajectory and the horizontal direction and/or an opening thickness in a direction along the reference trajectory, the opening width and/or the opening thickness in a central portion in which the reference trajectory is disposed is different from the opening width and/or the opening thickness in the vicinity of a position facing a downstream end of the scanning electrode.

2. The ion implantation apparatus according to claim 1, wherein the downstream electrode device is configured as an electrode lens that corrects deflection aberration occurring in an ion beam emitted from the scanning electrode device, as a result of scanning deflection by the scanning electrode device.

3. The ion implantation apparatus according to claim 1, wherein the downstream electrode device is configured as an electrode lens that corrects deflection aberration occurring in an ion beam passing through the vicinity of both scanning ends from among ion beams emitted from the scanning electrode device, as a result of scanning deflection by the scanning electrode device.

4. The ion implantation apparatus according to claim 1, wherein the downstream electrode device includes a first downstream reference voltage electrode disposed just downstream of the scanning electrode device, and the opening of the first downstream reference voltage electrode has an opening width such that the opening width in the vertical direction in the vicinity of a position facing the downstream end of the scanning electrode device is larger than the opening width in the vertical direction in the central portion in which the reference trajectory is disposed.

5. The ion implantation apparatus according to claim 4, wherein the opening of the first downstream reference voltage electrode has an opening width such that the opening width in the vertical direction is uniform in the vicinity of the central portion, and the opening width in the vertical direction gradually increases toward right and left ends of the opening in the vicinity of a position facing the downstream end of the scanning electrode.

6. The ion implantation apparatus according to claim 4, wherein the downstream electrode device further includes a second downstream reference voltage electrode disposed downstream of the first downstream reference voltage electrode and a first downstream intermediate electrode disposed between the first downstream reference voltage electrode and the second downstream reference voltage electrode, the first downstream intermediate electrode and the second downstream reference voltage electrode respectively have an opening for ion beam passage at a position which communicates with the opening of the first downstream reference voltage electrode, the first downstream intermediate electrode receives a high voltage of which a potential is different from potentials of the first downstream reference voltage electrode and the second downstream reference voltage electrode, the first downstream reference voltage electrode has a downstream surface facing the first downstream intermediate electrode and perpendicular to the reference trajectory, the first downstream intermediate electrode has an upstream surface facing the first downstream reference voltage electrode and perpendicular to the reference trajectory, and the first downstream reference voltage electrode and the first downstream intermediate electrode have a shape such that with respect to a distance between the downstream surface of the first downstream reference voltage electrode and the upstream surface of the first downstream intermediate electrode, the distance in the vicinity of a position facing the downstream end of the scanning electrode is larger than the distance in the central portion in which the reference trajectory is disposed.

7. The ion implantation apparatus according to claim 6, wherein the first downstream reference voltage electrode and the first downstream intermediate electrode are configured such that a distance between the downstream surface of the first downstream reference voltage electrode and the upstream surface of the first downstream intermediate electrode gradually increases toward right and left ends of the opening in the vicinity of a position facing the downstream end of the scanning electrode.

8. The ion implantation apparatus according to claim 6, wherein the upstream surface of the first downstream intermediate electrode has a shape protruding toward the first downstream reference voltage electrode in the vicinity of the central portion in which the reference trajectory is disposed.

9. The ion implantation apparatus according to claim 6, wherein the downstream surface of the first downstream reference voltage electrode has a shape protruding toward the first downstream intermediate electrode in the vicinity of the central portion in which the reference trajectory is disposed.

10. The ion implantation apparatus according to claim 6, wherein the opening of the first downstream intermediate electrode has an opening width in the horizontal direction which is larger than an opening width in the horizontal direction of the first downstream reference voltage electrode, and an opening of the second downstream reference voltage electrode has an opening width in the horizontal direction which is larger than an opening width in the horizontal direction of the first downstream intermediate electrode.

11. The ion implantation apparatus according to claim 6, wherein the downstream electrode device further includes a third downstream reference voltage electrode disposed downstream of the second downstream reference voltage electrode and a second downstream intermediate electrode disposed between the second downstream reference voltage electrode and the third downstream reference voltage electrode, the second downstream intermediate electrode and the third downstream reference voltage electrode respectively have an opening for ion beam passage at a position which communicates with the opening of the second downstream reference voltage electrode, and the second downstream intermediate electrode receives a high voltage of which a potential is different from potentials of the second downstream reference voltage electrode and the third downstream reference voltage electrode, and has a function that suppresses intrusion of electrons into the scanning electrode device.

12. The ion implantation apparatus according to claim 11, wherein the first downstream intermediate electrode receives a high voltage of which an absolute value is larger than an absolute value of a potential of the second downstream intermediate electrode, and has a function that allows an ion beam emitted from the scanning electrode device to converge in the vertical direction and/or the horizontal direction.

13. The ion implantation apparatus according to claim 1, wherein the scanning unit further includes an upstream electrode device configured by a plurality of electrode bodies provided upstream of the scanning electrode device.

14. The ion implantation apparatus according to claim 13, wherein the upstream electrode device is configured as an electrode lens that has function of shaping or adjusting a profile of an ion beam incident into the scanning electrode device.

15. The ion implantation apparatus according to claim 13, wherein the upstream electrode device is configured as a suppression electrode device having electron suppression function with respect to an ion beam incident into the scanning electrode device.

16. The ion implantation apparatus according to claim 1, wherein the scanning electrode device includes a pair of scanning electrodes provided to face each other in the horizontal direction with the reference trajectory interposed therebetween, and a pair of beam transport correction electrodes provided to face each other in the vertical direction with the reference trajectory interposed therebetween, and the beam transport correction electrode is configured as a correction electrode that has shaping function or adjusting function with respect to a beam shape of an ion beam passing through the scanning electrode device.

17. The ion implantation apparatus according to claim 13, wherein the scanning electrode device includes a pair of scanning electrodes provided to face each other in the horizontal direction with the reference trajectory interposed therebetween, and a pair of beam transport correction electrodes provided to face each other in the vertical direction with the reference trajectory interposed therebetween, and
the downstream electrode device is configured as an electrode lens that has shaping function or adjusting function with respect to a beam shape of an ion beam emitted from the scanning electrode device, in conjunction with the upstream electrode device and the beam transport correction electrodes.

\* \* \* \* \*